(12) United States Patent
Kamiya et al.

(10) Patent No.: US 9,770,826 B2
(45) Date of Patent: Sep. 26, 2017

(54) FORCE DETECTING DEVICE, ROBOT, ELECTRONIC COMPONENT CONVEYING APPARATUS

(71) Applicant: Seiko Epson Corporation, Tokyo (JP)

(72) Inventors: Toshiyuki Kamiya, Fujimi (JP); Hiroki Kawai, Matsumoto (JP)

(73) Assignee: Seiko Epson Corporation (JP)

(*) Notice: Subject to any disclaimer, the term of this patent is extended or adjusted under 35 U.S.C. 154(b) by 190 days.

(21) Appl. No.: 14/532,577

(22) Filed: Nov. 4, 2014

(65) Prior Publication Data
US 2015/0127159 A1 May 7, 2015

(30) Foreign Application Priority Data

Nov. 5, 2013 (JP) ................ 2013-229791
Nov. 5, 2013 (JP) ................ 2013-229792

(51) Int. Cl.
*G01L 1/22* (2006.01)
*B25J 9/16* (2006.01)
(Continued)

(52) U.S. Cl.
CPC .......... *B25J 9/1694* (2013.01); *G01P 15/09* (2013.01); *G01P 15/18* (2013.01); *H01L 41/042* (2013.01);
(Continued)

(58) Field of Classification Search
CPC ... G01L 1/16; G01L 1/18; G01L 5/167; G01L 5/226; G01L 5/009; G01L 5/00;
(Continued)

(56) References Cited

U.S. PATENT DOCUMENTS 3,358,257 A * 12/1967 Brewer ............... G01L 1/16
  257/417
3,566,163 A * 2/1971 Fischer ............... G01L 1/16
  310/329
(Continued)

FOREIGN PATENT DOCUMENTS

EP 2637006 A2 9/2013
JP 61-122538 A 6/1986
(Continued)

OTHER PUBLICATIONS

Extended European Search Report for European Patent Application No. 14191445.7 mailed on Jul. 15, 2015 (8 pages).

Primary Examiner — Jonathan Dunlap
(74) Attorney, Agent, or Firm — Harness, Dickey & Pierce, P.L.C.

(57) ABSTRACT

A force detecting device includes a first base section, a second base section, and a charge output element arranged between the first base section and the second base section. The charge output element includes a first board formed by a Y-cut quartz plate and a second board formed by a Y-cut quartz plate. The boards are laminated in a direction orthogonal to the normal an attachment surface of the second base section. The force detecting device detects an external force on the basis of a first output corresponding to a shearing force in a first detection direction orthogonal to the laminating direction of the first board and a second output corresponding to a shearing force in a second detection direction orthogonal to the laminating direction of the second board and crossing the first detection direction.

29 Claims, 27 Drawing Sheets

(51) Int. Cl.
*G01P 15/18* (2013.01)
*H01L 41/113* (2006.01)
*H01L 41/04* (2006.01)
*H01L 41/083* (2006.01)
*G01P 15/09* (2006.01)
*G01L 5/16* (2006.01)
*G01L 5/22* (2006.01)
*H02N 2/00* (2006.01)

(52) U.S. Cl.
CPC ........ *H01L 41/083* (2013.01); *H01L 41/1132* (2013.01); *G01L 5/167* (2013.01); *G01L 5/226* (2013.01); *H02N 2/0095* (2013.01)

(58) Field of Classification Search
CPC ..... B25J 9/1633; B25J 9/1694; Y10S 901/46; Y10S 700/90
USPC ....... 73/862.041–862.046, 862.68, 767, 777, 73/862.625; 901/46, 27
See application file for complete search history.

(56) References Cited

U.S. PATENT DOCUMENTS

| | | | |
|---|---|---|---|
| 4,680,606 A * | 7/1987 | Knutti | G01L 1/18 257/419 |
| 4,745,812 A * | 5/1988 | Amazeen | G01L 1/18 338/47 |
| 4,802,371 A * | 2/1989 | Calderara | G01L 1/16 310/338 |
| 5,437,196 A | 8/1995 | Okada | |
| 5,763,982 A | 6/1998 | Tabota et al. | |
| 5,789,890 A * | 8/1998 | Genov | B25J 9/1615 318/567 |
| 5,821,432 A | 10/1998 | Sidler et al. | |
| 5,965,808 A * | 10/1999 | Normann | B60C 23/0408 116/34 R |
| 6,612,143 B1 * | 9/2003 | Butscher | A61C 7/04 433/3 |
| 7,603,906 B2 * | 10/2009 | Kroger | G01L 9/008 73/714 |
| 8,869,632 B2 * | 10/2014 | Tsuchiya | B25J 13/085 73/862.59 |
| 9,046,432 B2 * | 6/2015 | Oka | B25J 9/1633 |
| 9,091,607 B2 * | 7/2015 | Matsumoto | B25J 19/028 |
| 9,127,996 B2 * | 9/2015 | Kawai | B25J 13/085 |
| 9,217,680 B2 * | 12/2015 | Kamiya | B25J 9/00 |
| 9,381,647 B2 * | 7/2016 | Kamiya | B25J 13/085 |
| 9,410,856 B2 * | 8/2016 | Kamiya | G01L 1/16 |
| 9,481,089 B2 * | 11/2016 | Matsuzawa | B25J 9/1694 |
| 2007/0277618 A1 | 12/2007 | Kroeger et al. | |
| 2012/0048027 A1 * | 3/2012 | Hashiguchi | B25J 9/0087 73/763 |
| 2013/0112010 A1 * | 5/2013 | Matsumoto | B25J 19/028 73/862.044 |
| 2013/0152700 A1 * | 6/2013 | Kamiya | B25J 9/00 73/862.043 |
| 2013/0152701 A1 * | 6/2013 | Oka | B25J 9/1633 73/862.044 |
| 2013/0233089 A1 * | 9/2013 | Kawai | B25J 13/085 73/862.68 |
| 2014/0053660 A1 * | 2/2014 | Kamiya | G01L 1/16 73/862.68 |
| 2014/0236354 A1 * | 8/2014 | Kamiya | B25J 13/085 700/258 |
| 2014/0366646 A1 * | 12/2014 | Matsuzawa | G01L 1/16 73/862.68 |
| 2015/0120051 A1 | 4/2015 | Matsuzawa et al. | |
| 2015/0239126 A1 * | 8/2015 | Matsuzawa | B25J 9/1694 700/258 |
| 2016/0109311 A1 * | 4/2016 | Inazumi | G01L 5/167 73/862.042 |
| 2016/0313195 A1 * | 10/2016 | Kamiya | G01L 1/16 |
| 2017/0021504 A1 * | 1/2017 | Matsuzawa | B25J 9/1694 |

FOREIGN PATENT DOCUMENTS

| | | |
|---|---|---|
| JP | 61-122539 A | 6/1986 |
| JP | 61-162727 A | 7/1986 |
| JP | 61-283842 A | 12/1986 |
| JP | 05-016091 A | 1/1993 |
| JP | 05-215627 A | 8/1993 |
| JP | 10-068665 A | 3/1998 |
| JP | 2000-275126 A | 10/2000 |
| JP | 2006-071506 A | 3/2006 |
| JP | 2006-071507 A | 3/2006 |
| JP | 2009-074969 A | 4/2009 |
| JP | 2010-230442 A | 10/2010 |
| JP | 2013-130433 A | 7/2013 |

* cited by examiner

FORCE DETECTING DEVICE, ROBOT, ELECTRONIC COMPONENT CONVEYING APPARATUS

BACKGROUND

1. Technical Field

The present invention relates to a force detecting device, a robot, and an electronic component conveying apparatus.

2. Related Art

In recent years, for the purpose of improvement of productivity, industrial robots have been introduced into production facilities such as factories. A representative example of such an industrial robot is a machine tool that applies machining to a base material such as an aluminum plate. Some machine tool incorporates a force detecting device that detects a force imposed on the base material when the machining is applied thereto (see, for example, JP-A-10-68665 (Patent Literature 1)).

The force measuring device (the force detecting device) described in Patent Literature 1 can detect a shearing force, a tensile force, a compressive force, and the like using quartz functioning as a piezoelectric element.

However, in the force measuring device including the quartz as the piezoelectric element, the quartz is deformed by heat generated during the machining. As a result, a noise component with respect to a true value in an output of the piezoelectric element tends to occur. In the force measuring device described in Patent Literature 1, measures against such noise are not taken into account.

SUMMARY

An advantage of some aspects of the invention is to provide a force detecting device, a robot, and an electronic component conveying apparatus that are less easily affected by fluctuation in temperature.

The invention can be implemented as the following forms or application examples.

Application Example 1

A force detecting device according to this application example is a force detecting device including: a first base section; a second base section; and a plurality of piezoelectric elements sandwiched by the first base section and the second base section and configured to detect external forces applied to the first base section and the second base section. The first base section includes a first attachment surface fixed to a measurement target. The second base section includes a second attachment surface fixed to the measurement target. The piezoelectric element includes a first board formed by a Y-cut quartz plate and a second board formed by a Y-cut quartz plate. The first board and the second board are laminated in parallel. In a laminating direction of the first board and the second board, an x axis of the first board and an x axis of the second board cross each other and a z axis of the first board and a z axis of the second board cross each other. The piezoelectric element is set such that the normal of the first attachment surface or the second attachment surface and the laminating direction are orthogonal to each other.

With this configuration, the force detecting device is less easily affected by fluctuation in temperature. Therefore, it is possible to accurately detect an external force.

Application Example 2

In the force detecting device according to the application example described above, it is preferable that the piezoelectric element detects external forces in three directions in total including orthogonal two directions in planes of the first board and the second board and one direction orthogonal to the two directions.

With this configuration, it is possible to surely detect external forces in three dimensions.

Application Example 3

In the force detecting device according to the application example described above, it is preferable that at least one base section of the first base section and the second base section is formed by a member formed in a tabular shape and, when orthogonal two directions in a plane of the member are represented as A axis and B axis, a direction orthogonal to the A axis and the B axis is represented as C axis, an inclination angle of the piezoelectric element with respect to the A axis is represented as $\epsilon$, an angle formed by the x axis of the first board of the piezoelectric element and the member is represented as $\eta$, a force applied in the x-axis direction of the first board of one piezoelectric element in two piezoelectric elements among the plurality of piezoelectric elements is represented as fx1-1, a force applied in the x-axis direction of the second board is represented as fx1-2, a force applied in the x-axis direction of the first board of the other piezoelectric element is represented as fx2-1, and a force applied in the x-axis direction of the second board is represented as fx2-2, a force FA in the A-axis direction, a force FB in the B-axis direction, and a force FC in the C-axis direction are respectively represented by the following expressions (1), (2), and (3).

$$FA = fx1\text{-}1 \cdot \cos \eta \cdot \cos \epsilon - fx1\text{-}2 \cdot \sin \eta \cdot \cos \epsilon - fx2\text{-}1 \cdot \cos \theta \cdot \cos \epsilon + fx2\text{-}2 \cdot \sin \eta \cdot \cos \epsilon \quad (1)$$

$$FB = -fx1\text{-}1 \cdot \cos \eta \cdot \sin \epsilon + fx1\text{-}2 \cdot \sin \eta \cdot \sin \epsilon - fx2\text{-}1 \cdot \cos \eta \cdot \sin \epsilon + fx2\text{-}2 \cdot \sin \eta \cdot \sin \epsilon \quad (2)$$

$$FC = -fx1\text{-}1 \cdot \sin \eta - fx1\text{-}2 \cdot \cos \eta - fx2\text{-}1 \cdot \sin \eta - fx2\text{-}2 \cdot \cos \eta \quad (3)$$

With this configuration, it is possible to surely detect external forces in three dimensions in a state in which the force detecting device is less easily affected by fluctuation in temperature.

Application Example 4

In the force detecting device according to the application example described above, it is preferable that the force detecting device includes a plurality of pressurizing screws provided around the piezoelectric element and configured to apply pressurization to the piezoelectric element, and a pressurization direction of the pressurizing screw is a direction parallel to the laminating direction of the first board and the second board.

With this configuration, when a shearing force acts on the piezoelectric element, a frictional force between the boards forming the piezoelectric element surely occurs. Therefore, it is possible to surely detect charges.

Application Example 5

In the force detecting device according to the application example described above, it is preferable that the plurality of piezoelectric elements include the piezoelectric elements not arranged on the same plane and not arranged in parallel to each other.

With this configuration, the piezoelectric elements easily generate charges when an external force is applied thereto.

Application Example 6

In the force detecting device according to the application example described above, it is preferable that at least one base section of the first base section and the second base section is formed in a tabular shape, and, in the plurality of piezoelectric elements, the first board and the second board are arranged perpendicularly to the one base section.

With this configuration, the piezoelectric element easily generates charges when an external force is applied thereto.

Application Example 7

In the force detecting device according to the application example described above, it is preferable that at least one base section of the first base section and the second base section is formed in a tabular shape, and a quartet or more of the piezoelectric elements are respectively arranged in positions apart from the center section of the one base section when viewed from the attachment surface on which the one base section is fixed to the measurement target.

With this configuration, it is possible to uniformly detect an external force.

Application Example 8

In the force detecting device according to the application example described above, it is preferable that the piezoelectric element includes a third board formed by an X-cut quartz plate.

With this configuration, it is possible to surely detect external forces in three dimensions with a simple configuration including a quartz plate.

Application Example 9

A robot according to this application example includes: an arm; an end effector provided in the arm; and a force detecting device provided between the arm and the end effector and configured to detect an external force applied to the end effector. The force detecting device includes: a first base section including a first attachment surface fixed to a measurement target; a second base section including a second attachment surface fixed to the measurement target; and a piezoelectric element sandwiched by the first base section and the second base section and configured to detect external forces applied to the first base section and the second base section. The piezoelectric element includes a first board formed by a Y-cut quartz plate and a second board formed by a Y-cut quartz plate. The first board and the second board are laminated in parallel. In a laminating direction of the first board and the second board, an x axis of the first board and an x axis of the second board cross each other and a z axis of the first board and a z axis of the second board cross each other. The piezoelectric element is set such that a normal direction of the first attachment surface or the second attachment surface and the laminating direction are orthogonal to each other.

With this configuration, the robot is less easily affected by fluctuation in temperature. Therefore, an external force is accurately detected. It is possible to properly perform work by the end effector.

Application Example 10

An electronic component conveying apparatus according to this application example includes: a gripping section configured to grip an electronic component; and a force detecting device configured to detect an external force applied to the gripping section. The force detecting device includes: a first base section including a first attachment surface fixed to a measurement target; a second base section including a second attachment surface fixed to the measurement target; and a piezoelectric element sandwiched by the first base section and the second base section and configured to detect external forces applied to the first base section and the second base section. The piezoelectric element includes a first board formed by a Y-cut quartz plate and a second board formed by a Y-cut quartz plate. The first board and the second board are laminated in parallel. In a laminating direction of the first board and the second board, an x axis of the first board and an x axis of the second board cross each other and a z axis of the first board and a z axis of the second board cross each other. The piezoelectric element is set such that a normal direction of the first attachment surface or the second attachment surface and the laminating direction are orthogonal to each other.

With this configuration, the electronic component conveying apparatus is less easily affected by fluctuation in temperature. Therefore, an external force is accurately detected. It is possible to properly perform conveyance of the electronic component.

Application Example 11

A force detecting device according to this application example is a force detecting device including: a first base section; a second base section; and a plurality of piezoelectric elements sandwiched by the first base section and the second base section and configured to detect external forces applied to the first base section and the second base section. The first base section includes a first attachment surface fixed to a measurement target. The second base section includes a second attachment surface fixed to the measurement target. The piezoelectric element includes a first board and a second board having a laminating direction orthogonal to a normal direction of the first attachment surface or the second attachment surface and detects the external forces applied to the first base section and the second base section from detection of a shearing force in a first detection direction same as the normal direction by the first board and detection of a shearing force in a second detection direction crossing the first detection direction by the second board.

With this configuration, the force detecting device is less easily affected by fluctuation in temperature. Therefore, it is possible to accurately detect an external force.

Application Example 12

In the force detecting device according to the application example described above, it is preferable that the first board and the second board are Y-cut quartz plates, and an x axis of a quartz crystal of the first board and an x axis of a quartz crystal of the second board are orthogonal to each other.

With this configuration, it is possible to surely detect an external force with a simple configuration including a quartz plate.

Application Example 13

In the force detecting device according to the application example described above, it is preferable that an A axis, a B axis, and a C axis, which are orthogonal coordinate axes, are set as coordinate axes in which the C axis is in a direction parallel to an intersection line of a first plane orthogonal to a first sandwiching direction and a second plane orthogonal to a second sandwiching direction, and the external forces applied to the first base section and the second base section are detected as components of external forces in the three axis directions.

With this configuration, it is possible to surely detect external forces in three dimensions.

Application Example 14

In the force detecting device according to the application example described above, it is preferable that, when an angle formed by the A axis and the first plane is represented as +ϵ, an angle formed by the A axis and the second plane is represented as −ϵ, an angle formed by the first detection direction of the first piezoelectric element and a plane including the A axis and the B axis is represented as η, an angle formed by a third detection direction of the second piezoelectric element and the plane including the A axis and the B axis is represented as −η, a first output is represented as fx1-1, a second output is represented as fx1-2, a third output is represented as fx2-1, and a fourth output is represented as fx2-2, a force component FA in the A-axis direction, a force component FB in the B-axis direction, and a force component FC in the C-axis direction are respectively represented by the following Expressions (1), (2), and (3).

$$FA = fx1\text{-}1 \cdot \cos \eta \cdot \cos \epsilon - fx1\text{-}2 \cdot \sin \eta \cdot \cos \epsilon - fx2\text{-}1 \cdot \cos \eta \cdot \cos \epsilon + fx2\text{-}2 \cdot \sin \eta \cdot \cos \epsilon \quad (1)$$

$$FB = -fx1\text{-}1 \cdot \cos \eta \cdot \sin \epsilon + fx1\text{-}2 \cdot \sin \eta \cdot \sin \epsilon - fx2\text{-}1 \cdot \cos \eta \cdot \sin \epsilon + fx2\text{-}2 \cdot \sin \eta \cdot \sin \epsilon \quad (2)$$

$$FC = -fx1\text{-}1 \cdot \sin \eta - fx1\text{-}2 \cdot \cos \eta - fx2\text{-}1 \cdot \sin \eta - fx2\text{-}2 \cdot \cos \eta \quad (3)$$

With this configuration, it is possible to surely detect external forces in three dimensions in a state in which the force detecting device is less easily affected by fluctuation in temperature.

Application Example 15

In the force detecting device according to the application example described above, it is preferable that the force detecting device includes a plurality of pressurizing screws provided around the piezoelectric element and configured to apply pressurization to the piezoelectric element, and a pressurization direction of the pressurizing screw is a direction parallel to the laminating direction of the first board and the second board.

With this configuration, when a shearing force acts on the piezoelectric element, a frictional force between the boards forming the piezoelectric element surely occurs. Therefore, it is possible to surely detect charges.

Application Example 16

A force detecting device according to this application example is a force detecting device including: a first base section; a second base section; and a plurality of piezoelectric elements sandwiched by the first base section and the second base section and configured to detect external forces applied to the first base section and the second base section. The first base section includes a first attachment surface fixed to a measurement target. The second base section includes a second attachment surface fixed to the measurement target. The piezoelectric element is set such that the normal of the first attachment surface or the second attachment surface and a laminating direction of a first board and a second board of the piezoelectric element are orthogonal to each other. Total weight of the force detecting device is smaller than 1 kg.

With this configuration, by setting the weight of the force detecting device smaller than 1 kg, it is possible to reduce a load of the weight of the force detecting device applied to a part attached with the force detecting device. The capacity of an actuator that drives the part attached with the force detecting device can be reduced. Therefore, it is possible to design the part attached with the force detecting device small.

Application Example 17

A force detecting device according to this application example is a force detecting device including: a first base section; a second base section; and a plurality of piezoelectric elements sandwiched by the first base section and the second base section and configured to detect external forces applied to the first base section and the second base section. The first base section includes a first attachment surface fixed to a measurement target. The second base section includes a second attachment surface fixed to the measurement target. The piezoelectric element is set such that the normal of the first attachment surface or the second attachment surface and a laminating direction of a first board and a second board of the piezoelectric element are orthogonal to each other. A conversion circuit configured to convert charges output by the plurality of piezoelectric elements into a voltage and an arithmetic circuit configured to calculate an external force from the voltage are housed in a space between the first base section and the second base section.

With this configuration, since the arithmetic circuit is incorporated rather than being separately provided, it is unnecessary to draw around a wiring cable and the like.

Application Example 18

In the force detecting device according to the application example described above, it is preferable that the conversion circuit or the arithmetic circuit includes at least any one of a semiconductor switch and an MEMS switch.

With this configuration, it is possible to reduce the weight of the force detecting device when a switch element is changed from a mechanical switch in the past to the semiconductor switch or the MEMS switch.

Application Example 19

In the force detecting device according to the application example described above, it is preferable that the first base section and the second base section form a housing space having a circular or corner-rounded square sectional shape, and distances between the respective piezoelectric elements and the center of the first attachment surface or the second attachment surface corresponding to the piezoelectric elements are equal.

With this configuration, when the sectional shape of the first base section and the second base section is a circular shape or a corner-rounded square shape and the piezoelectric elements are arranged in a circumferential shape, stress can be uniformly dispersed. Therefore, it is possible to reduce the thickness of the first base section and the second base section.

Application Example 20

A robot according to this application example includes: a force detecting device including a plurality of piezoelectric elements configured to detect an external force; and a robot arm. The weight of the force detecting device is smaller than 20% of maximum weight that the robot arm can convey.

With this configuration, since the weight of the force detecting device is set smaller than 20% of the maximum weight that the robot arm can convey, it is possible to facilitate control of the robot arm to which the weight of the force detecting device is applied.

Application Example 21

A force detecting device according to this application example is a force detecting device including: a first base section; a second base section; and a plurality of piezoelectric elements sandwiched by the first base section and the second base section and configured to detect external forces applied to the first base section and the second base section. The first base section includes a first attachment surface fixed to a measurement target. The second base section includes a second attachment surface fixed to the measurement target. The piezoelectric element includes a first board formed by a Y-cut quartz plate and a second board formed by a Y-cut quartz plate. The first board and the second board are laminated in parallel. In a laminating direction of the first board and the second board, an x axis of the first board and an x axis of the second board cross each other and a z axis of the first board and a z axis of the second board cross each other. The piezoelectric element is set such that the normal of the first attachment surface or the second attachment surface and the laminating direction are different from each other.

With this configuration, the force detecting device is less easily affected by fluctuation in temperature. Therefore, it is possible to accurately detect an external force.

Application Example 22

In the force detecting device according to the application example described above, it is preferable that the piezoelectric element detects external forces in three directions in total including orthogonal two directions in planes of the first board and the second board and one direction orthogonal to the two directions.

With this configuration, it is possible to three-dimensionally detect external forces.

Application Example 23

In the force detecting device according to the application example described above, it is preferable that at least one base section of the first base section and the second base section is formed by a member formed in a tabular shape and, when orthogonal two directions in a plane of the member are represented as A axis and B axis, a direction orthogonal to the A axis and the B axis is represented as C axis, an inclination angle of the piezoelectric element with respect to the member is represented as $\theta$, an angle formed by the x axis of the first board and the A axis is represented as $\phi$, a force applied in the x-axis direction of the first board is represented as $fx1$, and a force applied in the x-axis direction of the second board is represented as $fx2$, a force FA in the A-axis direction, a force FB in the B-axis direction, and a force FC in the C-axis direction are respectively represented by the following expressions (4), (5), and (6).

$$FA = fx1 \cdot \cos\phi - fx2 \cdot \sin\phi \quad (4)$$

$$FB = fx1 \cdot \sin\phi \cdot \sin\theta + fx2 \cdot \cos\phi \cdot \sin\theta \quad (5)$$

$$FC = -fx1 \cdot \sin\phi \cdot \cos\theta - fx2 \cdot \cos\phi \cdot \cos\theta \quad (6)$$

With this configuration, it is possible to surely detect external forces in three dimensions in a state in which the force detecting device is less easily affected by fluctuation in temperature.

Application Example 24

In the force detecting device according to the application example described above, it is preferable that the force detecting device includes a plurality of pressurizing screws provided around the piezoelectric element and configured to apply pressurization to the piezoelectric element, and a pressurization direction of the pressurizing screw is a direction parallel to the laminating direction of the first board and the second board.

With this configuration, when a shearing force acts on the piezoelectric element, a frictional force between the boards forming the piezoelectric element surely occurs. Therefore, it is possible to surely detect charges.

Application Example 25

In the force detecting device according to the application example described above, it is preferable that at least one base section of the first base section and the second base section is formed in a tabular shape, and, in the plurality of piezoelectric elements, the first board and the second board are arranged to be inclined with respect to the one base section.

With this configuration, the force detecting device is less easily affected by fluctuation in temperature. Therefore, it is possible to accurately detect an external force.

Application Example 26

In the force detecting device according to the application example described above, it is preferable that at least one base section of the first base section and the second base section is formed in a tabular shape, a plurality of the piezoelectric elements are set, and the plurality of piezoelectric elements include the piezoelectric elements symmetrically arranged with respect to the center axis of the one base section.

With this configuration, it is possible to uniformly detect an external force.

Application Example 27

In the force detecting device according to the application example described above, it is preferable that at least one base section of the first base section and the second base section is formed in a tabular shape, and a quartet or more of the piezoelectric elements are respectively arranged in positions apart from the center section of the one base section when viewed from the attachment surface.

With this configuration, it is possible to stably detect an external force.

Application Example 28

In the force detecting device according to the application example described above, it is preferable that the piezoelectric element includes a third board formed by an X-cut quartz plate.

With this configuration, it is possible to surely detect external forces in three dimensions with a simple configuration including a quartz plate.

Application Example 29

A robot according to this application example includes: an arm; an end effector provided in the arm; and a force detecting device provided between the arm and the end effector and configured to detect an external force applied to the end effector. The force detecting device includes: a first base section including a first attachment surface fixed to a measurement target; a second base section including a second attachment surface fixed to the measurement target; and a piezoelectric element sandwiched by the first base section and the second base section and configured to detect external forces applied to the first base section and the second base section. The piezoelectric element includes a first board formed by a Y-cut quartz plate and a second board formed by a Y-cut quartz plate. The first board and the second board are laminated in parallel. In a laminating direction of the first board and the second board, an x axis of the first board and an x axis of the second board cross each other and a z axis of the first board and a z axis of the second board cross each other. The piezoelectric element is set such that a normal direction of the first attachment surface or the second attachment surface and the laminating direction are different from each other.

With this configuration, the robot is less easily affected by fluctuation in temperature. Therefore, an external force is accurately detected. It is possible to properly perform work by the end effector.

Application Example 30

An electronic component conveying apparatus according to this application example includes: a gripping section configured to grip an electronic component; and a force detecting device configured to detect an external force applied to the gripping section. The force detecting device includes: a first base section including a first attachment surface that can be fixed to a measurement target; a second base section including a second attachment surface that can be fixed to the measurement target; and a piezoelectric element sandwiched by the first base section and the second base section in a sandwiching direction and configured to detect external forces applied to the first base section and the second base section. The piezoelectric element includes a first board formed by a Y-cut quartz plate and a second board formed by a Y-cut quartz plate. The first board and the second board are laminated in parallel. In a laminating direction of the first board and the second board, an x axis of the first board and an x axis of the second board cross each other and a z axis of the first board and a z axis of the second board cross each other. The piezoelectric element is set such that a normal direction of the first attachment surface or the second attachment surface and the laminating direction are different from each other.

With this configuration, the electronic component conveying apparatus is less easily affected by fluctuation in temperature. Therefore, an external force is accurately detected. It is possible to properly perform conveyance of the electronic component.

Application Example 31

A force detecting device according to this application example is a force detecting device including: a first base section; a second base section; and a piezoelectric element sandwiched by the first base section and the second base section and configured to detect a component of external forces applied to the first base section and the second base section. The first base section includes a first attachment surface fixed to a measurement target. The second base section includes a second attachment surface fixed to the measurement target. The piezoelectric element includes a first board and a second board having a laminating direction orthogonal to a normal direction of the first attachment surface or the second attachment surface and detects the external forces applied to the first base section and the second base section from detection of a shearing force in a first detection direction same as the normal direction by the first board and detection of a shearing force in a second detection direction crossing the first detection direction by the second board.

With this configuration, the force detecting device is less easily affected by fluctuation in temperature. Therefore, it is possible to accurately detect an external force.

Application Example 32

In the force detecting device according to the application example described above, it is preferable that the first board and the second board are Y-cut quartz plates, and an x axis of a quartz crystal of the first board and an x axis of a quartz crystal of the second board are orthogonal to each other.

With this configuration, it is possible to surely detect an external force with a simple configuration including a quartz plate.

Application Example 33

In the force detecting device according to the application example described above, it is preferable that an A axis, a B axis, and a C axis, which are orthogonal coordinate axes, are set as coordinate axes in which the C axis is in a direction parallel to an intersection line of a first plane orthogonal to a first sandwiching direction and a second plane orthogonal to a second sandwiching direction, and the external forces applied to the first base section and the second base section are detected as components of external forces in the three axis directions.

With this configuration, it is possible to surely detect external forces in three dimensions.

Application Example 34

In the force detecting device according to the application example described above, it is preferable that a pair of the piezoelectric elements are set and, when a detection direction of one piezoelectric element of the two piezoelectric elements is represented as first detection direction, a detection direction of the other piezoelectric element is represented as second detection direction, an angle formed by a plane including the first detection direction and the second detection direction and a plane including the A axis and the B axis is represented as θ, an angle formed by the first detection direction and the A axis is represented as φ, a first output of the one piezoelectric element is represented as fx1, and a second output of the other piezoelectric element is represented as fx2, a force FA in the A-axis direction, a force FB in the B-axis direction, and a force FC in the C-axis direction are respectively represented by the following expressions (4), (5), and (6).

$$FA = fx1 \cdot \cos \phi - fx2 \cdot \sin \phi \quad (4)$$

$$FB = fx1 \cdot \sin \phi \cdot \sin \theta + fx2 \cdot \cos \phi \cdot \sin \theta \quad (5)$$

$$FC = -fx1 \cdot \sin \phi \cdot \cos \theta - fx2 \cdot \cos \phi \cdot \cos \theta \quad (6)$$

With this configuration, the force detecting device is less easily affected by fluctuation in temperature. Therefore, it is possible to accurately detect an external force.

Application Example 35

In the force detecting device according to the application example described above, it is preferable that the force detecting device includes a plurality of pressurizing screws provided around the piezoelectric element and configured to apply pressurization to the piezoelectric element, and a pressurization direction of the pressurizing screw is a direction parallel to the laminating direction of the first board and the second board.

With this configuration, when a shearing force acts on the piezoelectric element, a frictional force between the boards forming the piezoelectric element surely occurs. Therefore, it is possible to surely detect charges.

Application Example 36

A force detecting device according to this application example is a force detecting device including: a first base section; a second base section; and a plurality of piezoelectric elements sandwiched by the first base section and the second base section and configured to detect external forces applied to the first base section and the second base section. The first base section includes a first attachment surface fixed to a measurement target. The second base section includes a second attachment surface fixed to the measurement target. The piezoelectric element is set such that the normal of the first attachment surface or the second attachment surface and a laminating direction of a first board and a second board of the piezoelectric element are different from each other. Total weight of the force detecting device is smaller than 1 kg.

With this configuration, by setting the weight of the force detecting device smaller than 1 kg, it is possible to reduce a load of the weight of the force detecting device applied to a part attached with the force detecting device. The capacity of an actuator that drives the part attached with the force detecting device can be reduced. Therefore, it is possible to design the part attached with the force detecting device small.

Application Example 37

A force detecting device according to this application example is a force detecting device including: a first base section; a second base section; and a plurality of piezoelectric elements sandwiched by the first base section and the second base section and configured to detect external forces applied to the first base section and the second base section. The first base section includes a first attachment surface fixed to a measurement target. The second base section includes a second attachment surface fixed to the measurement target. The piezoelectric element is set such that the normal of the first attachment surface or the second attachment surface and a laminating direction of a first board and a second board of the piezoelectric element are different from each other. A conversion circuit configured to convert charges output by the plurality of piezoelectric elements into a voltage and an arithmetic circuit configured to calculate an external force from the voltage are housed in a space between the first base section and the second base section.

With this configuration, since the arithmetic circuit is incorporated rather than being separately provided, it is unnecessary to draw around a wiring cable and the like.

Application Example 38

In the force detecting device according to the application example described above, it is preferable that the conversion circuit or the arithmetic circuit includes at least any one of a semiconductor switch and an MEMS switch.

With this configuration, it is possible to reduce the weight of the force detecting device when a switch element is changed from a mechanical switch in the past to the semiconductor switch or the MEMS switch.

Application Example 39

In the force detecting device according to the application example described above, it is preferable that the first base section and the second base section form a housing space having a circular or corner-rounded square sectional shape, and distances between the respective piezoelectric elements and the centers of the attachment surfaces corresponding to the piezoelectric elements are equal.

With this configuration, when the sectional shape of the base sections is a circular shape or a corner-rounded square shape and the piezoelectric elements are arranged in a circumferential shape, stress can be uniformly dispersed. Therefore, it is possible to reduce the thickness of the base sections.

Application Example 40

A robot according to this application example includes: a force detecting device including a plurality of piezoelectric elements configured to detect an external force; and a robot arm. The weight of the force detecting device is smaller than 20% of maximum weight that the robot arm can convey.

With this configuration, since the weight of the force detecting device can be set smaller than 20% of the maximum weight that the robot arm can convey, it is possible to facilitate control of the robot arm to which the weight of the force detecting device is applied.

BRIEF DESCRIPTION OF THE DRAWINGS

The invention will be described with reference to the accompanying drawings, wherein like numbers reference like elements.

DESCRIPTION OF EXEMPLARY EMBODIMENTS

A force detecting device, a robot and an electronic component conveying apparatus according to the invention are explained in detail below based on preferred embodiments with reference to the drawings.

First Embodiment

Figure 1:
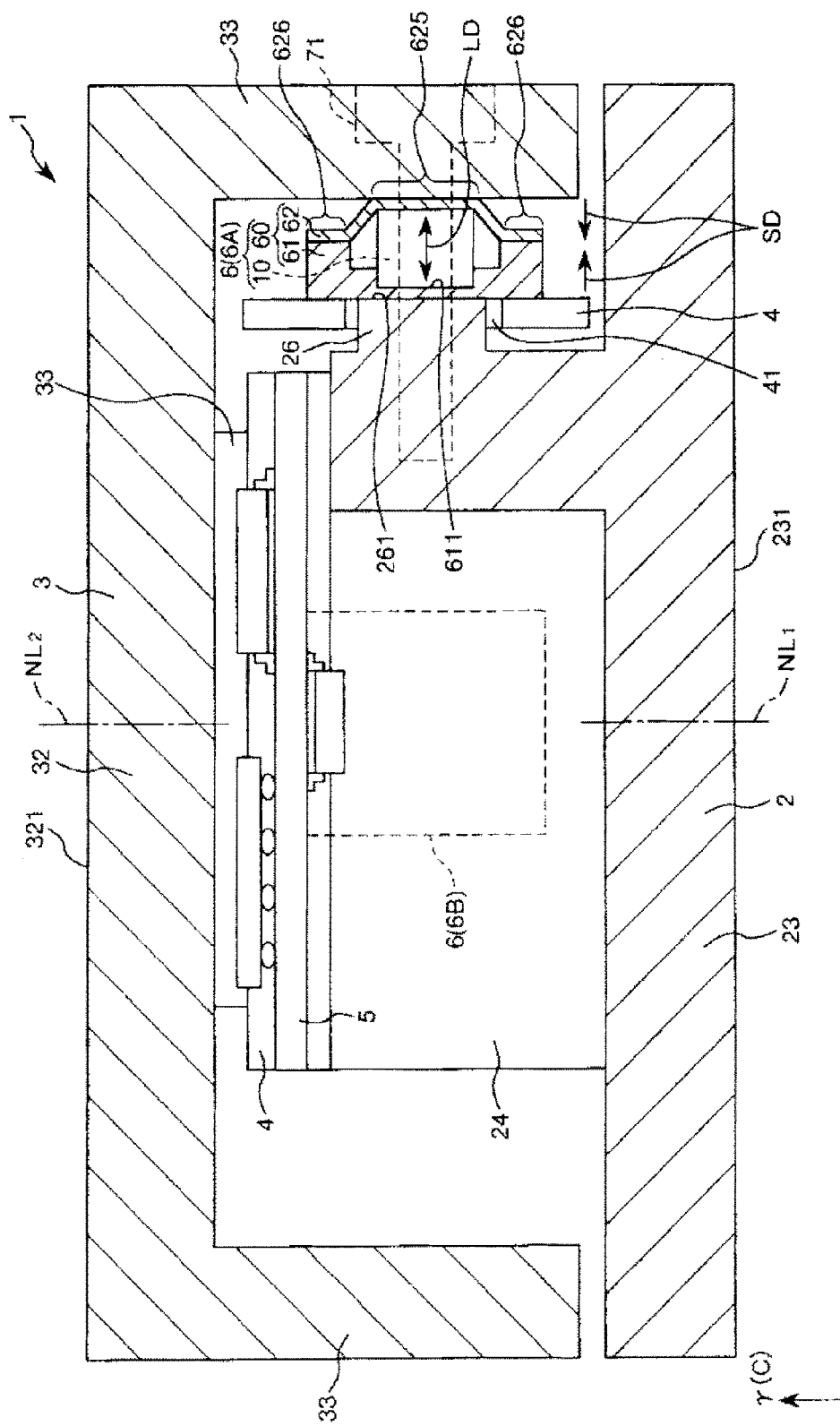
FIG. 1 is a sectional view showing a force detecting device according to a first embodiment of the invention.
Figure 2:
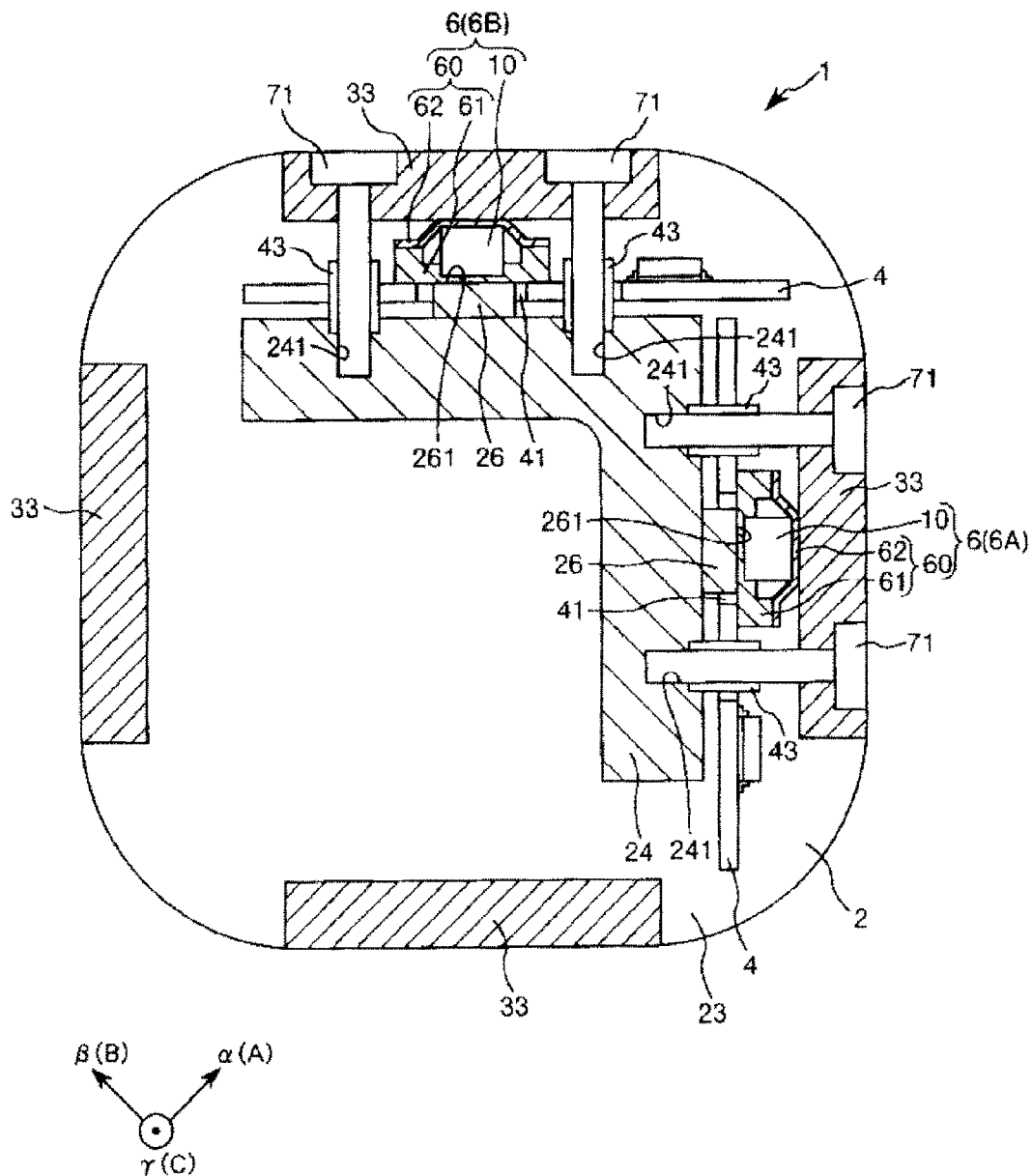
FIG. 2 is a plan view of the force detecting device shown in FIG. 1.
Figure 3:
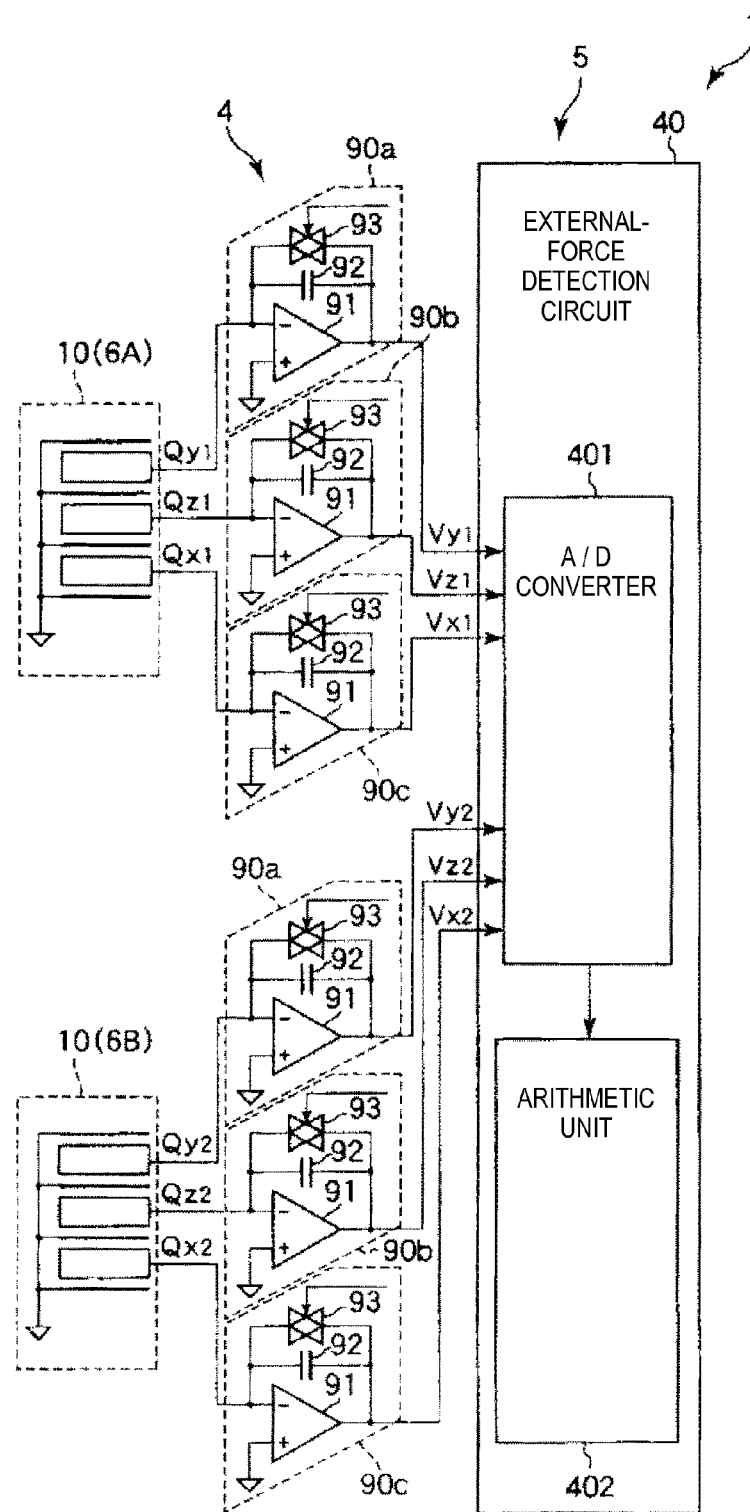
FIG. 3 is a circuit diagram schematically showing the force detecting device shown in FIG. 1.
Figure 4:
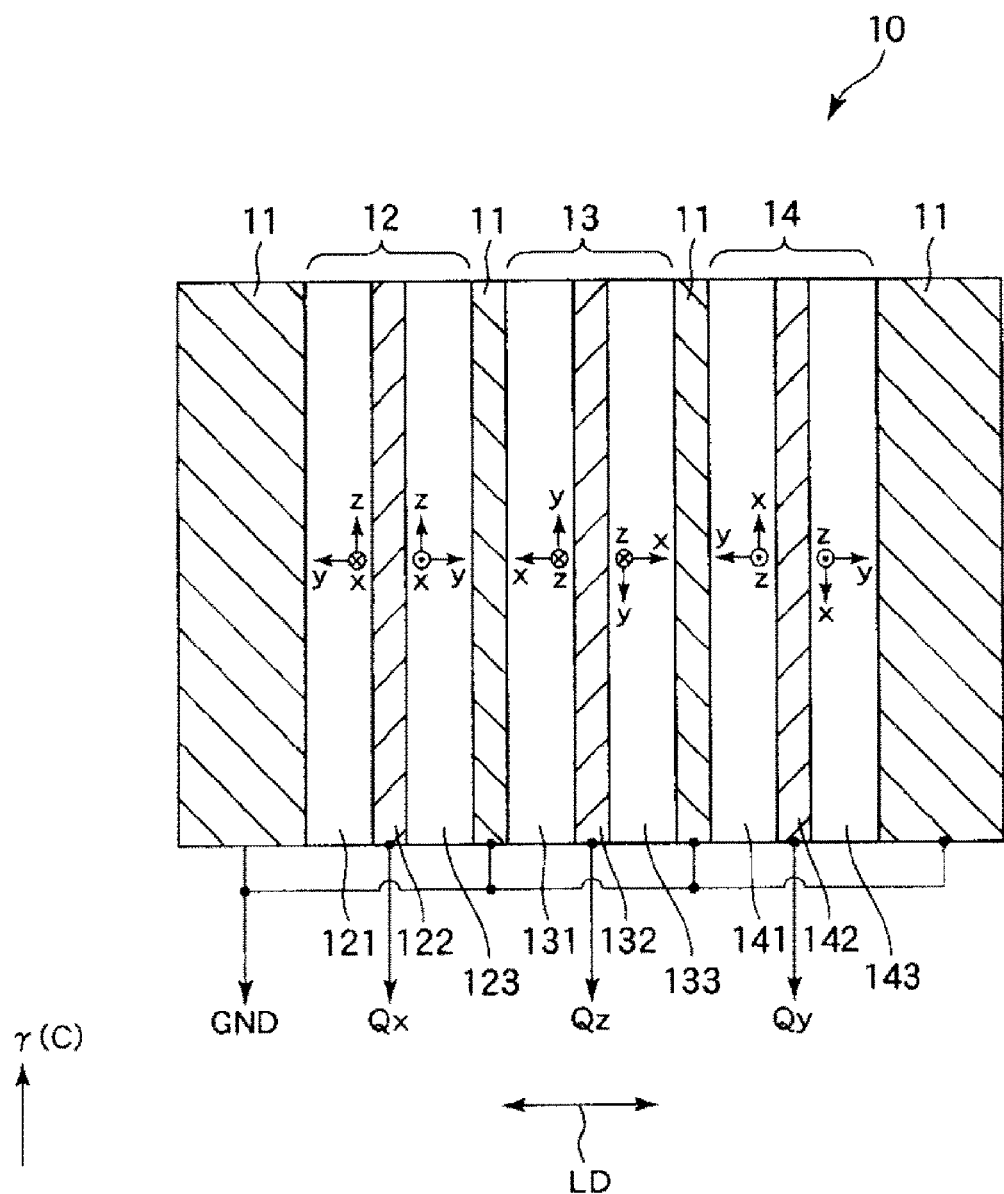
FIG. 4 is a sectional view schematically showing a charge output element of the force detecting device shown in FIG. 1.
Figure 5:
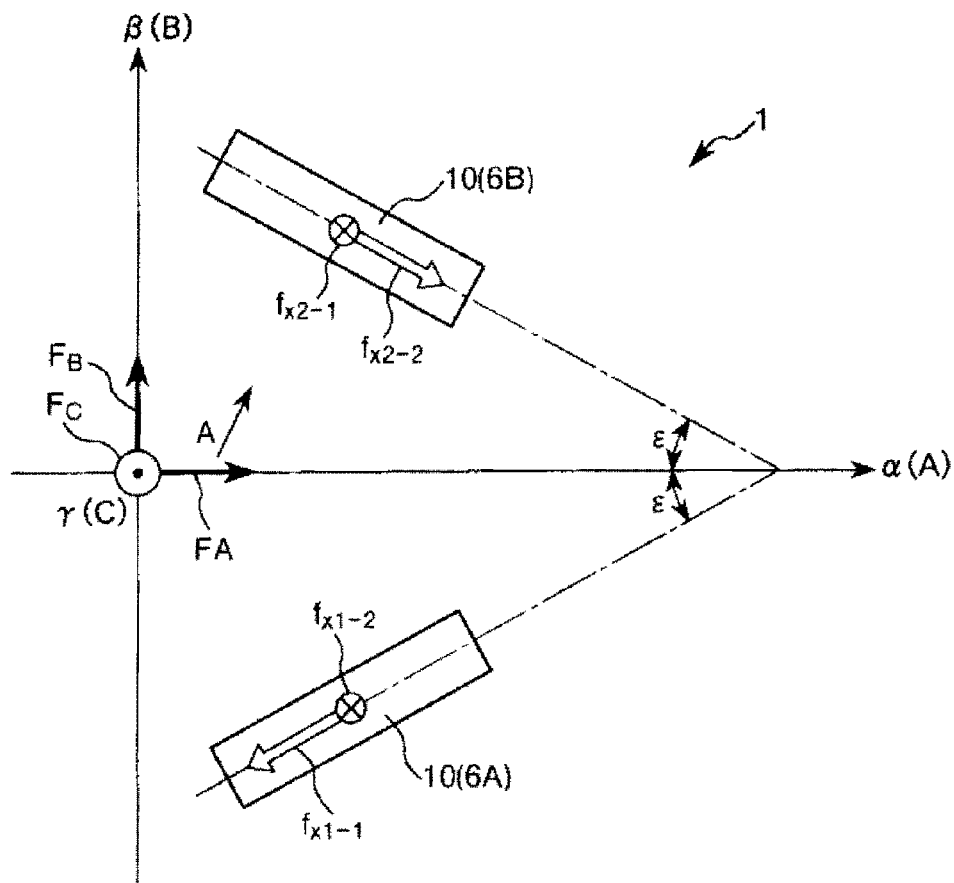
FIG. 5 is a schematic diagram showing an action state of a force detected by the charge output element of the force detecting device shown in FIG. 1.
Figure 6:
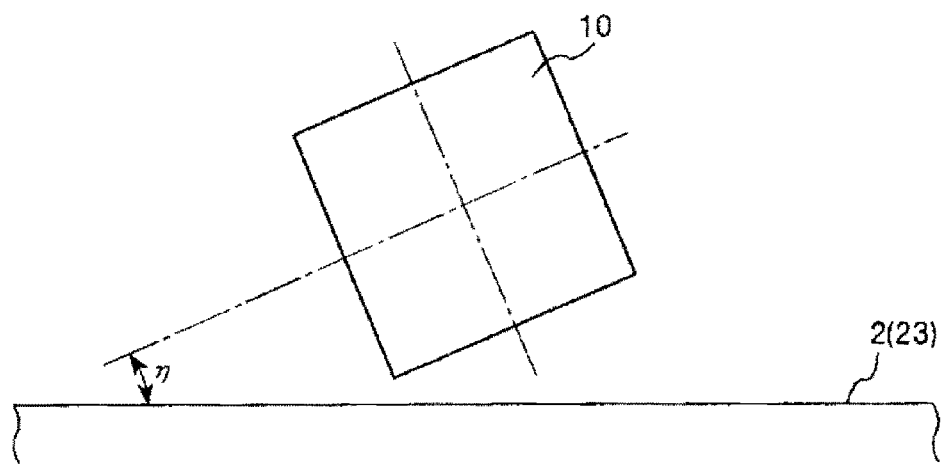
FIG. 6 is a diagram of the charge output element viewed from an arrow A direction in FIG. 5.

FIG. 1 is a sectional view showing a force detecting device according to a first embodiment of the invention. FIG. 2 is a plan view of the force detecting device shown in FIG. 1. FIG. 3 is a circuit diagram schematically showing the force detecting device shown in FIG. 1. FIG. 4 is a sectional view schematically showing a charge output element of the force detecting device shown in FIG. 1. FIG. 5 is a schematic diagram showing an action state of a force detected by a charge output element of the force detecting device shown in FIG. 1. FIG. 6 is a diagram of the charge output element viewed from an arrow A direction in FIG. 5.

Note that, in the following explanation, for convenience of explanation, the upper side in FIG. 1 is referred to as "up" or "upward" and the lower side in the figure is referred to as "down" or "downward".

A force detecting device 1 shown in FIGS. 1 and 2 has a function of detecting an external force (including a moment), that is, a function of detecting external forces applied along three axes (an $\alpha$ (A) axis, a $\beta$ (B) axis, and a $\gamma$ (C) axis) orthogonal to one another. The $\alpha$ axis, the $\beta$ axis, and the $\gamma$ axis, which are orthogonal coordinate axes, are orthogonal coordinate axes in which the $\alpha$ axis and the $\beta$ axis are included in a plane parallel to a laminating direction LD explained below.

The force detecting device 1 includes a first base section 2 functioning as a base plate, a second base section 3 functioning as a cover plate arranged a predetermined space apart from the first base section 2 to be opposed to the first base section 2, four analog circuit boards 4 housed (provided) between the first base section 2 and the second base section 3, one digital circuit board 5 housed (provided) between the first base section 2 and the second base section 3 and electrically connected to the analog circuit boards 4, two sensor devices 6 mounted on the analog circuit boards 4 and including charge output elements 10 functioning as sensor elements (piezoelectric elements) that output a signal according to an applied external force and packages 60 that house the charge output elements 10, and eight pressurizing bolts (pressurizing screws) 71 functioning as fixing members. In this embodiment, of the two sensor devices 6, one sensor device 6 located on the right side in the figure is sometimes referred to as "sensor device 6A" and the other sensor device 6 is sometimes referred to as "sensor device 6B".

The external shape of the first base section 2 is a tabular shape. The plane shape of the first base section 2 is a square shape rounded at corners. The first base section 2 includes a bottom plate 23 and wall sections 24 erected upward from the bottom plate 23. The wall sections 24 are formed in an "L" shape. Projections 26 are formed to project respectively on two surfaces facing outward. Top surfaces 261 of the projections 26 are planes perpendicular to the bottom plate 23.

In this embodiment, when the force detecting device 1 is fixed to, for example, a robot, and used, the lower surface of the bottom plate 23 functions as an attachment surface (a first attachment surface) 231 for the robot (a measurement target), and the first attachment surface 231 is fixed to a first portion of the robot.

It is preferable that the external shape of the second base section 3 is also a tabular shape and the plane shape of the second base section 3 is the same as the plane shape of the first base section 2. The second base section 3 includes a top plate 32 and four sidewalls 33 formed at edges of the top plate 32 and projecting downward from the edges.

In this embodiment, when the force detecting device 1 is fixed to, for example, a robot, and used, the upper surface of the top plate 32 functions as an attachment surface (a second attachment surface) 321 for an end effector of a robot (a measurement target), and the second attachment surface 321 is fixed to a second portion of the robot. Note that the attachment surface 321 and the attachment surface 231 of the first base section 2 are parallel to each other in a natural state in which an external force is not applied thereto.

The sensor device 6A is sandwiched between the top surface 261 of one projection 26 of the two projections 26 of the first base section 2 and one sidewall 33 of the second base section 3. That is, the charge output element 10 of the sensor device 6A is sandwiched and pressurized by the top surface 261 of one projection 26 of the first base section 2 and one sidewall 33 of the second base section 3 via the package 60. In the following explanation, a direction in which the charge output element 10 is sandwiched is referred to as "sandwiching direction SD". The sandwiching direction SD of sensor device 6A may also be referred to as a first sandwiching direction SD.

Note that, as explained above, the first base section 2 and the second base section 3 form a housing space in which the analog circuit board 4 and the digital circuit board 5 are housed. The housing space has a circular or corner-rounded square sectional shape. Distances between the respective sensor devices 6 and the center of the attachment surface 321 (or the attachment surface 231) are equal. With such a configuration, when the sensor devices 6 are arranged in a circumferential shape, stress can be uniformly dispersed. Therefore, it is possible to reduce the thickness of the first base section 2 and the second base section 3.

As shown in FIGS. 1 and 4, in the posture of the charge output element 10 of the sensor device 6A, layers forming the charge output element 10 are perpendicular to the first base section 2. That is, the laminating direction LD in which the layers forming the charge output element 10 are laminated and the first sandwiching direction SD are parallel to the first base section 2. As shown in FIG. 5, in the charge output element 10, an x axis of a first sensor 12 and a z axis of the third sensor 14 are inclined at an inclination angle $\epsilon$ with respect to the $\alpha$ axis. Note that the first sensor 12 and the third sensor 14 are explained below.

The sensor device 6B is sandwiched between the top surface 261 of the other projection 26 of the first base section 2 and one sidewall 33 of the second base section 3. That is, the charge output element 10 of the sensor device 6B is sandwiched and pressurized by the top surface 261 of the other projection 26 of the first base section 2 and one sidewall 33 of the second base section 3 via the package 60. The sandwiching direction SD of sensor device 6B may be referred to as a second sandwiching direction. In the posture of the charge output element 10 of the sensor device 6B, as in the posture of the charge output element 10 of the sensor device 6A, layers forming the charge output element 10 are perpendicular to the first base section 2. That is, the laminating direction LD and the second sandwiching direction SD are parallel to each other. As shown in FIG. 5, as in the charge output element 10 of the sensor device 6A, in the charge output element 10, the x axis of the first sensor 12 and the z axis of the third sensor 14 are inclined at the inclination angle $\epsilon$ with respect to the $\alpha$ axis.

As explained above, in this embodiment, the $\alpha$ axis is a bisector that bisects an angle formed by the charge output element 10 of the sensor device 6A and the charge output element 10 of the sensor device 6B. Therefore, the sensor device 6A and the sensor device 6B are not arranged on the same plane and not arranged in parallel to each other.

Note that, as shown in FIG. 6, when an angle formed by the x axis of the first sensor 12 and the bottom plate 23 of the first base section 2 is represented as $\eta$, the charge output elements 10 are allowed to tilt to a decree in which the angle $\eta$ satisfies $0° \leq \eta < 90°$.

Any one of the first base section 2 and the second base section 3 may be set as a board on a side to which a force is applied. However, in this embodiment, the second base section 3 is explained as the board on the side to which a force is applied.

As shown in FIG. 3, the analog circuit board 4 connected to the sensor device 6A includes a conversion output circuit 90a that converts a charge Qy1 output from the charge output element 10 of the mounted sensor device 6A into a voltage Vy1, a conversion output circuit 90b that converts a charge Qz1 output from the charge output element 10 into a voltage Vz1, and a conversion output circuit 90c that converts a charge Qx1 output from the charge output element 10 into a voltage Vx1. The analog circuit board 4 connected to the sensor device 6B includes the conversion output circuit 90a that converts a charge Qy2 output from the charge output element 10 of the mounted sensor device 6B into a voltage Vy2, the conversion output circuit 90b that converts a charge Qz2 output from the charge output element 10 into a voltage Vz2, and the conversion output circuit 90c that converts a charge Qx3 output from the charge output element 10 into a voltage Vx3.

The digital circuit board 5 includes an external force detection circuit 40 that detects an applied external force.

The analog circuit boards 4 and the digital circuit board 5 are respectively supported in different positions of the wall sections 24 of the first base section 2 and are protected between the first base section 2 and the second base section 3.

Note that constituent materials of parts other than elements and wires of the first base section 2, the second base section 3, and the analog circuit boards 4 and parts other than elements and wires of the digital circuit board 5 are not particularly limited. For example, various resin materials, various metal materials, and the like can be used.

The first base section 2 and the second base section 3 are respectively formed by members, the external shapes of which are tabular shapes. However, the external shapes of the first base section 2 and the second base section 3 are not limited to this. For example, one base section may be formed by a member formed in a tabular shape and the other base section may be formed by a member formed in a block shape.

Charge Output Elements

As explained above, the force detecting device 1 has a function of detecting external forces applied along the $\alpha$ axis, the $\beta$ axis, and the $\gamma$ axis orthogonal to one another. The $\alpha$ axis and the $\beta$ axis are axes extending along orthogonal two directions in planes of the first base section 2 and the second base section 3. The $\gamma$ axis is an axis extending along one direction orthogonal to the $\alpha$ axis and the $\beta$ axis, that is, an axis extending along the thickness direction of the first base section 2 and the second base section 3. In the force detecting device 1, the sensor devices 6A and 6B including the charge output elements 10 are incorporated as sensor devices that detect the external forces. Since the charge output elements 10 have the same configuration, one charge output element 10 is representatively explained.

As shown in FIG. 4, the charge output element 10 can output a charge Qx1 or Qx2 (representatively referred to as "charge Qx"), a charge Qy1 or Qy2 (representatively referred to as "charge Qy"), and a charge Qz1 or Qz2 (representatively referred to as "charge Qz"). External forces applied (received) along the α axis, the β axis, and the γ axis are detected on the basis of the output charges.

Note that the charge output element 10 can output the charge Qz. However, as explained below, the force detecting device 1 does not use the charge Qz when calculating external forces. The output charge Qz is used for, for example, adjustment of pressurization by the pressurizing bolts (the pressurizing screws) 71.

A reason why the charge Qz is not used during the external force detection is explained with reference to an example in which the force detecting device 1 is used in an industrial robot including an arm attached with an end effector. In this case, the first base section 2 or the second base section 3 is heated, thermally expanded, and deformed by heat transfer from heat generation sources such as motors provided in the arm and the end effector. According to the deformation, pressurization to the charge output element 10 changes from a predetermined value. The change in the pressurization to the charge output element 10 is included as a noise component due to the temperature change of the force detecting device 1 to such a degree as to considerably affect the charge Qz.

The shape of the charge output element 10 is not particularly limited. However, in this embodiment, the charge output element 10 is formed in a square shape when viewed from the laminating direction LD. Note that examples of other external shapes of the charge output element 10 include other polygonal shapes such as a pentagonal shape, a circular shape, and an elliptical shape.

As shown in FIG. 4, the charge output element 10 includes four ground electrode layers 11 earthed to the ground (a reference potential point), a first sensor 12 that outputs the charge Qx according to an external force (a shearing force), a second sensor 13 that outputs the charge Qz according to an external force (a compressive/tensile force), and a third sensor 14 that outputs the charge Qy according to an external force (a shearing force). The ground electrode layers 11 and the sensors 12, 13, and 14 are alternately laminated in parallel. The laminating direction LD is a direction orthogonal to a normal NL2 of the attachment surface 321 (or a normal NL1 of the attachment surface 231).

In the configuration shown in the figure, the first sensor 12, the second sensor 13, and the third sensor 14 are laminated in this order from the left side in FIG. 4. However, the invention is not limited to this. The laminating order of the sensors 12, 13, and 14 may be any order.

The ground electrode layers 11 are electrodes earthed to the ground (the reference potential point). A material forming the ground electrode layers 11 is not particularly limited. However, for example, gold, titanium, aluminum, copper, iron, or alloys containing these kinds of metal are preferable. Among these materials, in particular, it is preferable to use stainless steel, which is an iron alloy. The ground electrode layers 11 formed of the stainless steel have excellent durability and corrosion resistance.

The first sensor 12 has a function of outputting the charge Qx according to an external force (a shearing force) applied in a first detection direction same as the direction of the normal NL2 (the normal NL1). That is, the first sensor 12 is configured to output positive charges or negative charges according to the external force.

The first sensor 12 includes a first piezoelectric layer (a first board) 121, a second piezoelectric layer (the first board) 123 provided to be opposed to the first piezoelectric layer 121, and an output electrode layer 122 provided between the first piezoelectric layer 121 and the second piezoelectric layer 123.

The first piezoelectric layer 121 is formed by a Y-cut quartz plate and includes an x axis, a y axis, and a z axis, which are crystal axes orthogonal to one another. The y axis is an axis extending along the thickness direction of the first piezoelectric layer 121. The x axis is an axis extending along the paper surface depth direction in FIG. 4. The z axis is an axis extending along the up down direction in FIG. 4. In the configuration shown in FIG. 4, in the following explanation, concerning the x axis, the paper surface depth side in FIG. 4 is a positive direction and the opposite side of the paper surface depth side is a negative direction. Concerning the y axis, the left side in FIG. 4 is a positive direction and the opposite side of the left side is a negative direction. Concerning the z axis, the upper side in FIG. 4 is a positive direction and the opposite side of the upper side is a negative direction.

The first piezoelectric layer 121 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force (a shearing force) along the positive direction of the x axis is applied to the surface of the first piezoelectric layer 121, charges are induced in the first piezoelectric layer 121 by the piezoelectric effect. As a result, positive charges concentrate near the surface of the first piezoelectric layer 121 on the output electrode layer 122 side. Negative charges concentrate near the surface of the first piezoelectric layer 121 on the ground electrode layer 11 side. Similarly, when an external force along the negative direction of the x axis is applied to the surface of the first piezoelectric layer 121, negative charges concentrate near the surface of the first piezoelectric layer 121 on the output electrode layer 122 side. Positive charges concentrate near the surface of the first piezoelectric layer 121 on the ground electrode layer 11 side.

The second piezoelectric layer 123 is also formed by a Y-cut quartz plate and includes an x axis, a y axis, and a z axis, which are crystal axes orthogonal to one another. The y axis is an axis extending along the thickness direction of the second piezoelectric layer 123. The x axis is an axis extending along the paper surface depth direction in FIG. 4. The z axis is an axis extending along the up down direction in FIG. 4. In the configuration shown in FIG. 4, in the following explanation, concerning the x axis, the paper surface front side in FIG. 4 is a positive direction and the opposite side of the paper surface front side is a negative direction. Concerning the y axis, the right side in FIG. 4 is a positive direction and the opposite side of the right side is a negative direction. Concerning the z axis, the upper side in FIG. 4 is a positive direction and the opposite side of the upper side is a negative direction.

Like the first piezoelectric layer 121, the second piezoelectric layer 123 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force (a shearing force) along the positive direction of the x axis is applied to the surface of the second piezoelectric layer 123, charges are induced in the second piezoelectric layer 123 by the piezoelectric effect. As a result, positive charges concentrate near the surface of the second piezoelectric layer 123 on the output electrode layer 122 side. Negative charges concentrate near the surface of the second piezoelectric layer 123 on the ground electrode layer 11 side. Similarly, when an external force along the negative direction of the x axis is applied to the surface of the second piezoelectric layer 123, negative charges concentrate near the surface of the second piezoelectric layer 123 on the output electrode layer 122 side. Positive charges concentrate near the surface of the second piezoelectric layer 123 on the ground electrode layer 11 side.

The first sensor 12 includes the first piezoelectric layer 121 and the second piezoelectric layer 123. Consequently, compared with when the first sensor 12 is formed by only one of the first piezoelectric layer 121 and the second piezoelectric layer 123 and the output electrode layer 122, it is possible to increase the positive charges or the negative charges concentrating near the output electrode layer 122. As a result, it is possible to increase the charge Qx output from the output electrode layer 122.

The output electrode layer 122 has a function of outputting, as the charge Qx, positive charges or negative charges generated in the first piezoelectric layer 121 and the second piezoelectric layer 123. As explained above, when an external force along the positive direction of the x axis is applied to the surface of the first piezoelectric layer 121 or the surface of the second piezoelectric layer 123, the positive charges concentrate near the output electrode layer 122. As a result, a positive charge Qx is output from the output electrode layer 122. On the other hand, when an external force along the negative direction of the x axis is applied to the surface of the first piezoelectric layer 121 or the surface of the second piezoelectric layer 123, the negative charges concentrate near the output electrode layer 122. As a result, a negative charge Qx is output from the output electrode layer 122.

The size of the output electrode layer 122 is preferably equal to or larger than the size of the first piezoelectric layer 121 and the second piezoelectric layer 123. When the output electrode layer 122 is smaller than the first piezoelectric layer 121 or the second piezoelectric layer 123, a part of the first piezoelectric layer 121 or the second piezoelectric layer 123 is not in contact with the output electrode layer 122. Therefore, a part of charges generated in the first piezoelectric layer 121 or the second piezoelectric layer 123 sometimes cannot be output from the output electrode layer 122. As a result, the charge Qx output from the output electrode layer 122 decreases. Note that the same applies to output electrode layers 132 and 142 explained below.

The second sensor 13 has a function of outputting the charge Qz according to an external force (a compressive/tensile force). That is, the second sensor 13 is configured to output positive charges according to a compressive force and output negative charges according to a tensile force.

The second sensor 13 includes a third piezoelectric layer (a third board) 131, a fourth piezoelectric layer (the third board) 133 provided to be opposed to the third piezoelectric layer 131, and an output electrode layer 132 provided between the third piezoelectric layer 131 and the fourth piezoelectric layer 133.

The third piezoelectric layer 131 is formed by an X-cut quartz plate and has an x axis, a y axis, and a z axis orthogonal to one another. The x axis is an axis extending along the thickness direction of the third piezoelectric layer 131. The y axis is an axis extending along the up down direction in FIG. 4. The z axis is an axis extending along the paper surface depth direction in FIG. 4.

When a compressive force parallel to the x axis is applied to the surface of the third piezoelectric layer 131, charges are induced in the third piezoelectric layer 131 by the piezoelectric effect. As a result, positive charges concentrate near the surface of the third piezoelectric layer 131 on the output electrode layer 132 side. Negative charges concentrate near the surface of the third piezoelectric layer 131 on the ground electrode layer 11 side. Similarly, when a tensile force parallel to the x axis is applied to the surface of the third piezoelectric layer 131, negative charges concentrate near the surface of the third piezoelectric layer 131 on the output electrode layer 132 side. Positive charges concentrate near the surface of the third piezoelectric layer 131 on the ground electrode layer 11 side.

The fourth piezoelectric layer 133 is also formed by an X-cut quartz plate and has an x axis, a y axis, and a z axis orthogonal to one another. The x axis is an axis extending along the thickness direction of the fourth piezoelectric layer 133. The y axis is an axis extending along the up down direction in FIG. 4. The z axis is an axis extending along the paper surface depth direction in FIG. 4.

When a compressive force parallel to the x axis is applied to the surface of the fourth piezoelectric layer 133, charges are induced in the fourth piezoelectric layer 133 by the piezoelectric effect. As a result, positive charges concentrate near the surface of the fourth piezoelectric layer 133 on the output electrode layer 132 side. Negative charges concentrate near the surface of the fourth piezoelectric layer 133 on the ground electrode layer 11 side. Similarly, when a tensile force parallel to the x axis is applied to the surface of the fourth piezoelectric layer 133, negative charges concentrate near the surface of the fourth piezoelectric layer 133 on the output electrode layer 132 side. Positive charges concentrate near the surface of the fourth piezoelectric layer 133 on the ground electrode layer 11 side.

The output electrode layer 132 has a function of outputting, as the charge Qz, positive charges or negative charges generated in the third piezoelectric layer 131 and the fourth piezoelectric layer 133. As explained above, when a compressive force parallel to the x axis is applied to the surface of the third piezoelectric layer 131 or the surface of the fourth piezoelectric layer 133, the positive charges concentrate near the output electrode layer 132. As a result, a positive charge Qz is output from the output electrode layer 132. On the other hand, when a tensile force parallel to the x axis is applied to the surface of the third piezoelectric layer 131 or the surface of the fourth piezoelectric layer 133, the negative charges concentrate near the output electrode layer 132. As a result, a negative charge Qz is output from the output electrode layer 132.

The third sensor 14 has a function of outputting the charge Qy according to an external force (a shearing force) in a second detection direction orthogonal to the laminating direction LD (the second sandwiching direction) and crossing the first detection direction of the external force acting when the first sensor 12 outputs the charge Qy. That is, the third sensor 14 is configured to output positive charges or negative charges according to the external force.

Note that, among the orthogonal coordinate axes, i.e., the α axis, the β axis, and the γ axis, the γ axis is a direction parallel to an intersection line of a first plane orthogonal to the first sandwiching direction and a second plane orthogonal to the second sandwiching direction.

The third sensor 14 includes a fifth piezoelectric layer (a second board) 141, a sixth piezoelectric layer (the second board) 143 provided to be opposed to the fifth piezoelectric layer 141, and an output electrode layer 142 provided between the fifth piezoelectric layer 141 and the sixth piezoelectric layer 143.

The fifth piezoelectric layer 141 is formed by a Y-cut quartz plate and has an x axis, a y axis, and a z axis, which are crystal axes orthogonal to one another. The y axis is an axis extending along the thickness direction of the fifth piezoelectric layer 141. The x axis is an axis extending along the up down direction in FIG. 4. The z axis is an axis extending along the paper surface depth direction in FIG. 4. In the configuration shown in FIG. 4, in the following explanation, concerning the x axis, the upper side in FIG. 4 is a positive direction and the opposite side of the upper side is a negative direction. Concerning the y axis, the left side in FIG. 4 is a positive direction and the opposite side of the left side is a negative direction. Concerning the z axis, the paper surface front side in FIG. 4 is a positive direction and the opposite side of the paper surface front side is a negative direction.

The fifth piezoelectric layer 141 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force along the positive direction of the x axis is applied to the surface of the fifth piezoelectric layer 141, charges are induced in the fifth piezoelectric layer 141 by the piezoelectric effect. As a result, positive charges concentrate near the surface of the fifth piezoelectric layer 141 on the output electrode layer 142 side. Negative charges concentrate near the surface of the fifth piezoelectric layer 141 on the ground electrode layer 11 side. Similarly, when an external force along a negative direction of the x axis is applied to the surface of the fifth piezoelectric layer 141, negative charges concentrate near the surface of the fifth piezoelectric layer 141 on the output electrode layer 142 side. Positive charges concentrate near the surface of the fifth piezoelectric layer 141 on the ground electrode layer 11 side.

The sixth piezoelectric layer 143 is also formed by a Y-cut quartz plate and has an x axis, a y axis, and a z axis, which are crystal axes orthogonal to one another. The y axis is an axis extending along the thickness direction of the sixth piezoelectric layer 143. The x axis is an axis extending along the up down direction in FIG. 4. The z axis is an axis extending along the paper surface depth direction in FIG. 4. In the configuration shown in FIG. 4, in the following explanation, concerning the x axis, the lower side in FIG. 4 is a positive direction and the opposite side of the lower side is a negative direction. Concerning the y axis, the right side in FIG. 4 is a positive direction and the opposite side of the right side is a negative direction. Concerning the z axis, the paper surface front side in FIG. 4 is a positive direction and the opposite side of the paper surface front side is a negative direction.

Like the fifth piezoelectric layer 141, the sixth piezoelectric layer 143 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force along a positive direction of the x axis is applied to the surface of the sixth piezoelectric layer 143, charges are induced in the sixth piezoelectric layer 143 by the piezoelectric effect. As a result, positive charges concentrate near the surface of the sixth piezoelectric layer 143 on the output electrode layer 142 side. Negative charges concentrate near the surface of the sixth piezoelectric layer 143 on the ground electrode layer 11 side. Similarly, when an external force along a negative direction of the x axis is applied to the surface of the sixth piezoelectric layer 143, negative charges concentrate near the surface of the sixth piezoelectric layer 143 on the output electrode layer 142 side. Positive charges concentrate near the surface of the sixth piezoelectric layer 143 on the ground electrode layer 11 side.

In the charge output element 10, when viewed from the laminating direction LD, the x axes of the first piezoelectric layer 121 and the second piezoelectric layer 123 and the x axes of the fifth piezoelectric layer 141 and the sixth piezoelectric layer 143 cross each other. When viewed from the laminating direction LD, the z axes of the first piezoelectric layer 121 and the second piezoelectric layer 123 and the z axes of the fifth piezoelectric layer 141 and the sixth piezoelectric layer 143 cross each other.

The output electrode layer 142 has a function of outputting, as the charge Qy, positive charges or negative charges generated in the fifth piezoelectric layer 141 and the sixth piezoelectric layer 143. As explained above, when an external force along the positive direction of the x axis is applied to the surface of the fifth piezoelectric layer 141 or the surface of the sixth piezoelectric layer 143, the positive charges concentrate near the output electrode layer 142. As a result, a positive charge Qy is output from the output electrode layer 142. On the other hand, when an external force along the negative direction of the x axis is applied to the surface of the fifth piezoelectric layer 141 or the surface of the sixth piezoelectric layer 143, the negative charges concentrate near the output electrode layer 142. As a result, a negative charge Qy is output from the output electrode layer 142.

As explained above, in the charge output element 10, the first sensor 12, the second sensor 13, and the third sensor 14 are laminated such that force detecting directions of the sensors are orthogonal to one another. Consequently, the sensors can respectively induce charges according to force components orthogonal to one another. Therefore, the charge output element 10 can output the three charges Qx, Qy, and Qz according to the respective external forces along the x axis, the y axis, and the z axis.

As shown in FIG. 2, the first base section 2 and the second base section 3 are connected and fixed by the pressurizing bolts 71. Note that the "fixing" by the pressurizing bolts 71 is performed while allowing a predetermined amount of mutual movements of the two fixing targets. Specifically, the first base section 2 and the second base section 3 are fixed by the two pressurizing bolts 71 while being allowed to move in the surface direction of the second base section 3 by a predetermined amount each other. Note that the same applies to the other embodiments.

There are four (a plurality of) pressurizing bolts 71. Two among the four pressurizing bolts 71 are arranged on both sides of the sensor device 6A via the sensor device 6A, i.e., provided around the sensor device 6A and apply pressurization to the sensor device 6A. The remaining two pressurizing bolts 71 are arranged on both sides of the sensor device 6B via the sensor device 6B, i.e., provided around the sensor device 6B and apply pressurization to the sensor device 6B. A pressurization direction by the pressurizing bolts 71 is a direction parallel to the laminating direction LD.

Female screws 241 screwing with the pressurizing bolts 71 are provided in the wall sections 24 of the first base section 2. In a state in which the sensor devices 6 are sandwiched between the first base section 2 and the second base section 3, the pressurizing bolts 71 can be inserted into the female screws 241 of the first base section 2 from the second base section 3 side. Consequently, pressure, that is, pressurization, of predetermined magnitude is applied to the charge output elements 10 together with the packages 60, which house the charge output elements 10, in a direction orthogonal to the first base section 2. When a shearing force acts on the charge output elements 10, a frictional force surely occurs between the layers forming the charge output elements 10. Therefore, it is possible to surely detect charges.

As shown in FIG. 2, the pressurizing bolts 71 pierce through the analog circuit board 4. Pipes 43 formed of an insulating material such as a resin material are fixed by, for example, fitting, to portions of the analog circuit board 4 where the pressurizing bolts 71 pierce through.

Note that a constituent material of the pressurizing bolts 71 is not particularly limited. For example, various resin materials, various metal materials, and the like can be used.

Sensor Device

The sensor device 6 includes the charge output element 10 and the package 60 that houses the charge output element 10.

As shown in FIG. 1, the package 60 includes a base section (a first member) 61 including a recess 611 and a lid body (a second member) 62 joined to the base section 61. The charge output element 10 is set in the recess 611 of the base section 61. The recess 611 of the base section 61 is sealed by the lid body 62. Consequently, it is possible to protect the charge output element 10 and provide the force detecting device 1 having high reliability. Note that the top surface of the charge output element 10 is in contact with the lid body 62. The lid body 62 of the package 60 is arranged on the sidewall 33 side of the second base section 3. The base section 61 is arranged on the wall section 24 side of the first base section 2. The base section 61 is fixed to the analog circuit board 4. With this configuration, the base section 61 and the lid body 62 are sandwiched and pressurized in the sandwiching direction SD by the top surface 261 of the first base section 2 and the sidewall 33 of the second base section 3. Further, the charge output element 10 is also sandwiched and pressurized in the sandwiching direction SD by the base section 61 and the lid body 62.

A constituent material of the base section 61 is not particularly limited. For example, an insulative material such as ceramics can be used. A constituent material of the lid body 62 is not particularly limited. For example, various metal materials such as stainless steel can be used. Note that the constituent material of the base section 61 and the constituent material of the lid body 62 may be the same or may be different.

The plane shape of the package 60 is not particularly limited. However, in this embodiment, the package 60 is formed in a square shape. Examples of other shapes of the package 60 include polygonal shapes such as a pentagonal shape, a circular shape, and an elliptical shape. When the shape of the package 60 is a polygonal shape, for example, corners of the polygonal shape may be rounded or may be obliquely cut out.

In this embodiment, the lid body 62 is formed in a tabular shape. A part between a center section 625 and an outer circumference section 626 of the lid body 62 is bent, whereby the center section 625 projects toward the sidewalls 33 of the second base section 3. The shape of the center section 625 is not particularly limited. However, in this embodiment, the center section 625 is formed in a shape same as the shape of the charge output element 10, that is, a square shape in plan view of the first base section 2. Note that both of the upper surface and the lower surface of the center section 625 of the lid body 62 are planes.

A plurality of terminals (not shown in the figure) electrically connected to the charge output element 10 are provided at the end of the lower surface of the base section 61 of the package 60. The terminals are electrically connected to the analog circuit board 4. Consequently, the charge output element 10 and the analog circuit board 4 are electrically connected.

Note that, in a part of the analog circuit board 4 where the charge output element 10 is arranged, a hole 41 into which the projection 26 is inserted is formed. The hole 41 is a hole piercing through the analog circuit board 4.

Conversion Output Circuits

As shown in FIG. 3, the conversion output circuits 90a, 90b, and 90c are connected to the charge output elements 10. The conversion output circuit 90a has a function of converting the charge Qy output from the charge output element 10 into the voltage Vy. The conversion output circuit 90b has a function of converting the charge Qz output from the charge output element 10 into the voltage Vz. The conversion output circuit 90c has a function of converting the charge Qx output from the charge output element 10 into the voltage Vx. The conversion output circuits 90a, 90b, and 90c are the same. Therefore, the conversion output circuit 90c is representatively explained below.

The conversion output circuit 90c has a function of converting the charge Qx output from the charge output element 10 into the voltage Vx and outputting the voltage Vx. The conversion output circuit 90c includes an operational amplifier 91, a capacitor 92, and a switching element 93. A first input terminal (a minus input) of the operational amplifier 91 is connected to the output electrode layer 122 of the charge output element 10. A second input terminal (a plus input) of the operational amplifier 91 is earthed to the ground (the reference potential point). An output terminal of the operational amplifier 91 is connected to the external-force detection circuit 40. The capacitor 92 is connected between the first input terminal and the output terminal of the operational amplifier 91. The switching element 93 is connected between the first input terminal and the output terminal of the operational amplifier 91 and connected to the capacitor 92 in parallel. The switching element 93 is connected to a driving circuit (not shown in the figure). The switching element 93 executes a switching operation according to ON/OFF signals from the driving circuit.

When the switching element 93 is off, the charge Qx output from the charge output element 10 is stored in the capacitor 92 having capacitance C1 and output to the external-force detection circuit 40 as the voltage Vx. Subsequently, when the switching element 93 is turned on, both terminals of the capacitor 92 is short-circuited. As a result, the charge Qx stored in the capacitor 92 is discharged and decreases to 0 coulomb. The voltage V output to the external-force detection circuit 40 decreases to 0 volt. Turning on the switching element 93 is referred to as resetting the conversion output circuit 90c. Note that the voltage Vy output from an ideal conversion output circuit 90c is proportional to an accumulated amount of the charge Qx output from the charge output element 10.

The switching element 93 is, for example, a semiconductor switching element such as a MOSFET (Metal Oxide Semiconductor Field Effect Transistor) or a MEMS switch. Since such a switch is small and light compared with a mechanical switch, the switch is advantageous for a reduction in the size and a reduction in the weight of the force detecting device 1. A representative example is explained below in which the MOSFET is used as the switching element 93. Note that, as shown in FIG. 3, such a switch is mounted on the conversion output circuit 90c and the conversion output circuits 90a and 90b. Besides, the switch can also be mounted on an A/D converter 401.

The switching element 93 includes a drain electrode, a source electrode, and a gate electrode. One of the drain electrode and the source electrode of the switching element 93 is connected to the first input terminal of the operational amplifier 91. The other of the drain electrode and the source electrode is connected to the output terminal of the operational amplifier 91. A gate electrode of the switching element 93 is connected to a driving circuit (not shown in the figure).

The same driving circuit may be connected to the switching elements 93 of the conversion output circuits 90a, 90b, and 90c or different driving circuits may be respectively connected to the switching elements 93. ON/OFF signals all synchronizing with one another are input to the switching elements 93 from the driving circuit. Consequently, the operations of the switching elements 93 of the conversion output circuits 90a, 90b, and 90c synchronize with one another. That is, ON/OFF timings of the switching elements 93 of the conversion output circuits 90a, 90b, and 90c coincide with one another.

External-Force Detection Circuit

The external-force detection circuit 40 has a function of detecting an applied external force on the basis of the voltages Vy1 and Vy2 output from the conversion output circuits 90a, the voltages Vz1 and Vz2 output from the conversion output circuits 90b, and the voltages Vx1 and Vx2 output from the conversion output circuits 90c. The external-force detection circuit 40 includes the A/D converter 401 connected to the conversion output circuits (conversion circuits) 90a, 90b, and 90c and an arithmetic unit (an arithmetic circuit) 402 connected to the A/D converter 401.

The A/D converter 401 has a function of converting the voltages Vx1, Vy1, Vz1, Vx2, Vy2, and Vz2 from analog signals into digital signals. The voltages Vx1, Vy1, Vz1, Vx2, Vy2, and Vz2 converted into the digital signals by the A/D converter 401 are input to the arithmetic unit 402.

The arithmetic unit 402 applies, to the voltages Vx1, Vy1, Vz1, Vx2, Vy2, and Vz2 converted into the digital signals, kinds of processing such as correction for eliminating differences in sensitivities among the conversion output circuits 90a, 90b, and 90c. The arithmetic unit 402 outputs three signals proportional to accumulation amounts of the charges Qx1, Qy1, Qz1, Qx2, Qy2, and Qz2 output from the charge output element 10.

Force Detection in the α-Axis, β-Axis, and γ-Axis Directions (a Force Detecting Method)

As explained above, the charge output elements 10 are set such that the laminating direction LD and the sandwiching direction SD are parallel to the first base section 2 and orthogonal to the normal NL2 of the attachment surface 321 (see FIG. 1).

The inventors have found that a force FA in the α-axis direction, a force FB in the β-axis direction, and a force FC in the γ-axis direction can be respectively represented by Expressions (1), (2), and (3) below. In expressions (1) to (3), "fx1-1" represents a force applied in the x-axis direction of the first sensor 12 of the sensor device 6A, that is, a force calculated from the charge Qx1 (a first output). "fx1-2" represents a force applied in the x-axis direction of the third sensor 14, that is, a force calculated from the charge Qy1 (a second output). "fx2-1" represents a force applied in the x-axis direction of the first sensor 12 of the sensor device 6B, that is, a force calculated from the charge Qx2 (a third output). "fx2-2" represents a force applied in the x-axis direction of the third sensor 14, that is, a force calculated from the charge Qy2 (a fourth output).

$$FA = fx1\text{-}1 \cdot \cos \eta \cdot \cos \epsilon - fx1\text{-}2 \cdot \sin \eta \cdot \cos \epsilon - fx2\text{-}1 \cdot \cos \eta \cdot \cos \epsilon + fx2\text{-}2 \cdot \sin \eta \cdot \cos \epsilon \quad (1)$$

$$FB = -fx1\text{-}1 \cdot \cos \eta \cdot \sin \epsilon + fx1\text{-}2 \cdot \sin \eta \cdot \sin \epsilon - fx2\text{-}1 \cdot \cos \eta \cdot \sin \epsilon + fx2\text{-}2 \cdot \sin \eta \cdot \sin \epsilon \quad (2)$$

$$FC = -fx1\text{-}1 \cdot \sin \eta - fx1\text{-}2 \cdot \cos \eta - fx2\text{-}1 \cdot \sin \eta - fx2\text{-}2 \cdot \cos \eta \quad (3)$$

For example, in the case of the force detecting device 1 including the configuration shown in FIGS. 1 and 2, ϵ is 45° and η is 0°. When 45° is substituted in ϵ and 0° is substituted in η in Expressions (1) to (3), the forces FA to FC are respectively calculated as shown below.

$$FA = fx1\text{-}1/\sqrt{2} - fx2\text{-}1/\sqrt{2}$$

$$FB = -fx1\text{-}1/\sqrt{2} - fx2\text{-}1/\sqrt{2}$$

$$FC = -fx1\text{-}2 - fx2\text{-}2$$

In this way, when detecting the forces FA to FC, the force detecting device 1 can perform the detection without using the second sensor 13 (the charge Qz) that is easily affected by fluctuation in temperature, that is, on which noise is easily superimposed. Therefore, the force detecting device 1 is less easily affected by the fluctuation in temperature. For example, the influence of the fluctuation in temperature is reduced to 1/20 or less of that of the force detecting device in the past. Consequently, the force detecting device 1 can accurately stably detect the forces FA to FC even under an environment in which a temperature change is intense.

The total weight of the force detecting device 1 configured as explained above is smaller than 1 kg. Consequently, it is possible to reduce a load of the weight of the force detecting device 1 imposed on an attached part of the force detecting device 1, for example, a wrist of a robot. The capacity of an actuator that drives the wrist of the robot can be reduced. Therefore, it is possible to design the wrist of the robot small. Further, the weight of the force detecting device 1 is smaller than 20% of maximum weight that a robot arm can convey. Consequently, it is possible to facilitate control of the robot arm to which the weight of the force detecting device 1 is applied.

Second Embodiment

Figure 7:
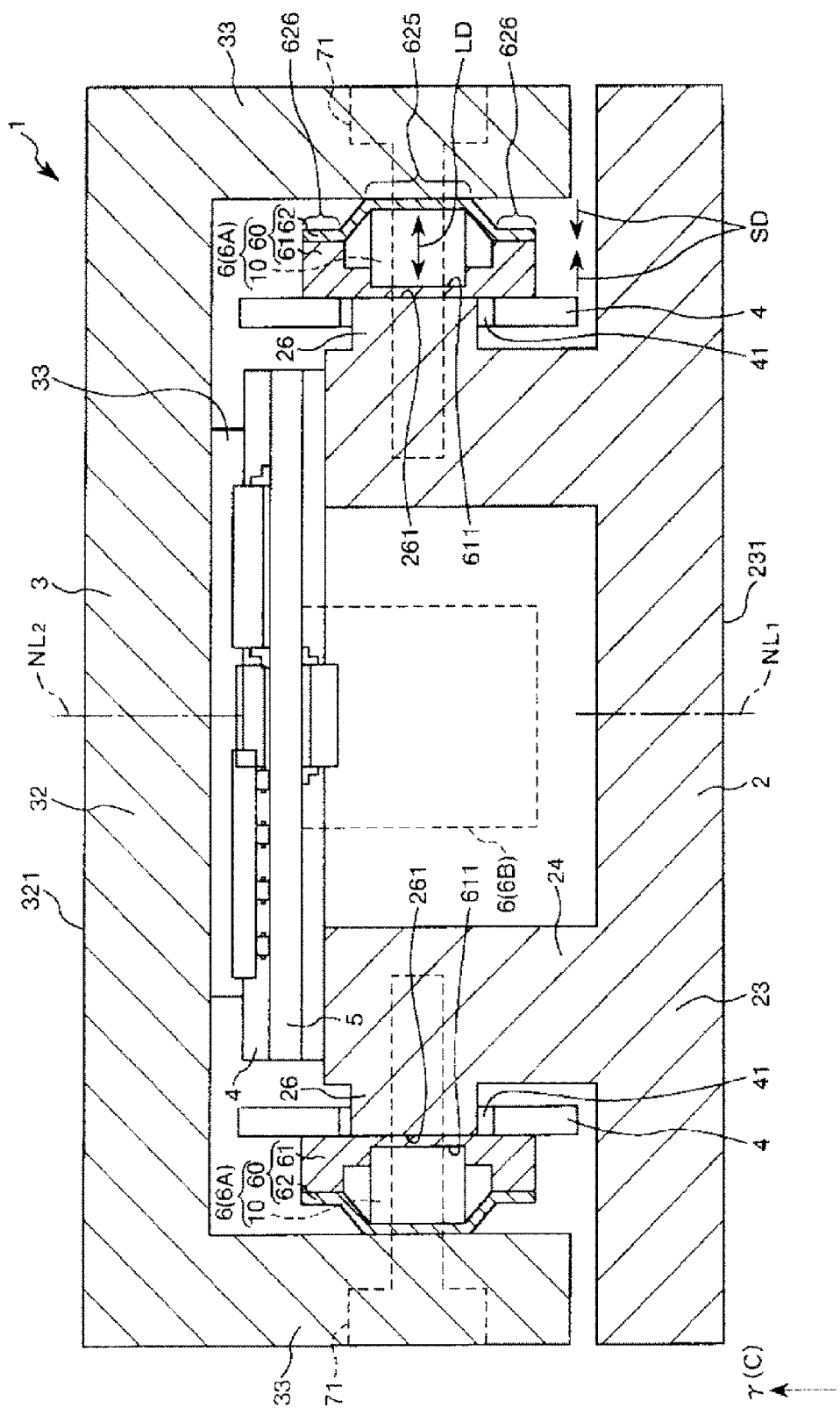
FIG. 7 is a sectional view showing a force detecting device according to a second embodiment of the invention.
Figure 8:
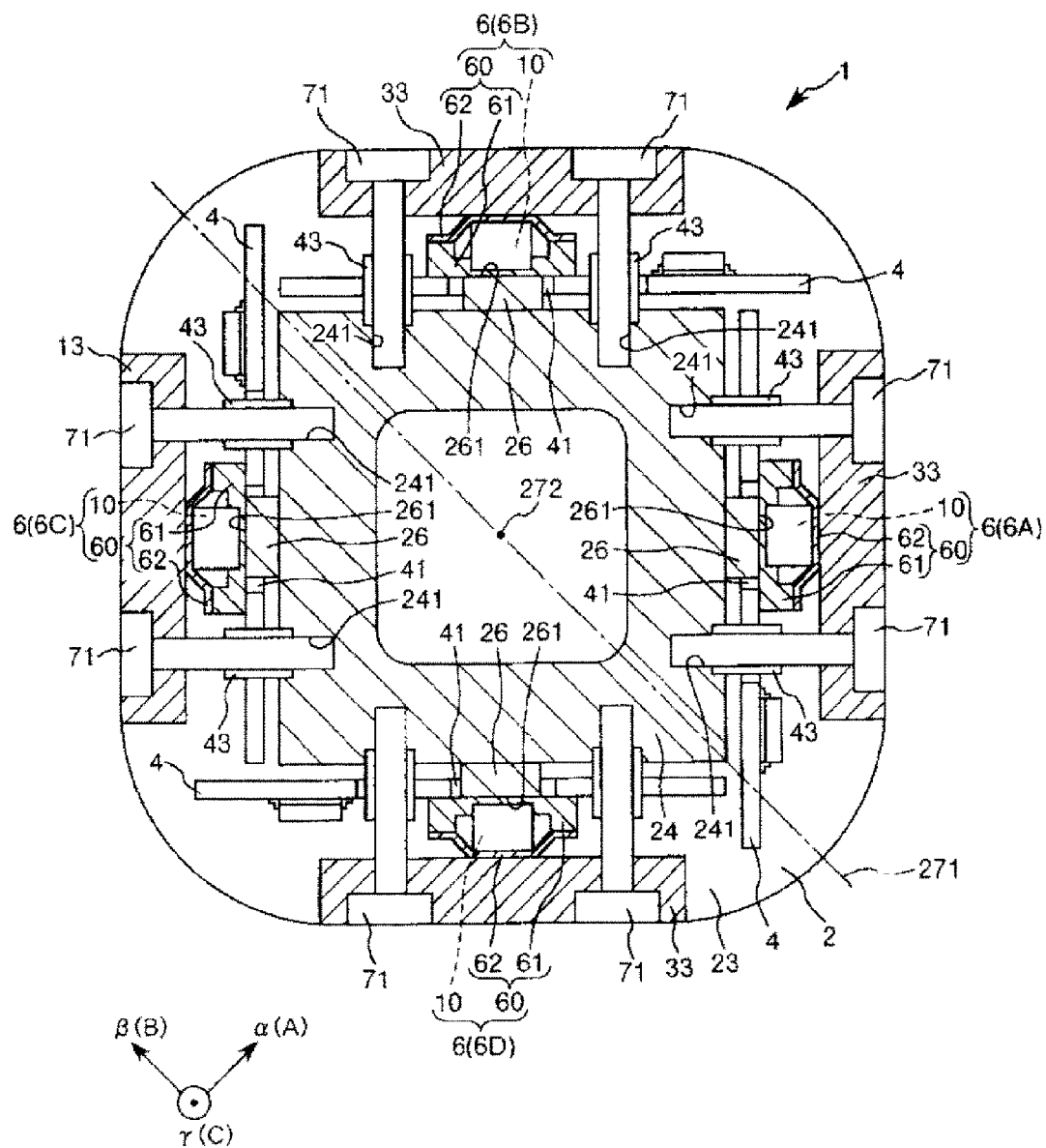
FIG. 8 is a plan view of the force detecting device shown in FIG. 7.
Figure 9:
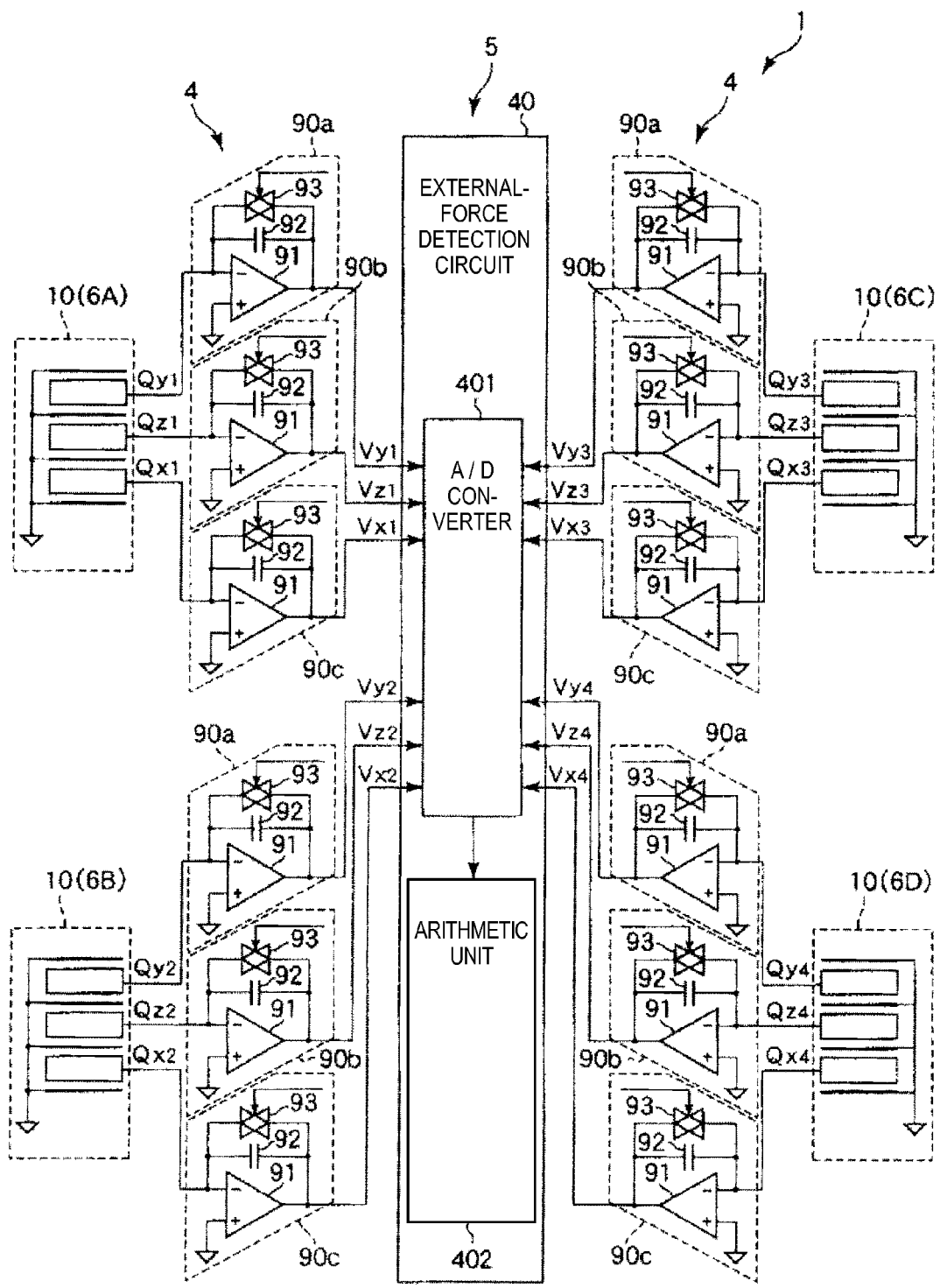
FIG. 9 is a circuit diagram schematically showing the force detecting device shown in FIG. 7.

FIG. 7 is a sectional view showing a force detecting device according to a second embodiment of the invention. FIG. 8 is a plan view of the force detecting device shown in FIG. 7. FIG. 9 is a circuit diagram schematically showing the force detecting device shown in FIG. 7.

A force detecting device, a robot, and an electronic component conveying apparatus according to the second embodiment of the invention are explained below with reference to the drawings. Differences from the first embodiment are mainly explained below. Explanation of similarities is omitted.

This embodiment is the same as the first embodiment except that the number of arranged sensor devices is different.

As shown in FIGS. 7 and 8, in this embodiment, four sensor devices 6 (charge output elements 10) are set. In the following explanation, the sensor devices 6 are referred to as "sensor device (first sensor element) 6A", "sensor device (second sensor element) 6B", "sensor device (third sensor element) 6C", and "sensor device (fourth sensor element) 6D" in counterclockwise order in FIG. 8.

As shown in FIG. 8, the sensor device 6A and the sensor device 6B are arranged symmetrically and the sensor device 6C and the sensor device 6D are arranged symmetrically with respect to a center axis 271 extending along the β axis of the first base section 2 (one base section). That is, the sensor devices 6A to 6D are arranged at equal angle intervals around a center 272 of the first base section 2. It is possible to uniformly detect an external force by arranging the sensor devices 6A to 6D in this way.

The sensor devices 6A to 6D are preferably arranged in positions separated from the center section (the center 272) of the first base section 2 as much as possible when viewed from the attachment surface 321. Consequently, it is possible to stably detect an external force.

External-Force Detection Circuit

The external-force detection circuit 40 has a function of detecting an applied external force on the basis of the voltages Vy1, Vy2, Vy3, and Vy4 output from the conversion output circuits 90a, the voltages Vz1, Vz2, Vz3, and Vz4 output from the conversion output circuits 90b, and the voltages Vx1, Vx2, Vx3, and Vx4 output from the conversion output circuits 90c. The external-force detection circuit 40 includes the A/D converter 401 connected to the conversion output circuits 90a, 90b, and 90c and the arithmetic unit 402 connected to the A/D converter 401.

The A/D converter 401 has a function of converting the voltages Vx1, Vy1, Vz1, Vx2, Vy2, Vz2, Vx3, Vy3, Vz3, Vx4, Vy4, and Vz4 from analog signals into digital signals. The voltages Vx1, Vy1, Vz1, Vx2, Vy2, Vz2, Vx3, Vy3, Vz3, Vx4, Vy4, and Vz4 converted into the digital signals by the A/D converter 401 are input to the arithmetic unit 402.

The forces FA to FC of the entire force detecting device 1 in this embodiment respectively change to resultant forces of the force FA to FC (ΣFA, ΣFB, and ΣFC) detected on the basis of charges output by the charge output elements 10 of the sensor devices 6A to 6D.

Third Embodiment

Figure 10:
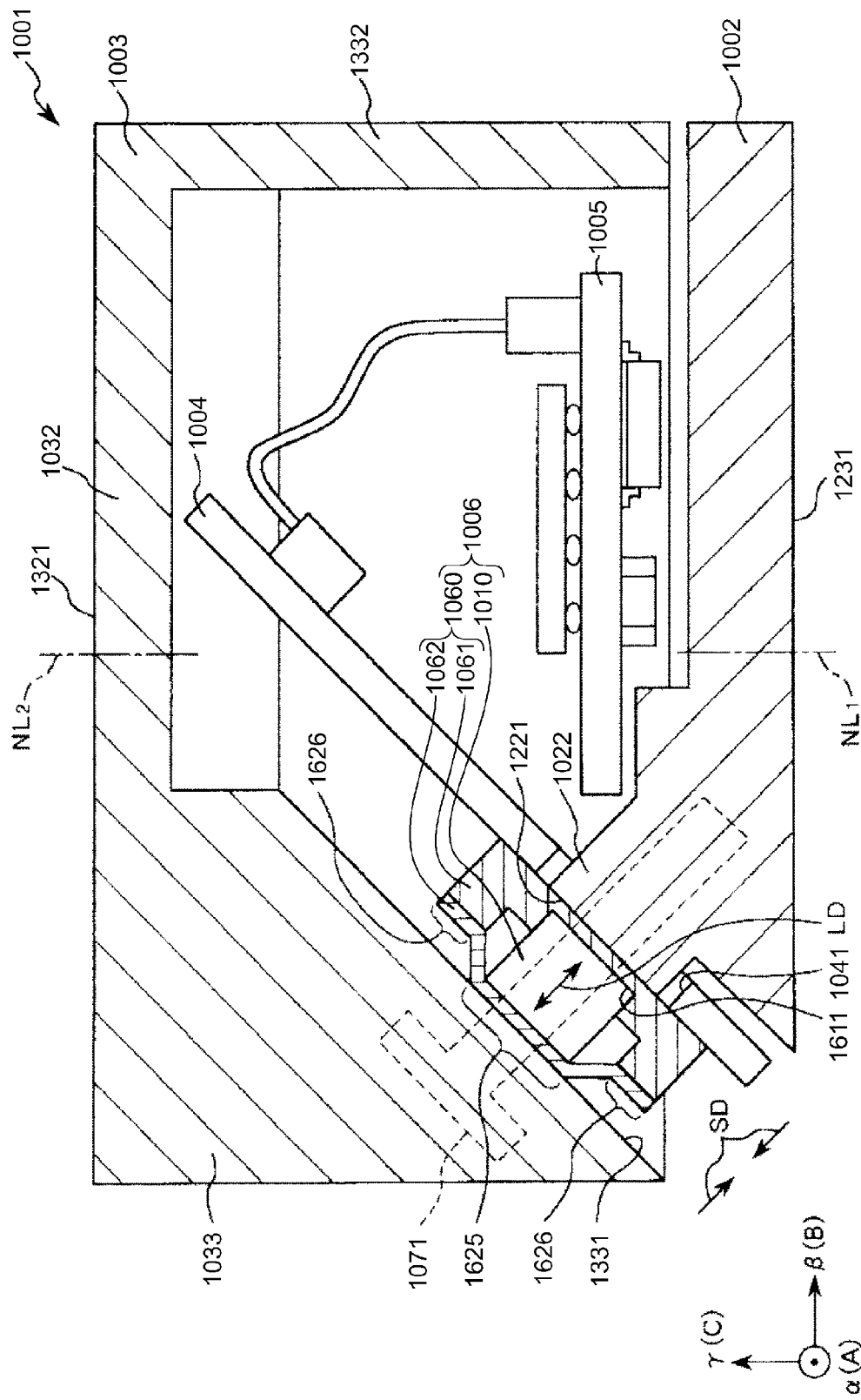
FIG. 10 is a sectional view showing a force detecting device according to a third embodiment of the invention.
Figure 11:
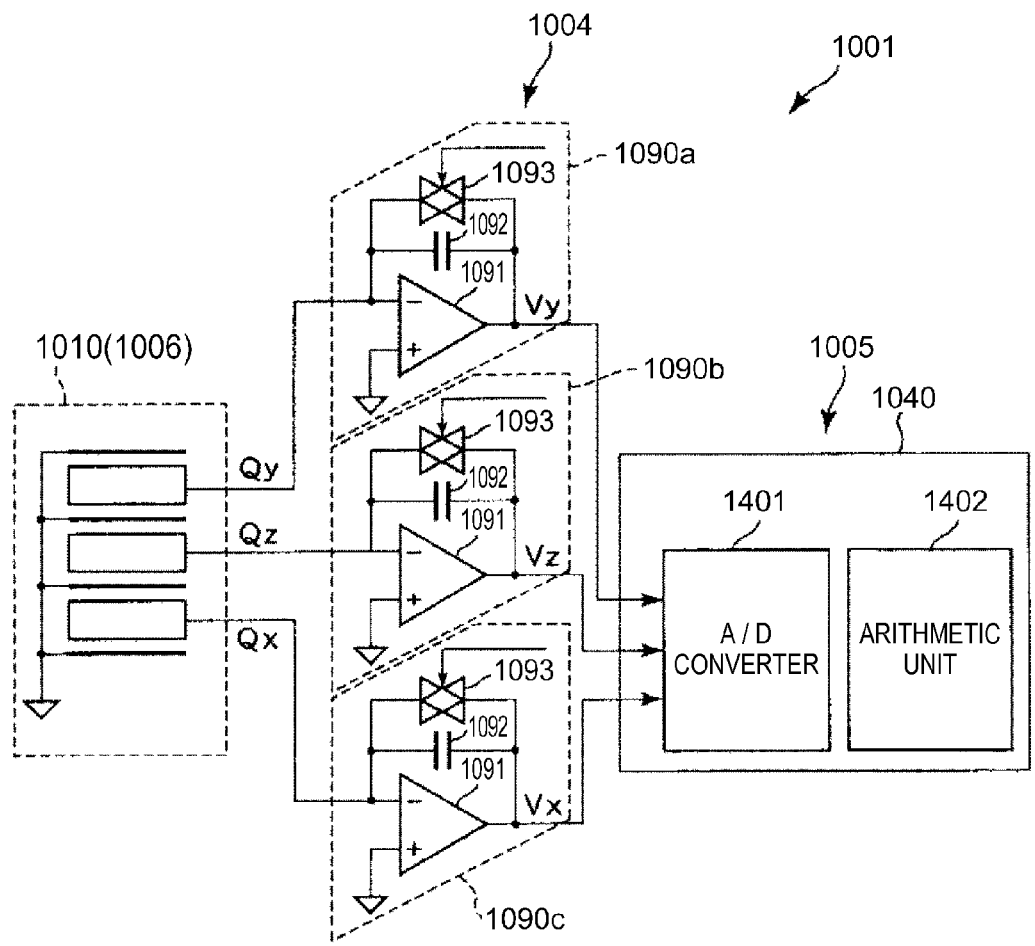
FIG. 11 is a circuit diagram schematically showing the force detecting device shown in FIG. 10.
Figure 12:
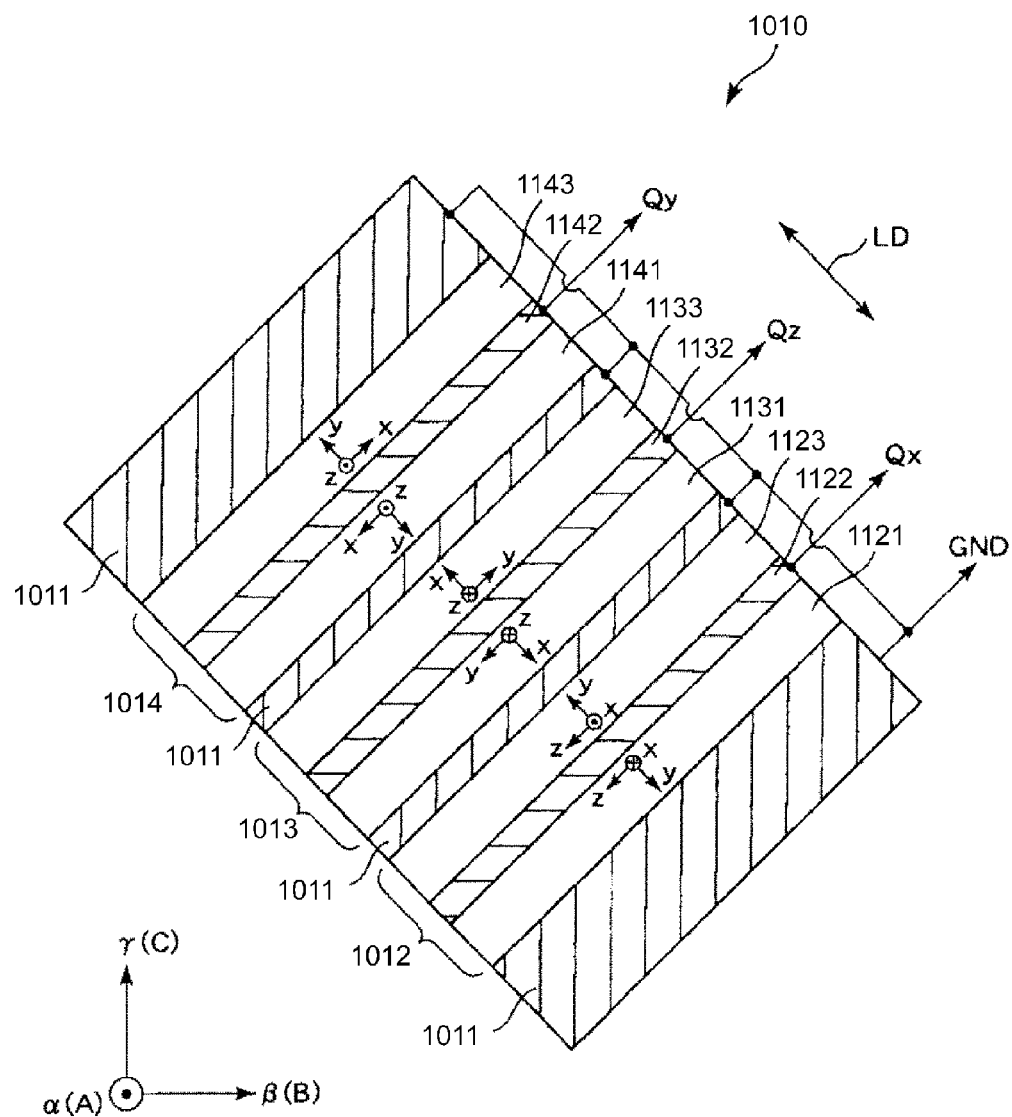
FIG. 12 is a sectional view schematically showing a charge output element of the force detecting device shown in FIG. 10.
Figure 13:
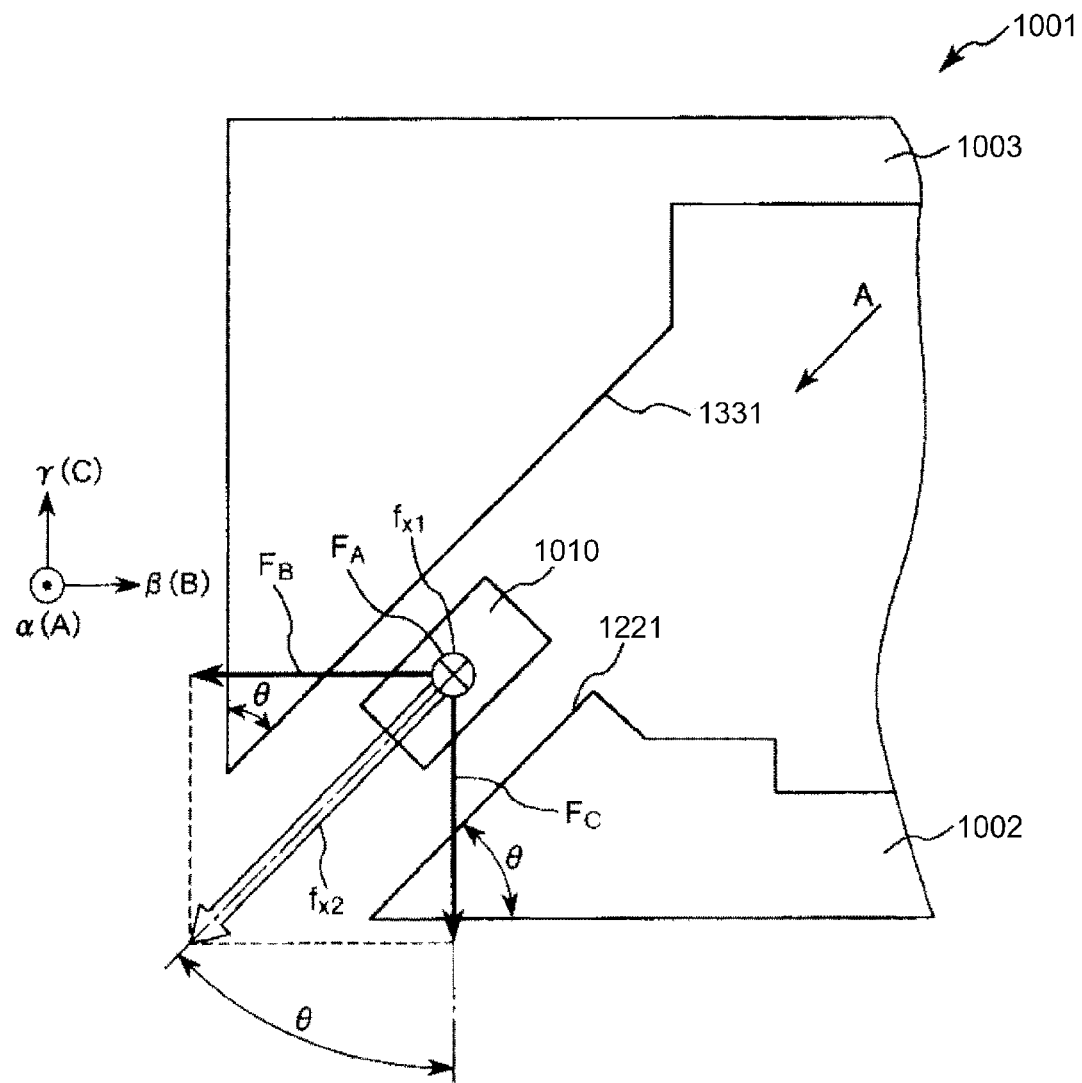
FIG. 13 is a schematic diagram showing an action state of a force detected by the charge output element of the force detecting device shown in FIG. 10.
Figure 14:
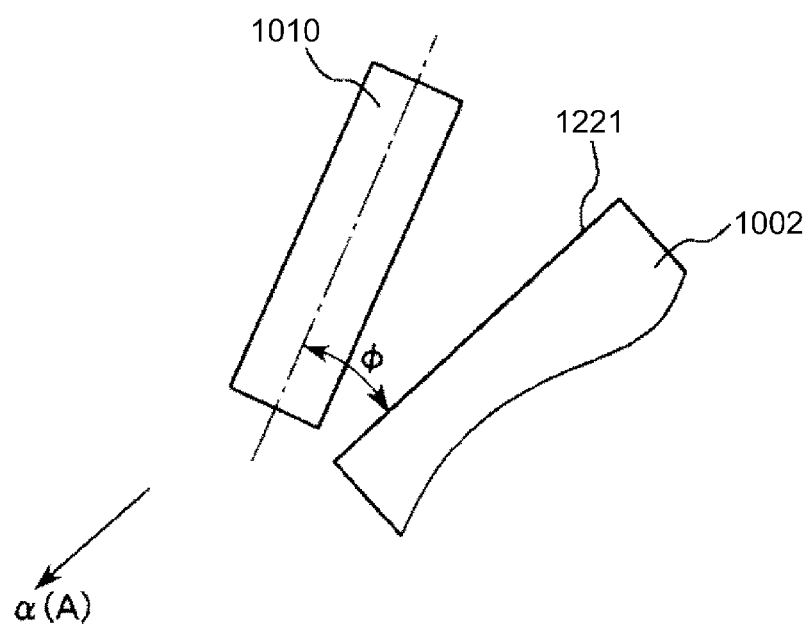
FIG. 14 is a diagram of the charge output element viewed from an arrow A direction in FIG. 13.

FIG. 10 is a sectional view showing a force detecting device according to a third embodiment of the invention. FIG. 11 is a circuit diagram schematically showing the force detecting device shown in FIG. 10. FIG. 12 is a sectional view schematically showing a charge output element of the force detecting device shown in FIG. 10. FIG. 13 is a schematic diagram showing an action state of a force detected by the charge output element of the force detecting device shown in FIG. 10. FIG. 14 is a diagram of the charge output element viewed from an arrow A direction in FIG. 13.

Note that, in the following explanation, for convenience of explanation, the upper side in FIG. 10 is referred to as "up" or "upward" and the lower side in the figure is referred to as "down" or "downward".

A force detecting device 1001 shown in FIG. 10 has a function of detecting an external force (including a moment), that is, a function of detecting external forces applied along three axes (an α (A) axis, a β (B) axis, and a γ (C) axis) orthogonal to one another. The α axis, the β axis, and the γ axis, which are orthogonal coordinate axes, are orthogonal coordinate axes in which the α axis and the β axis are included in a plane inclined and crossing the laminating direction LD.

The force detecting device 1001 includes a first base section 1002 functioning as a base plate, a second base section 1003 functioning as a cover plate arranged a predetermined space apart from the first base section 1002 to be opposed to the first base section 1002, an analog circuit board 1004 housed (provided) between the first base section 1002 and the second base section 1003, a digital circuit board 1005 housed (provided) between the first base section 1002 and the second base section 1003 and electrically connected to the analog circuit board 1004, a sensor devices 1006 mounted on the analog circuit board 1004 and including a charge output element 1010 functioning as a sensor element (a piezoelectric element) that outputs a signal according to an applied external force and a package 1060 that houses the charge output element 1010, and two pressurizing bolts (pressurizing screws) 1071 functioning as fixing members.

The external shape of the first base section 1002 is a tabular shape. The plane shape of the first base section 1002 is not particularly limited. However, examples of the plane shape include a circular shape and a polygonal shape. A projection 1022 having an inclined surface 1221 inclined at an inclination angle θ with respect to the lower surface of the first base section 1002 is formed to project at an edge of the first base section 1002. As shown in FIGS. 13 and 14, the inclined surface 1221 is parallel to the α axis. Note that the inclination angle θ satisfies 0°<θ<90°.

In this embodiment, when the force detecting device 1001 is fixed to, for example, a robot and used, the lower surface of the first base section 1002 functions as an attachment surface (a first attachment surface) 1231 for the robot (a measurement target).

It is preferable that the external shape of the second base section 1003 is also a tabular shape and the plane shape of the second base section 1003 is the same as the plane shape of the first base section 1002. In this case, the second base section 1003 has size enough for including the first base section 1002. The second base section 1003 includes a top plate 1032 and a sidewall 1033 formed at an edge of the top plate 1032 and projecting downward from the edge.

In this embodiment, when the force detecting device 1001 is fixed to, for example, a robot and used, the upper surface of the top plate 1032 functions as an attachment surface (a second attachment surface) 1321 for an end effector (a measurement target) attached to the robot. Note that the attachment surface 1321 and the attachment surface 1231 of the first base section 1002 are parallel to each other in a natural state in which an external force is not applied thereto.

In a portion of the sidewall 1033 opposed to the inclined surface 1221 of the first base section 1002, an inclined surface 1331 parallel to the inclined surface 1221, that is, inclined at the inclination angle θ is formed. The sensor device 1006 is sandwiched between the inclined surface 1221 of the first base section 1002 and the inclined surface 1331 of the second base section 1003. That is, the charge output element 1010 is sandwiched and pressurized by the inclined surface 1221 of the first base section 1002 and the inclined surface 1331 of the second base section 1003 via the package 1060. The sandwiched charge output element 1010 is inclined at the inclination angle θ with respect to the first base section 1002. In the following explanation, a direction in which the charge output element 1010 is sandwiched is referred to as "sandwiching direction SD".

Note that any one of the first base section 1002 and the second base section 1003 may be set as a board on a side to which a force is applied. However, in this embodiment, the second base section 1003 is explained as the board on the side to which a force is applied. The charge output element 1010 may be arranged on a surface of the analog circuit board 1004 on the first base section 1002 side.

As shown in FIG. 14, when an angle formed by the x axis of a first sensor 1012 and the inclined surface 1221 (the α axis) of the first base section 1002 is represented as φ, the charge output element 1010 are allowed to tilt to a decree in which the angle φ satisfies 0°≤φ<90°.

A portion on the opposite side of the inclined surface 1331 via the center section of the sidewall 1033 is a fixed section 1332 coupled and fixed to the second base section 1003.

As shown in FIG. 11, the analog circuit board 1004 includes a conversion output circuit 1090c that converts the charge Qx output from the charge output element 1010 of the mounted sensor device 1006 into the voltage Vx, a conversion output circuit 1090b that converts the charge Qz output from the charge output element 1010 into the voltage Vz, and a conversion output circuit 1090a that converts the charge Qy output from the charge output element 1010 into the voltage Vy. The digital circuit board 1005 includes an external force detection circuit 1040 that detects an applied external force. The analog circuit board 1004 and the digital circuit board 1005 are respectively supported in different positions of the first base section 1002 and are protected between the first base section 1002 and the second base section 1003.

Note that constituent materials of parts other than elements and wires of the first base section 1002, the second base section 1003, and the analog circuit board 1004 and parts other than elements and wires of the digital circuit board 1005 are not particularly limited. For example, various resin materials, various metal materials, and the like can be used.

The first base section 1002 and the second base section 1003 are respectively formed by members, the external shapes of which are tabular shapes. However, the external shapes of the first base section 1002 and the second base section 1003 are not limited to this. For example, one base section may be formed by a member formed in a tabular shape and the other base section may be formed by a member formed in a block shape.

Charge Output Element

As explained above, the force detecting device 1001 has a function of detecting external forces applied along the α axis, the β axis, and the γ axis orthogonal to one another. The α axis and the β axis are axes extending along orthogonal two directions in planes of the first base section 1002 and the second base section 1003. The γ axis is an axis extending along one direction orthogonal to the α axis and the β axis, that is, an axis extending along the thickness direction of the first base section 1002 and the second base section 1003. In the force detecting device 1001, the charge output element 1010 is incorporated as a charge output element that detects the external forces.

As shown in FIG. 12, the charge output element 1010 can output the charges Qx, Qy, and Qz. External forces applied (received) along the α axis, the β axis, and the γ axis are detected on the basis of the output charges.

Note that the charge output element 1010 can output the charge Qz. However, as explained below, the force detecting device 1001 does not use the charge Qz when calculating external forces. The output charge Qz is used for, for example, adjustment of pressurization by the pressurizing bolts (the pressurizing screws) 1071.

A reason why the charge Qz is not used during the external force detection is explained with reference to an example in which the force detecting device 1001 is used in an industrial robot including an arm attached with an end effector. In this case, the first base section 1002 or the second base section 1003 is heated, thermally expanded, and deformed by heat transfer from heat generation sources such as motors provided in the arm and the end effector. According to the deformation, pressurization to the charge output element 1010 changes from a predetermined value. The change in the pressurization to the charge output element 1010 is included as a noise component due to the temperature change of the force detecting device 1001 to such a degree as to considerably affect the charge Qz.

The shape of the charge output element 1010 is not particularly limited. However, in this embodiment, the charge output element 1010 is formed in a square shape when viewed from a direction perpendicular to the inclined surface 1221 of the first base section 1002. Note that examples of other external shapes of the charge output element 1010 include other polygonal shapes such as a pentagonal shape, a circular shape, and an elliptical shape.

As shown in FIG. 12, the charge output element 1010 includes four ground electrode layers 1011 earthed to the ground (a reference potential point), a first sensor 1012 that outputs the charge Qx according to an external force (a shearing force), a second sensor 1013 that outputs the charge Qz according to an external force (a compressive/tensile force), and a third sensor 1014 that outputs the charge Qy according to an external force (a shearing force). The ground electrode layers 1011 and the sensors 1012, 1013, and 1014 are alternately laminated in parallel. A direction in which the ground electrode layers 1011 and the sensors 1012, 1013, and 1014 are laminated is hereinafter referred to as "laminating direction LD". The laminating direction LD is a direction different from the normal NL2 of the attachment surface 1321 (or the normal NL1 of the attachment surface 1231).

Specifically, the charge output element 1010 is inclined at the inclination angle θ with respect to the first base section 1002 parallel to the attachment surface 1321. As a result, the charge output element 1010 is inclined at the inclination angle θ in both of the laminating direction LD and the sandwiching direction SD.

In the configuration shown in the figure, the first sensor 1012, the second sensor 1013, and the third sensor 1014 are laminated in this order from the lower right side in FIG. 12. However, the invention is not limited to this. The laminating order of the sensors 1012, 1013, and 1014 may be any order.

The ground electrode layers 1011 are electrodes earthed to the ground (a reference potential point). A material forming the ground electrode layers 1011 is not particularly limited. However, for example, gold, titanium, aluminum, copper, iron, or alloys including these kinds of metal are preferable. Among these materials, in particular, it is preferable to use stainless steel, which is an iron alloy. The ground electrode layers 1011 formed of the stainless steel have excellent durability and corrosion resistance.

The first sensor 1012 has a function of outputting the charge Qx according to an external force (a shearing force) applied in the first detection direction, which is a direction orthogonal to the laminating direction LD, that is, inclined with respect to the direction of the normal NL2 (the normal NL1). That is, the first sensor 1012 is configured to output positive charges or negative charges according to the external force.

The first sensor 1012 includes a first piezoelectric layer 1121, a second piezoelectric layer 1123 provided to be opposed to the first piezoelectric layer 1121, and an output electrode layer 1122 provided between the first piezoelectric layer 1121 and the second piezoelectric layer 1123.

The first piezoelectric layer 1121 is formed by a Y-cut quartz plate and includes an x axis, a y axis, and a z axis, which are crystal axes orthogonal to one another. The y axis is an axis extending along the thickness direction of the first piezoelectric layer 1121. The x axis is an axis extending along the paper surface depth direction in FIG. 12. The z axis is an axis extending along an oblique direction in FIG. 12. In the configuration shown in FIG. 12, in the following explanation, concerning the x axis, the paper surface depth side in FIG. 12 is a positive direction and the opposite side of the paper surface depth side is a negative direction. Concerning the y axis, the lower right side in FIG. 12 is a positive direction and the opposite side of the lower right side is a negative direction. Concerning the z axis, the lower left side in FIG. 12 is a positive direction and the opposite side of the lower left side is a negative direction.

The first piezoelectric layer 1121 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force (a shearing force) along the positive direction of the x axis is applied to the surface of the first piezoelectric layer 1121, charges are induced in the first piezoelectric layer 1121 by the piezoelectric effect. As a result, positive charges concentrate near the surface of the first piezoelectric layer 1121 on the output electrode layer 1122 side. Negative charges concentrate near the surface of the first piezoelectric layer 1121 on the ground electrode layer 1011 side. Similarly, when an external force along the negative direction of the x axis is applied to the surface of the first piezoelectric layer 1121, negative charges concentrate near the surface of the first piezoelectric layer 1121 on the output electrode layer 1122 side. Positive charges concentrate near the surface of the first piezoelectric layer 1121 on the ground electrode layer 1011 side.

The second piezoelectric layer 1123 is also formed by a Y-cut quartz plate and includes an x axis, a y axis, and a z axis, which are crystal axes orthogonal to one another. The y axis is an axis extending along the thickness direction of the second piezoelectric layer 1123. The x axis is an axis extending along the paper surface depth direction in FIG. 12. The z axis is an axis extending along an oblique direction in FIG. 12. In the configuration shown in FIG. 12, in the following explanation, concerning the x axis, the paper surface front side in FIG. 12 is a positive direction and the opposite side of the paper surface front side is a negative direction. Concerning the y axis, the upper left side in FIG. 12 is a positive direction and the opposite side of the upper left side is a negative direction. Concerning the z axis, the lower left side in FIG. 12 is a positive direction and the opposite side of the lower left side is a negative direction.

Like the first piezoelectric layer 1121, the second piezoelectric layer 1123 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force (a shearing force) along the positive direction of the x axis is applied to the surface of the second piezoelectric layer 1123, charges are induced in the second piezoelectric layer 1123 by the piezoelectric effect. As a result, positive charges concentrate near the surface of the second piezoelectric layer 1123 on the output electrode layer 1122 side. Negative charges concentrate near the surface of the second piezoelectric layer 1123 on the ground electrode layer 1011 side. Similarly, when an external force along the negative direction of the x axis is applied to the surface of the second piezoelectric layer 1123, negative charges concentrate near the surface of the second piezoelectric layer 1123 on the output electrode layer 1122 side. Positive charges concentrate near the surface of the second piezoelectric layer 1123 on the ground electrode layer 1011 side.

The first sensor 1012 includes the first piezoelectric layer 1121 and the second piezoelectric layer 1123. Consequently, compared with when the first sensor 1012 is formed by only one of the first piezoelectric layer 1121 and the second piezoelectric layer 1123 and the output electrode layer 1122, it is possible to increase the positive charges or the negative charges concentrating near the output electrode layer 1122. As a result, it is possible to increase the charge Qx output from the output electrode layer 1122.

The output electrode layer 1122 has a function of outputting, as the charge Qx, positive charges or negative charges generated in the first piezoelectric layer 1121 and the second piezoelectric layer 1123. As explained above, when an external force along the positive direction of the x axis is applied to the surface of the first piezoelectric layer 1121 or the surface of the second piezoelectric layer 1123, the positive charges concentrate near the output electrode layer 1122. As a result, a positive charge Qx is output from the output electrode layer 1122. On the other hand, when an external force along the negative direction of the x axis is applied to the surface of the first piezoelectric layer 1121 or the surface of the second piezoelectric layer 1123, the negative charges concentrate near the output electrode layer 1122. As a result, a negative charge Qx is output from the output electrode layer 1122.

The size of the output electrode layer 1122 in plan view is preferably equal to or larger than the size of the first piezoelectric layer 1121 and the second piezoelectric layer 1123 in plan view. When the output electrode layer 1122 is smaller than the first piezoelectric layer 1121 or the second piezoelectric layer 1123, a part of the first piezoelectric layer 1121 or the second piezoelectric layer 1123 is not in contact with the output electrode layer 1122. Therefore, a part of charges generated in the first piezoelectric layer 1121 or the second piezoelectric layer 1123 sometimes cannot be output from the output electrode layer 1122. As a result, the charge Qx output from the output electrode layer 1122 decreases. Note that the same applies to output electrode layers 1132 and 1142 explained below.

The second sensor 1013 has a function of outputting the charge Qz according to an external force (a compressive/tensile force). That is, the second sensor 1013 is configured to output positive charges according to a compressive force and output negative charges according to a tensile force.

The second sensor 1013 includes a third piezoelectric layer 1131, a fourth piezoelectric layer 1133 provided to be opposed to the third piezoelectric layer 1131, and an output electrode layer 1132 provided between the third piezoelectric layer 1131 and the fourth piezoelectric layer 1133.

The third piezoelectric layer 1131 is formed by an X-cut quartz plate and has an x axis, a y axis, and a z axis orthogonal to one another. The x axis is an axis extending along the thickness direction of the third piezoelectric layer 1131. The y axis is an axis extending along an oblique direction in FIG. 12. The z axis is an axis extending along the paper surface depth direction in FIG. 12.

When a compressive force parallel to the x axis is applied to the surface of the third piezoelectric layer 1131, charges are induced in the third piezoelectric layer 1131 by the piezoelectric effect. As a result, positive charges concentrate near the surface of the third piezoelectric layer 1131 on the output electrode layer 1132 side. Negative charges concentrate near the surface of the third piezoelectric layer 1131 on the ground electrode layer 1011 side. Similarly, when a tensile force parallel to the x axis is applied to the surface of the third piezoelectric layer 1131, negative charges concentrate near the surface of the third piezoelectric layer 1131 on the output electrode layer 1132 side. Positive charges concentrate near the surface of the third piezoelectric layer 1131 on the ground electrode layer 1011 side.

The fourth piezoelectric layer 1133 is also formed by an X-cut quartz plate and has an x axis, a y axis, and a z axis orthogonal to one another. The x axis is an axis extending along the thickness direction of the fourth piezoelectric layer 1133. The y axis is an axis extending along an oblique direction in FIG. 12. The z axis is an axis extending along the paper surface depth direction in FIG. 12.

When a compressive force parallel to the x axis is applied to the surface of the fourth piezoelectric layer 1133, charges are induced in the fourth piezoelectric layer 1133 by the piezoelectric effect. As a result, positive charges concentrate near the surface of the fourth piezoelectric layer 1133 on the output electrode layer 1132 side. Negative charges concentrate near the surface of the fourth piezoelectric layer 1133 on the ground electrode layer 1011 side. Similarly, when a tensile force parallel to the x axis is applied to the surface of the fourth piezoelectric layer 1133, negative charges concentrate near the surface of the fourth piezoelectric layer 1133 on the output electrode layer 1132 side. Positive charges concentrate near the surface of the fourth piezoelectric layer 1133 on the ground electrode layer 1011 side.

The output electrode layer 1132 has a function of outputting, as the charge Qz, positive charges or negative charges generated in the third piezoelectric layer 1131 and the fourth piezoelectric layer 1133. As explained above, when a compressive force parallel to the x axis is applied to the surface of the third piezoelectric layer 1131 or the surface of the fourth piezoelectric layer 1133, the positive charges concentrate near the output electrode layer 1132. As a result, a positive charge Qz is output from the output electrode layer 1132. On the other hand, when a tensile force parallel to the x axis is applied to the surface of the third piezoelectric layer 1131 or the surface of the fourth piezoelectric layer 1133, the negative charges concentrate near the output electrode layer 1132. As a result, a negative charge Qz is output from the output electrode layer 1132.

The third sensor 1014 has a function of outputting the charge Qx according to an external force (a shearing force) in the second detection direction orthogonal to the laminating direction LD and crossing the first detection direction of the external force acting when the first sensor 1012 outputs the charge Qx. That is, the third sensor 1014 is configured to output positive charges or negative charges according to the external force.

The third sensor 1014 includes a fifth piezoelectric layer 1141, a sixth piezoelectric layer 1143 provided to be opposed to the fifth piezoelectric layer 1141, and an output electrode layer 1142 provided between the fifth piezoelectric layer 1141 and the sixth piezoelectric layer 1143.

The fifth piezoelectric layer 1141 is formed by a Y-cut quartz plate and has an x axis, a y axis, and a z axis, which are crystal axes orthogonal to one another. The y axis is an axis extending along the thickness direction of the fifth piezoelectric layer 1141. The x axis is an axis extending along an oblique direction in FIG. 12. The z axis is an axis extending along the paper surface depth direction in FIG. 12. In the configuration shown in FIG. 12, in the following explanation, concerning the x axis, the paper surface lower left side in FIG. 12 is a positive direction and the opposite side of the paper surface lower left side is a negative direction. Concerning the y axis, the lower left side in FIG. 12 is a positive direction and the opposite side of the lower left side is a negative direction. Concerning the z axis, the paper surface front side in FIG. 12 is a positive direction and the opposite side of the paper surface front side is a negative direction.

The fifth piezoelectric layer 1141 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force along the positive direction of the x axis is applied to the surface of the fifth piezoelectric layer 1141, charges are induced in the fifth piezoelectric layer 1141 by the piezoelectric effect. As a result, positive charges concentrate near the surface of the fifth piezoelectric layer 1141 on the output electrode layer 1142 side. Negative charges concentrate near the surface of the fifth piezoelectric layer 1141 on the ground electrode layer 1011 side. Similarly, when an external force along a negative direction of the x axis is applied to the surface of the fifth piezoelectric layer 1141, negative charges concentrate near the surface of the fifth piezoelectric layer 1141 on the output electrode layer 1142 side. Positive charges concentrate near the surface of the fifth piezoelectric layer 1141 on the ground electrode layer 1011 side.

The sixth piezoelectric layer 1143 is also formed by a Y-cut quartz plate and has an x axis, a y axis, and a z axis, which are crystal axes orthogonal to one another. The y axis is an axis extending along the thickness direction of the sixth piezoelectric layer 1143. The x axis is an axis extending along an oblique direction in FIG. 12. The z axis is an axis extending along the paper surface depth direction in FIG. 12. In the configuration shown in FIG. 12, in the following explanation, concerning the x axis, the paper surface upper left side in FIG. 12 is a positive direction and the opposite side of the paper surface upper left side is a negative direction. Concerning the y axis, the upper left side in FIG. 12 is a positive direction and the opposite side of the upper left side is a negative direction. Concerning the z axis, the paper surface front side in FIG. 12 is a positive direction and the opposite side of the paper surface front side is a negative direction.

Like the fifth piezoelectric layer 1141, the sixth piezoelectric layer 1143 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force along a positive direction of the x axis is applied to the surface of the sixth piezoelectric layer 1143, charges are induced in the sixth piezoelectric layer 1143 by the piezoelectric effect. As a result, positive charges concentrate near the surface of the sixth piezoelectric layer 1143 on the output electrode layer 1142 side. Negative charges concentrate near the surface of the sixth piezoelectric layer 1143 on the ground electrode layer 1011 side. Similarly, when an external force along a negative direction of the x axis is applied to the surface of the sixth piezoelectric layer 1143, negative charges concentrate near the surface of the sixth piezoelectric layer 1143 on the output electrode layer 1142 side. Positive charges concentrate near the surface of the sixth piezoelectric layer 1143 on the ground electrode layer 1011 side.

In the charge output element 1010, in plan view from the laminating direction LD, the x axes of the first piezoelectric layer 1121 and the second piezoelectric layer 1123 and the x axes of the fifth piezoelectric layer 1141 and the sixth piezoelectric layer 1143 cross each other. In plan view from the laminating direction LD, the z axes of the first piezoelectric layer 1121 and the second piezoelectric layer 1123 and the z axes of the fifth piezoelectric layer 1141 and the sixth piezoelectric layer 1143 cross each other.

The output electrode layer 1142 has a function of outputting, as the charge Qy, positive charges or negative charges generated in the fifth piezoelectric layer 1141 and the sixth piezoelectric layer 1143. As explained above, when an external force along the positive direction of the x axis is applied to the surface of the fifth piezoelectric layer 1141 or the surface of the sixth piezoelectric layer 1143, the positive charges concentrate near the output electrode layer 1142. As a result, a positive charge Qy is output from the output electrode layer 1142. On the other hand, when an external force along the negative direction of the x axis is applied to the surface of the fifth piezoelectric layer 1141 or the surface of the sixth piezoelectric layer 1143, the negative charges concentrate near the output electrode layer 1142. As a result, a negative charge Qy is output from the output electrode layer 1142.

As explained above, in the charge output element 1010, the first sensor 1012, the second sensor 1013, and the third sensor 1014 are laminated such that force detecting directions of the sensors are orthogonal to one another. Consequently, the sensors can respectively induce charges according to force components orthogonal to one another. Therefore, the charge output element 1010 can output the three charges Qx, Qy, and Qz according to the respective external forces along the x axis, the y axis, and the z axis.

As shown in FIG. 10, the first base section 1002 and the second base section 1003 are connected and fixed by the pressurizing bolts 1071. There are two pressurizing bolts 1071. One is arranged further on the paper surface depth side in FIG. 10 than the sensor device 1006 and indicated by a broken line. The other is arranged further on the paper surface front side in FIG. 10 than the sensor device 1006. Note that the "fixing" by the pressurizing bolts 1071 is performed while allowing a predetermined amount of mutual movements of the two fixing targets. Specifically, the first base section 1002 and the second base section 1003 are fixed by the two pressurizing bolts 1071 while being allowed to move in the surface direction of the second base section 1003 by a predetermined amount each other. Note that the same applies to the other embodiments.

In the configuration shown in FIG. 10, female screws (not shown in the figure) screwing with the pressurizing bolts 1071 are provided on the inclined surface 1221 of the first base section 1002. In a state in which the sensor devices 1006 are sandwiched between the first base section 1002 and the second base section 1003, the pressurizing bolts 1071 are inserted into the female screws of the first base section 1002 from the second base section 1003 side. Consequently, pressure, that is, pressurization, of predetermined magnitude is applied to the charge output element 1010 together with the package 1060, which houses the charge output element 1010. When a shearing force acts on the charge output element 1010, a frictional force surely occurs between the layers forming the charge output element 1010. Therefore, it is possible to surely detect charges.

Note that a constituent material of the pressurizing bolts 1071 is not particularly limited. For example, various resin materials, various metal materials, and the like can be used.

Sensor Device

The sensor device 1006 includes the charge output element 1010 and the package 1060 that houses the charge output element 1010.

As shown in FIG. 10, the package 1060 includes a base section (a first member) 1061 including a recess 1611 and a lid body (a second member) 1062 joined to the base section 1061. The charge output element 1010 is set in the recess 1611 of the base section 1061. The recess 1611 of the base section 1061 is sealed by the lid body 1062. Consequently, it is possible to protect the charge output element 1010 and provide the force detecting device 1001 having high reliability. Note that the upper surface of the charge output element 1010 is in contact with the lid body 1062. The lid body 1062 of the package 1060 is arranged on the upper side, that is, the second base section 1003 side. The base section 1061 is arranged on the lower side, that is, the first base section 1002 side. The base section 1061 is fixed to the analog circuit board 1004. With this configuration, the base section 1061 and the lid body 1062 are sandwiched and pressurized in the sandwiching direction SD by the inclined surface 1221 of the first base section 1002 and the inclined surface 1331 of the second base section 1003. Further, the charge output element 1010 is also sandwiched and pressurized in the sandwiching direction SD by the base section 1061 and the lid body 1062.

A constituent material of the base section 1061 is not particularly limited. For example, an insulative material such as ceramics can be used. A constituent material of the lid body 1062 is not particularly limited. For example, various metal materials such as stainless steel can be used. Note that the constituent material of the base section 1061 and the constituent material of the lid body 1062 may be the same or may be different.

The shape of the package 1060 is not particularly limited. However, in this embodiment, the package 1060 is formed in a square plane shape. Examples of other shapes of the package 1060 include polygonal shapes such as a pentagonal shape, a circular shape, and an elliptical shape. When the shape of the package 1060 is a polygonal shape, for example, corners of the polygonal shape may be rounded or may be obliquely cut out.

In this embodiment, the lid body 1062 is formed in a tabular shape. A part between a center section 1625 and an outer circumference section 1626 of the lid body 1062 is bent, whereby the center section 1625 projects toward the second base section 1003. The shape of the center section 1625 is not particularly limited. However, in this embodiment, the center section 1625 is formed in a shape same as the shape of the charge output element 1010, that is, a square shape. Note that both of the upper surface and the lower surface of the center section 1625 of the lid body 1062 are planes.

A plurality of terminals (not shown in the figure) electrically connected to the charge output element 1010 are provided at the end of the lower surface of the base section 1061 of the package 1060. The terminals are respectively electrically connected to the analog circuit board 1004. Consequently, the charge output element 1010 and the analog circuit board 1004 are electrically connected.

Note that, in a part of the analog circuit board 1004 where the charge output element 1010 is arranged, a hole 1041 into which the projection 1022 is inserted is formed. The hole 1041 is a hole piercing through the analog circuit board 1004.

Conversion Output Circuits

As shown in FIG. 11, the conversion output circuits 1090a, 1090b, and 1090c are connected to the charge output elements 1010. The conversion output circuit 1090a has a function of converting the charge Qy output from the charge output element 1010 into the voltage Vy. The conversion output circuit 1090b has a function of converting the charge Qz output from the charge output element 1010 into the voltage Vz. The conversion output circuit 1090c has a function of converting the charge Qx output from the charge output element 1010 into the voltage Vx. The conversion output circuits 1090a, 1090b, and 1090c are the same. Therefore, the conversion output circuit 1090c is representatively explained below.

The conversion output circuit 1090c has a function of converting the charge Qx output from the charge output element 1010 into the voltage Vx and outputting the voltage Vx. The conversion output circuit 1090c includes an operational amplifier 1091, a capacitor 1092, and a switching element 1093. A first input terminal (a minus input) of the operational amplifier 1091 is connected to the output electrode layer 1122 of the charge output element 1010. A second input terminal (a plus input) of the operational amplifier 1091 is earthed to the ground (the reference potential point). An output terminal of the operational amplifier 1091 is connected to the external-force detection circuit 1040. The capacitor 1092 is connected between the first input terminal and the output terminal of the operational amplifier 1091. The switching element 1093 is connected between the first input terminal and the output terminal of the operational amplifier 1091 and connected to the capacitor 1092 in parallel. The switching element 1093 is connected to a driving circuit (not shown in the figure). The switching element 1093 executes a switching operation according to ON/OFF signals from the driving circuit.

When the switching element 1093 is off, the charge Qx output from the charge output element 1010 is stored in the capacitor 1092 having capacitance C1 and output to the external-force detection circuit 1040 as the voltage Vx. Subsequently, when the switching element 1093 is turned on, both terminals of the capacitor 1092 is short-circuited. As a result, the charge Qx stored in the capacitor 1092 is discharged and decreases to 0 coulomb. The voltage V output to the external-force detection circuit 1040 decreases to 0 volt. Turning on the switching element 1093 is referred to as resetting the conversion output circuit 1090c. Note that the voltage Vx output from an ideal conversion output circuit 1090c is proportional to an accumulated amount of the charge Qx output from the charge output element 1010.

The switching element 1093 is, for example, a semiconductor switching element such as a MOSFET (Metal Oxide Semiconductor Field Effect Transistor) or a MEMS switch. Since such a switch is small and light compared with a mechanical switch, the switch is advantageous for a reduction in the size and a reduction in the weight of the force detecting device 1001. A representative example is explained below in which the MOSFET is used as the switching element 1093. Note that, as shown in FIG. 12, such a switch is mounted on the conversion output circuit 1090c and the conversion output circuits 1090a and 1090b. Besides, the switch can also be mounted on an A/D converter 1401.

The switching element 1093 includes a drain electrode, a source electrode, and a gate electrode. One of the drain electrode and the source electrode of the switching element 1093 is connected to the first input terminal of the operational amplifier 1091. The other of the drain electrode and the source electrode is connected to the output terminal of the operational amplifier 1091. A gate electrode of the switching element 1093 is connected to a driving circuit (not shown in the figure).

The same driving circuit may be connected to the switching elements 1093 of the conversion output circuits 1090a, 1090b, and 1090c or different driving circuits may be respectively connected to the switching elements 1093. ON/OFF signals all synchronizing with one another are input to the switching elements 1093 from the driving circuit. Consequently, the operations of the switching elements 1093 of the conversion output circuits 1090a, 1090b, and 1090c synchronize with one another. That is, ON/OFF timings of the switching elements 1093 of the conversion output circuits 1090a, 1090b, and 1090c coincide with one another.

External-Force Detection Circuit

As shown in FIG. 11, the external-force detection circuit 1040 has a function of detecting an applied external force on the basis of the voltage Vy output from the conversion output circuit 1090a, the voltage Vz output from the conversion output circuit 1090b, and the voltage Vx output from the conversion output circuit 1090c. The external-force detection circuit 1040 includes the A/D converter 1401 connected to the conversion output circuits (conversion circuits) 1090a, 1090b, and 1090c and an arithmetic unit (an arithmetic circuit) 1402 connected to the A/D converter 1401.

The A/D converter 1401 has a function of converting the voltages Vx, Vy, and Vz from analog signals into digital signals. The voltages Vx, Vy, and Vz converted into the digital signals by the A/D converter 1401 are input to the arithmetic unit 1402.

The arithmetic unit 1402 applies, to the voltages Vx, Vy, and Vz converted into the digital signals, kinds of processing such as correction for eliminating differences in sensitivities among the conversion output circuits 1090a, 1090b, and 1090c. The arithmetic unit 1402 outputs three signals proportional to accumulation amounts of the charges Qx, Qy, and Qz output from the charge output element 1010.

Force Detection in the α-Axis, β-Axis, and γ-Axis Directions (a Force Detecting Method)

As explained above, the charge output elements 1010 are set such that the laminating direction LD and the sandwiching direction SD are inclined at the inclination angle θ with respect to the first base section 1002 (see FIGS. 10 and 13). That is, an angle formed by a plane including the first detection direction of the external force acting when the first sensor 1012 outputs the charge Qx and the second detection direction of the external force acting when the second sensor 1013 outputs the charge Qz and a plane including the α axis and the β axis is the inclination angle θ.

The inventors have found that the force FA in the α-axis direction, the force FB in the β-axis direction, and the force FC in the γ-axis direction can be respectively represented by Expressions (4), (5), and (6) below. In expressions (4) to (6), "fx1" represents a force applied in the x-axis direction of the first sensor 1012, that is, a force calculated from the charge Qx (a first output) and "fx2" represents a force applied in the x-axis direction of the third sensor 1014, that is, a force calculated from the charge Qy (a second output).

$$FA = fx1 \cdot \cos \phi - fx2 \cdot \sin \phi \qquad (4)$$

$$FB = fx1 \cdot \sin \phi \cdot \sin \theta + fx2 \cdot \cos \phi \cdot \sin \theta \qquad (5)$$

$$FC = -fx1 \cdot \sin \phi \cdot \cos \theta - fx2 \cdot \cos \phi \cdot \cos \theta \qquad (6)$$

For example, in the case of the force detecting device 1001 including the configuration shown in FIG. 10, θ is 45° and φ is 0°. When 45° is substituted in θ of Expressions (4) to (6) and 0° is substituted in φ, the forces FA to FC are respectively calculated as follows.

$$FA = fx1$$

$$FB = fx2/\sqrt{2}$$

$$FC = -fx2/\sqrt{2}$$

In this way, when detecting the forces FA to FC, the force detecting device 1001 can perform the detection without using the second sensor 1013 (the charge Qz) that is easily affected by fluctuation in temperature, that is, on which noise is easily superimposed. Therefore, the force detecting device 1001 is less easily affected by the fluctuation in temperature. For example, the influence of the fluctuation in temperature is reduced to ½₀ or less of that of the force detecting device in the past. Consequently, the force detecting device 1001 can accurately stably detect the forces FA to FC even under an environment in which a temperature change is intense.

The total weight of the force detecting device 1001 configured as explained above is smaller than 1 kg. Consequently, it is possible to reduce a load of the weight of the force detecting device 1001 imposed on, for example, a wrist of a robot to which the weight of the force detecting device 1001 is applied. The capacity of an actuator that drives the wrist of the robot can be reduced. Therefore, it is possible to design the wrist of the robot small. Further, the weight of the force detecting device 1001 is smaller than 20% of maximum weight that a robot arm can convey. Consequently, it is possible to facilitate control of the robot arm to which the weight of the force detecting device 1001 is applied.

Fourth Embodiment

Figure 15:
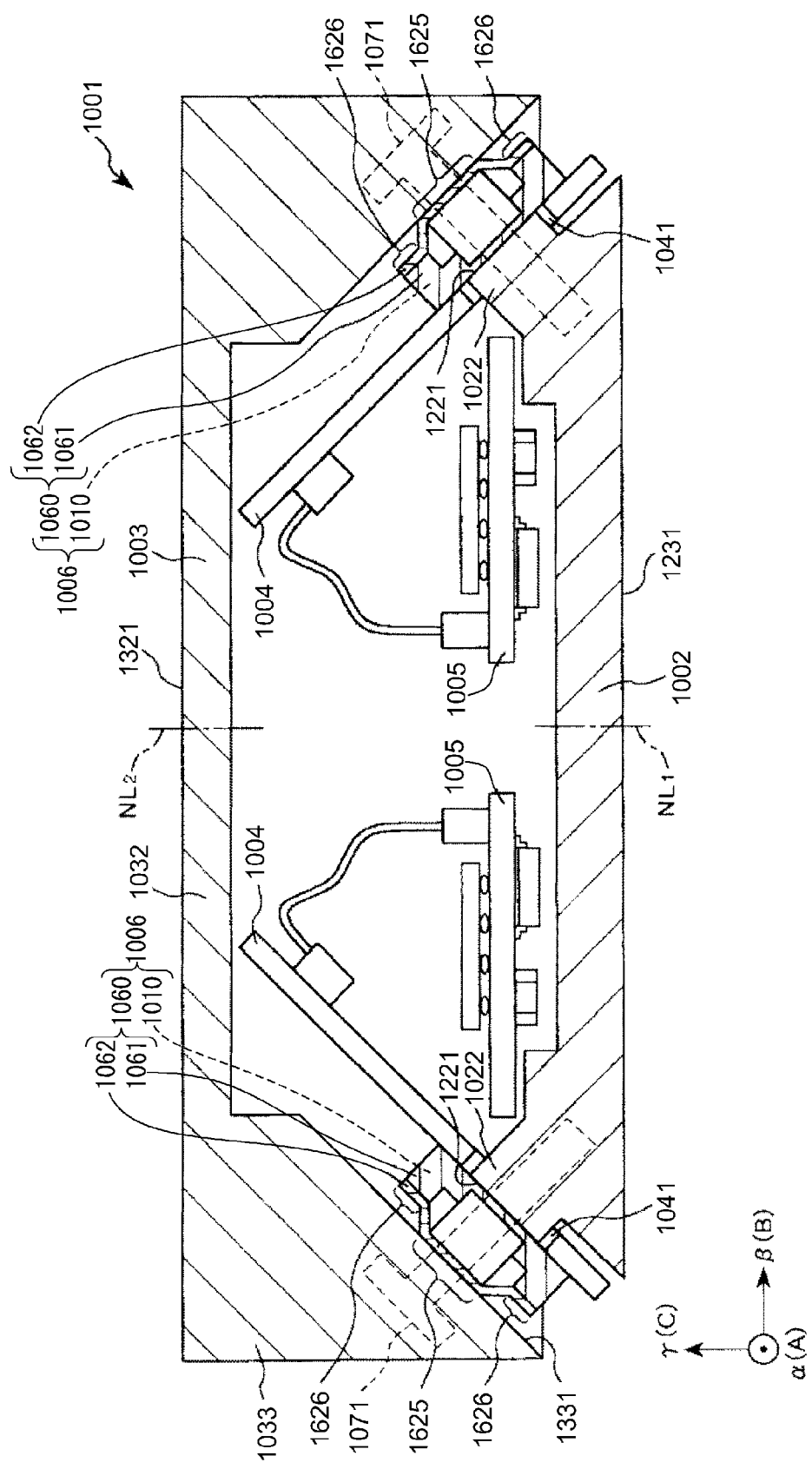
FIG. 15 is a sectional view showing a force detecting device according to a fourth embodiment of the invention.
Figure 16:
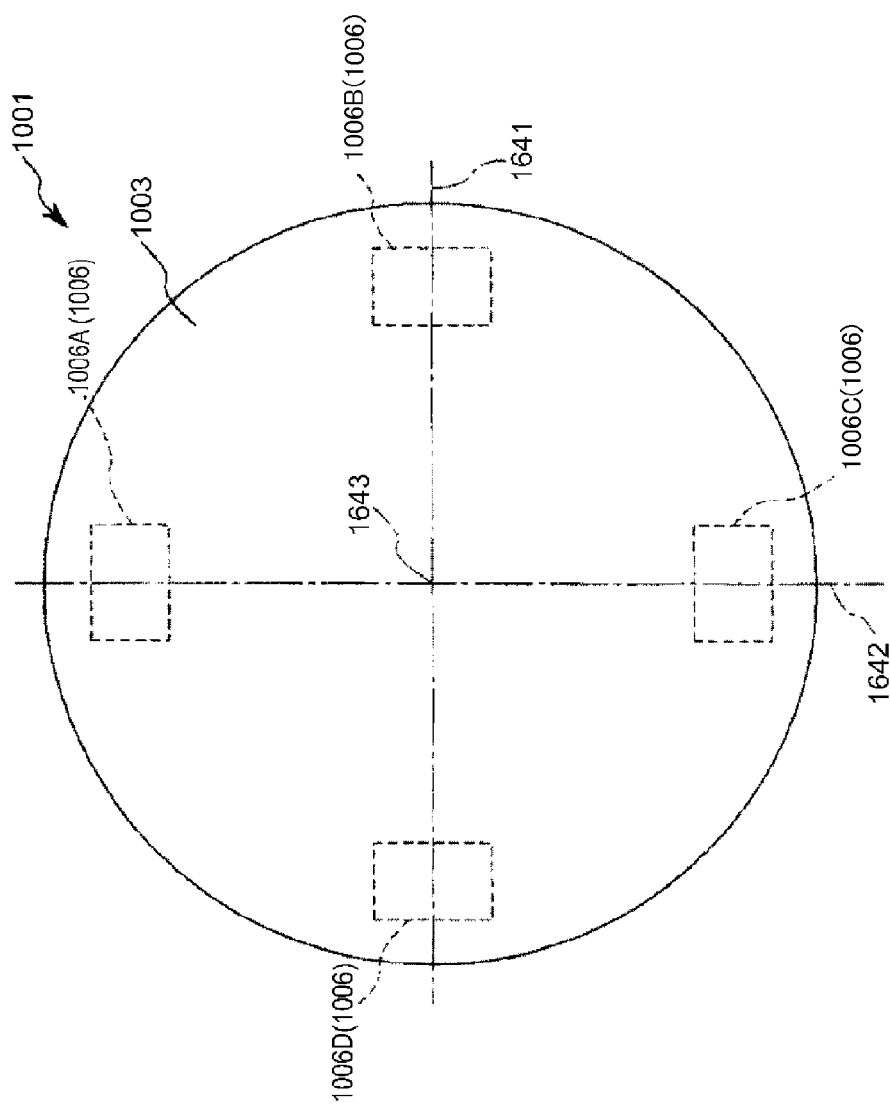
FIG. 16 is a plan view of the force detecting device shown in FIG. 15.
Figure 17:
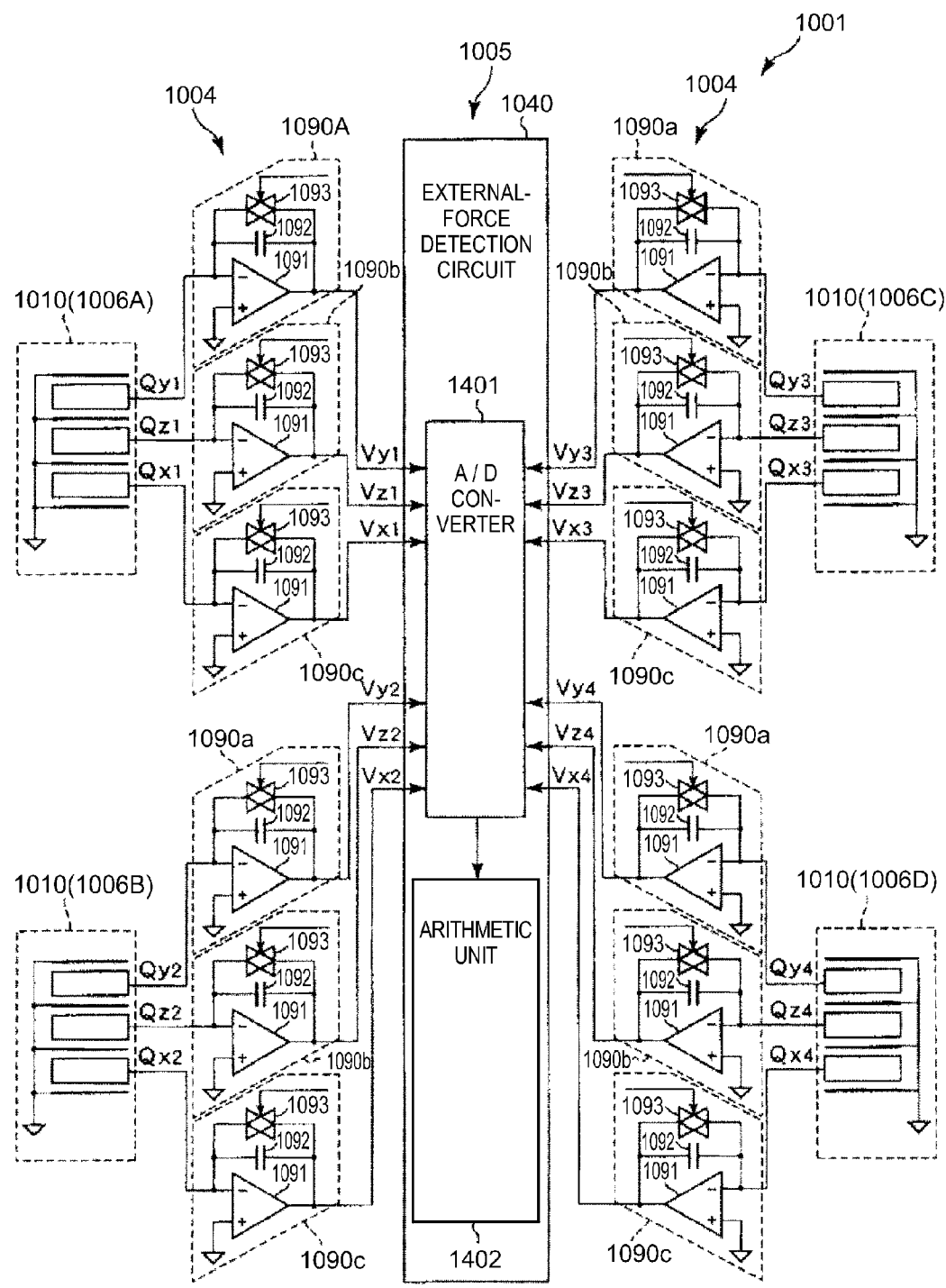
FIG. 17 is a circuit diagram schematically showing the force detecting device shown in FIG. 15.

FIG. 15 is a sectional view showing a force detecting device according to a fourth embodiment of the invention. FIG. 16 is a plan view of the force detecting device shown in FIG. 15. FIG. 17 is a circuit diagram schematically showing the force detecting device shown in FIG. 15.

The force detecting device according to the fourth embodiment of the invention is explained below with reference to the drawings. Differences from the embodiments explained above are mainly explained. Explanation of similarities is omitted.

This embodiment is the same as the third embodiment except that the number of arranged sensor devices is different.

As shown in FIGS. 15 and 16, in this embodiment, four sensor devices 1006 (charge output elements 1010) are set. In the following explanation, the sensor devices 1006 are referred to as "sensor device (first sensor element) 1006A", "sensor device (second sensor element) 1006B", "sensor device (third sensor element) 1006C", and "sensor device (fourth sensor element) 1006D" in counterclockwise order in FIG. 16.

Note that, as explained above, the first base section 1002 and the second base section 1003 form a housing space in which the analog circuit board 1004 and the digital circuit board 1005 are housed. The housing space has a circular or corner-rounded square sectional shape. Distances between the respective sensor devices 1006 and the center of the attachment surface 1321 (or the attachment surface 1231) are equal. With such a configuration, when the sensor devices 1006 are arranged in a circumferential shape, stress can be uniformly dispersed. Therefore, it is possible to reduce the thickness of the first base section 1002 and the second base section 1003.

There are eight (a plurality of) pressurizing bolts 1071. Two each among the eight pressurizing bolts 1071 are arranged on both sides of the sensor device 1006 via the sensor device 1006, i.e., provided around the sensor device 1006 and apply pressurization to the sensor device 1006. Note that a pressurization direction by the pressurizing bolts 1071 is a direction parallel to the laminating direction LD.

As shown in FIG. 16, the sensor device 1006A and the sensor device 1006C are arranged symmetrically with respect to a center axis 1641 of the second base section 1003 (one base section) formed in a circular plane shape. The sensor device 1006B and the sensor device 1006D are arranged symmetrically with respect to a center axis 1642 shifted from the center axis 1641 by 90 degrees. That is, the sensor devices 1006A to 1006D are arranged at equal angle intervals around a center 1643 of the second base section 1003. It is possible to uniformly detect an external force by arranging the sensor devices 1006A to 1006D in this way.

The sensor devices 1006A to 1006D are preferably arranged in positions separated from the center section (the center 1643) of the second base section 1003 as much as possible when viewed from the attachment surface 1321. Consequently, it is possible to stably detect an external force.

Note that, as explained in the second embodiment, the sensor device 1006A includes the first sensor 1012, the second sensor 1013, and the third sensor 1014 laminated in the laminating direction LD (a first laminating direction). The first sensor 1012 has a function of outputting the charge Qx, which is a first output, according to an external force applied in the first detection direction orthogonal to the laminating direction LD (the first laminating direction). The first sensor 1012 is formed by the first piezoelectric layer 1121, the second piezoelectric layer 1123, and the output electrode layer 1122. The second sensor 1013 has a function of outputting the charge Qz. The second sensor 1013 is formed by the third piezoelectric layer 1131, the fourth piezoelectric layer 1133, and the output electrode layer 1132. The third sensor 1014 has a function of outputting the charge Qx, which is a second output, according to an external force applied in the second detection direction orthogonal to the first laminating direction and crossing the first detection direction. The third sensor 1014 is formed by the fifth piezoelectric layer 1141, the sixth piezoelectric layer 1143, and the output electrode layer 1142.

The sensor device 1006B includes a configuration same as the configuration of the sensor device 1006A. The sensor device 1006B includes the first sensor 1012, the second sensor 1013, and the third sensor 1014 laminated in the laminating direction LD (a second laminating direction). The second laminating direction is a direction different from the normal NL2 of the attachment surface 1321 and symmetrical to the first laminating direction with respect to the center 1643. The first sensor 1012 has a function of outputting the charge Qx, which is a third output, according to an external force applied in the third detection direction orthogonal to the second laminating direction. The first sensor 1012 is formed by the first piezoelectric layer 1121, the second piezoelectric layer 1123, and the output electrode layer 1122. The second sensor 1013 has a function of outputting the charge Qz. The second sensor 1013 is formed by the third piezoelectric layer 1131, the fourth piezoelectric layer 1133, and the output electrode layer 1132. The third sensor 1014 has a function of outputting the charge Qx, which is a fourth output, according to an external force applied in a fourth detection direction orthogonal to the second laminating direction and crossing the third detection direction. The third sensor 1014 is formed by the fifth piezoelectric layer 1141, the sixth piezoelectric layer 1143, and the output electrode layer 1142.

The sensor device 1006C also includes a configuration same as the configuration of the sensor device 1006A. The sensor device 1006C includes the first sensor 1012, the second sensor 1013, and the third sensor 1014 laminated in the laminating direction LD (a third laminating direction). The first sensor 1012 has a function of outputting the charge Qx, which is a fifth output, according to an external force applied in a fifth detection direction orthogonal to the laminating direction LD (the third laminating direction). The first sensor 1012 is formed by the first piezoelectric layer 1121, the second piezoelectric layer 1123, and the output electrode layer 1122. The second sensor 1013 has a function of outputting the charge Qz. The second sensor 1013 is formed by the third piezoelectric layer 1131, the fourth piezoelectric layer 1133, and the output electrode layer 1132. The third sensor 1014 has a function of outputting the charge Qx, which is a sixth output, according to an external force applied in a sixth detection direction orthogonal to the third laminating direction and crossing the fifth detection direction. The third sensor 1014 is formed by the fifth piezoelectric layer 1141, the sixth piezoelectric layer 1143, and the output electrode layer 1142.

The sensor device 1006D also includes a configuration same as the configuration of the sensor device 1006A. The sensor device 1006D includes the first sensor 1012, the second sensor 1013, and the third sensor 1014 laminated in the laminating direction LD (a fourth laminating direction). The fourth laminating direction is a direction different from the normal NL2 of the attachment surface 1321 and symmetrical to the third laminating direction with respect to the center 1643. The first sensor 1012 has a function of outputting the charge Qx, which is a seventh output, according to an external force applied in a seventh detection direction orthogonal to the fourth laminating direction. The first sensor 1012 is formed by the first piezoelectric layer 1121, the second piezoelectric layer 1123, and the output electrode layer 1122. The second sensor 1013 has a function of outputting the charge Qz. The second sensor 1013 is formed by the third piezoelectric layer 1131, the fourth piezoelectric layer 1133, and the output electrode layer 1132. The third sensor 1014 has a function of outputting the charge Qx, which is an eighth output, according to an external force applied in an eighth detection direction orthogonal to the fourth laminating direction and crossing the seventh detection direction. The third sensor 1014 is formed by the fifth piezoelectric layer 1141, the sixth piezoelectric layer 1143, and the output electrode layer 1142.

Note that, in this embodiment, the force detecting device 1001 includes the sensor devices 1006A to 1006D. However, the force detecting device 1001 is not limited to this. For example, the sensor device 1006C and the sensor device 1006D among the sensor devices 1006A to 1006D may be omitted. In this case, the force detecting device 1001 includes a simple configuration.

Conversion Output Circuits

As shown in FIG. 17, the conversion output circuits 1090a, 1090b, and 1090c are respectively connected to the charge output elements 1010 of the sensor devices 1006A to 1006D. The conversion output circuits 1090a, 1090b, and 1090c are the same as the conversion output circuit 1090 in the third embodiment. Therefore, explanation of the conversion output circuits 1090a, 1090b, and 1090c is omitted.

Note that the charge output element 1010 of the sensor device 1006A outputs the charges Qx1, Qy1, and Qz1. The charge output element 1010 of the sensor device 1006B outputs the charges Qx2, Qy2, and Qz2. The charge output element 1010 of the sensor device 1006C outputs the charges Qx3, Qy3, and Qz3. The charge output element 1010 of the sensor device 1006D outputs the charges Qx4, Qy4, and Qz4.

External-Force Detecting Circuit

The external-force detection circuit 1040 has a function of detecting an applied external force on the basis of the voltages Vy1, Vy2, Vy3, and Vy4 output from the conversion output circuits 1090a, the voltages Vz1, Vz2, Vz3, and Vz4 output from the conversion output circuits 1090b, and the voltages Vx1, Vx2, Vx3, and Vx4 output from the conversion output circuits 1090c. The external-force detection circuit 1040 includes the A/D converter 1401 connected to the conversion output circuits 1090a, 1090b, and 1090c and the arithmetic unit 1402 connected to the A/D converter 1401.

The A/D converter 1401 has a function of converting the voltages Vx1, Vy1, Vz1, Vx2, Vy2, Vz2, Vx3, Vy3, Vz3, Vx4, Vy4, and Vz4 from analog signals into digital signals. The voltages Vx1, Vy1, Vz1, Vx2, Vy2, Vz2, Vx3, Vy3, Vz3, Vx4, Vy4, and Vz4 converted into the digital signals by the A/D converter 1401 are input to the arithmetic unit 1402.

The forces FA to FC of the entire force detecting device 1001 in this embodiment respectively change to resultant forces of the force FA to FC (ΣFA, ΣFB, and ΣFC) detected on the basis of charges output by the charge output elements 1010 of the sensor devices 1006A to 1006D.

Fifth Embodiment

Figure 18:
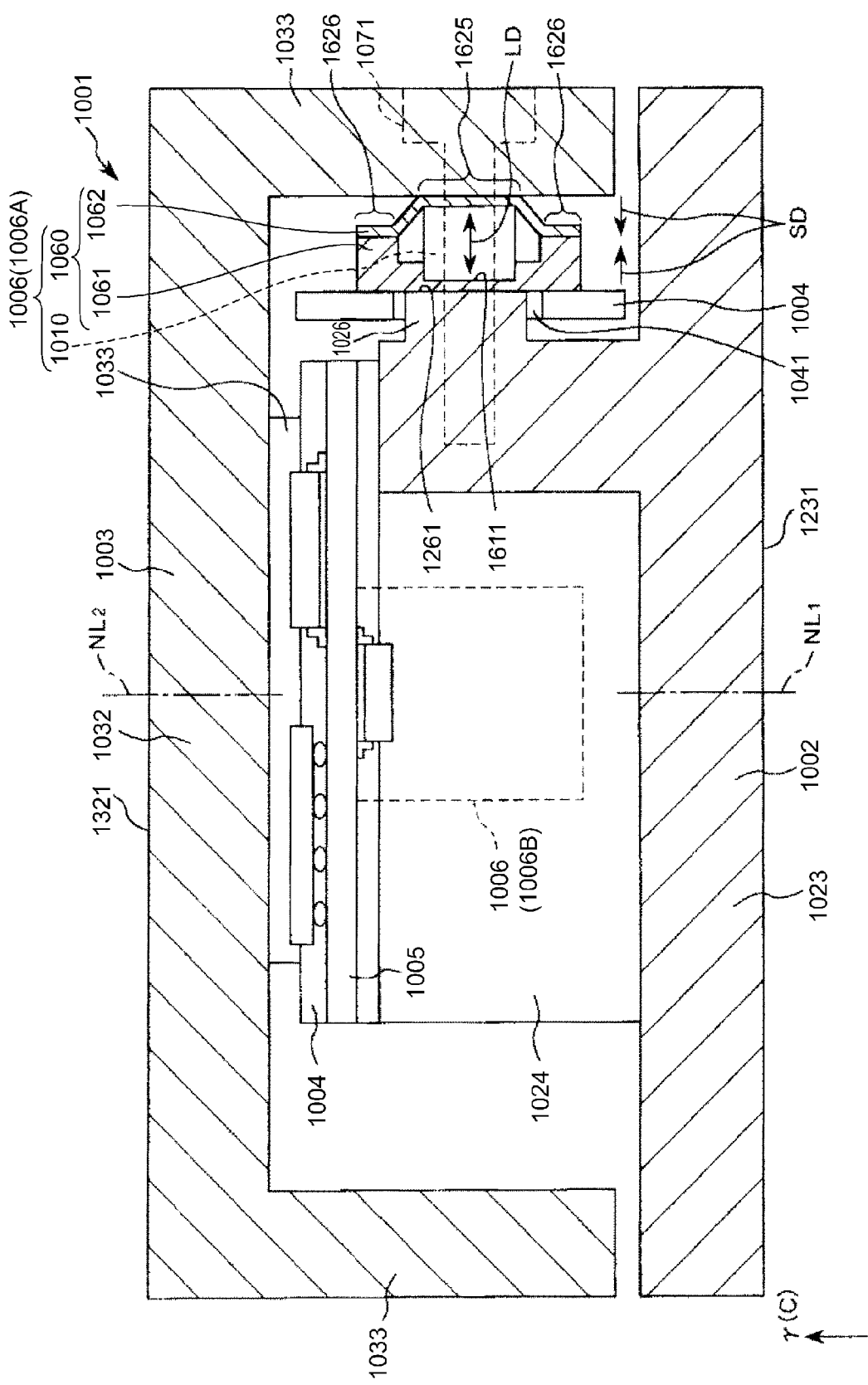
FIG. 18 is a sectional view showing a force detecting device according to a fifth embodiment of the invention.
Figure 19:
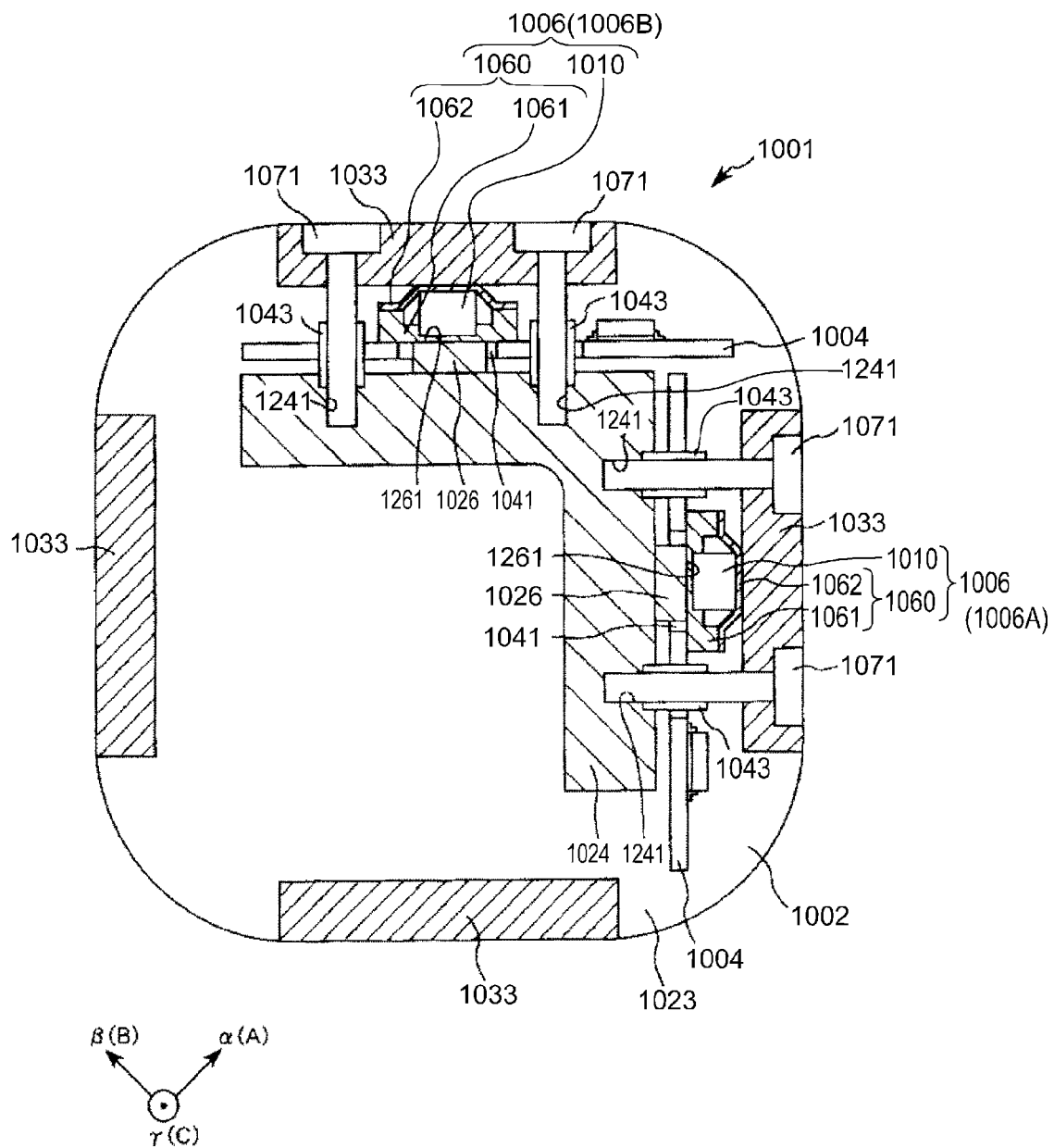
FIG. 19 is a plan view of the force detecting device shown in FIG. 18.
Figure 20:
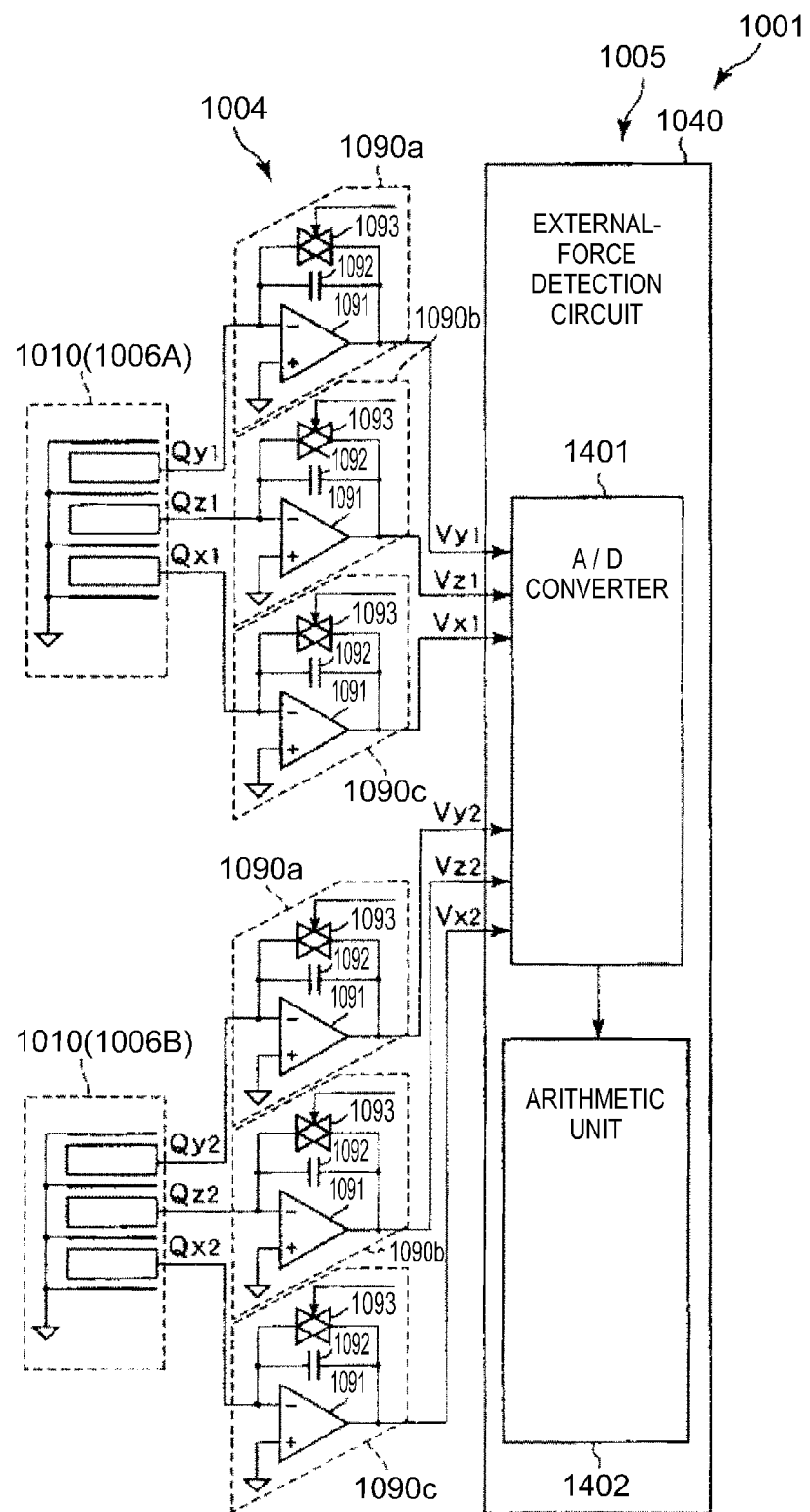
FIG. 20 is a circuit diagram schematically showing the force detecting device shown in FIG. 18.
Figure 21:
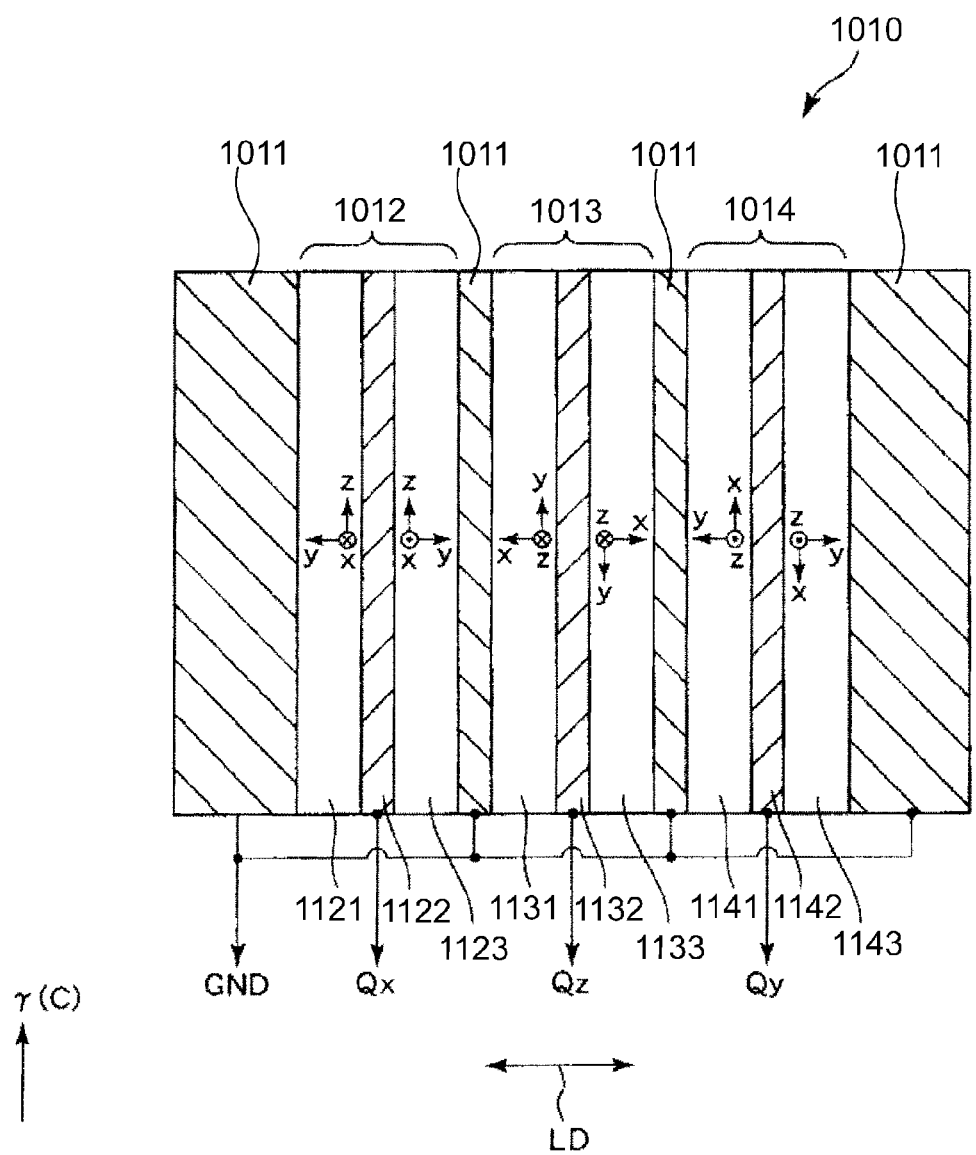
FIG. 21 is a sectional view schematically showing a charge output element of the force detecting device shown in FIG. 18.
Figure 22:
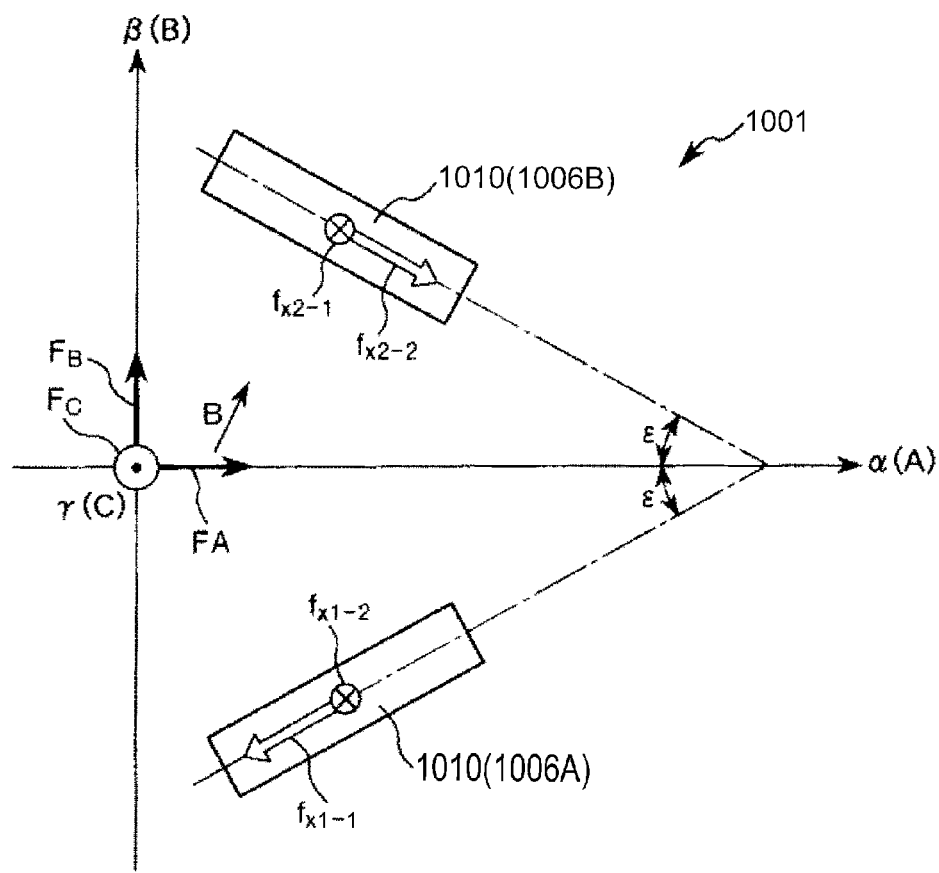
FIG. 22 is a schematic diagram showing an action state of a force detected by the charge output element of the force detecting device shown in FIG. 18.
Figure 23:
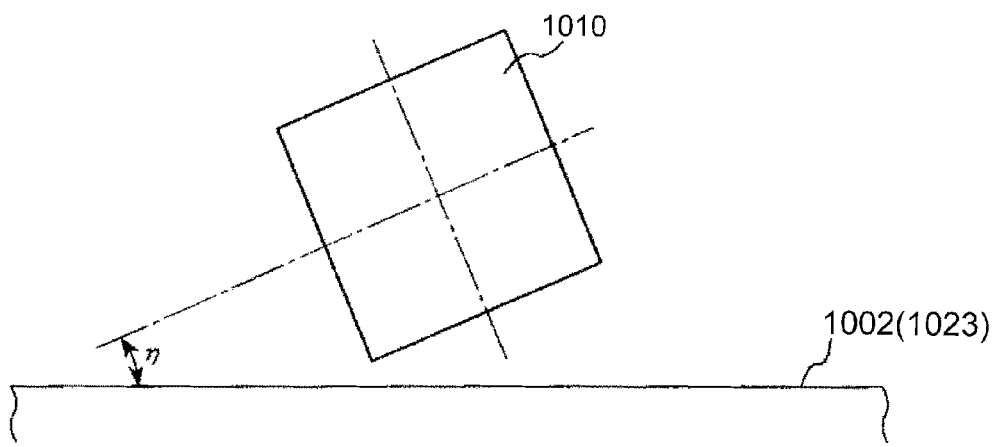
FIG. 23 is a diagram of the charge output element viewed from an arrow B direction in FIG. 22.

FIG. 18 is a sectional view showing a force detecting device according to a fifth embodiment of the invention. FIG. 19 is a plan view of the force detecting device shown in FIG. 18. FIG. 20 is a circuit diagram schematically showing the force detecting device shown in FIG. 18. FIG. 21 is a sectional view schematically showing a charge output element of the force detecting device shown in FIG. 18. FIG. 22 is a schematic diagram showing an action state of a force detected by the charge output element of the force detecting device shown in FIG. 18. FIG. 23 is a diagram of the charge output element viewed from an arrow B direction in FIG. 22.

The force detecting device according to the fifth embodiment of the invention is explained below with reference to the drawings. Differences from the embodiments explained above are mainly explained. Explanation of similarities is omitted.

This embodiment is the same as the third embodiment except that the number of arranged sensor devices and the postures of the sensor devices are different. Note that, in the following explanation, for convenience of explanation, the upper side in FIG. 18 is referred to as "up" or "upward" and the lower side in the figure is referred to as "down" or "downward".

As shown in FIGS. 18 and 19, in this embodiment, two sensor devices 1006 (the charge output elements 1010) are set. In the following explanation, of the two sensor devices 1006, one sensor device 1006 located on the right side in FIG. 19 is referred to as "sensor device 1006A" and the other sensor device 1006 is referred to as "sensor device 1006B". Note that the number of the set sensor devices 1006 is not limited to two and may be, for example, three or more.

The external shape of the first base section 1002 is a tabular shape. The plane shape of the first base section 1002 is a square shape rounded at corners. The first base section 1002 includes a bottom plate 1023 and a wall section 1024 erected upward from the bottom plate 1023. The wall section 1024 is formed in an "L" shape. Projections 1026 are formed to project respectively on two surfaces facing outward. Top surfaces 1261 of the projections 1026 are planes perpendicular to the bottom plate 1023.

The external shape of the second base section 1003 is also a tabular shape. The plane shape of the second base section 1003 is the same as the plane shape of the first base section 1002.

The sensor device 1006A is sandwiched between the top surface 1261 of one projection 1026 of the two projections 1026 of the first base section 1002 and the sidewall 1033 of the second base section 1003. That is, the charge output element 1010 of the sensor device 1006A is sandwiched and pressurized by the top surface 1261 of the one projection 1026 of the first base section 1002 and the sidewall 1033 of the second base section 1003 via the package 1060. As shown in FIGS. 18 and 21, in the posture of the charge output element 1010 of the sensor device 1006A, layers forming the charge output element 1010 are perpendicular to the first base section 1002. That is, the laminating direction LD and the sandwiching direction SD are parallel to the first base section 1002. As shown in FIG. 22, in the charge output element 1010, the x axis of the first sensor 1012 and the z axis of the third sensor 1014 are inclined at the inclination angle ε with respect to the α axis.

The sensor device 1006B is sandwiched between the top surface 1261 of the other projection 1026 of the first base section 1002 and the sidewall 1033 of the second base section 1003. That is, the charge output element 1010 of the sensor device 1006B is sandwiched and pressurized by the top surface 1261 of the other projection 1026 of the first base section 1002 and the sidewall 1033 of the second base section 1003 via the package 1060. In the posture of the charge output element 1010 of the sensor device 1006B, layers forming the charge output element 1010 are also perpendicular to the first base section 1002. That is, the laminating direction LD and the sandwiching direction SD are parallel to each other. As shown in FIG. 22, in the charge output element 1010, the x axis of the first sensor 1012 and the z axis of the third sensor 1014 are also inclined at the inclination angle ε with respect to the α axis.

As explained above, in this embodiment, the α axis is a bisector that bisects an angle formed by the charge output element 1010 of the sensor device 1006A and the charge output element 1010 of the sensor device 1006B. Therefore, the sensor device 1006A and the sensor device 1006B are not arranged on the same plane and not arranged in parallel to each other.

Note that, as shown in FIG. 23, when an angle formed by the x axis of the first sensor 1012 and the bottom plate 1023 of the first base section 1002 is represented as η, the charge output elements 1010 are allowed to tilt to a decree in which the angle η satisfies $0° \le η < 90°$.

Pressurization to the charge output elements 1010 is applied by the two pressurizing bolts 1071. The female screws 1241 screwing with the pressurizing bolts 1071 are provided in the wall section 1024 of the first base section 1002. In a state in which the sensor devices 1006 are sandwiched between the first base section 1002 and the second base section 1003, the pressurizing bolts 1071 can be inserted into the female screws 1241 of the first base section 1002 from the second base section 1003 side. Consequently, pressure, that is, pressurization, of predetermined magnitude is applied to the charge output elements 1010 together with the packages 1060, which house the charge output elements 1010. When a shearing force acts on the charge output elements 1010, a frictional force surely occurs between the layers forming the charge output elements 1010. Therefore, it is possible to surely detect charges.

As shown in FIG. 19, the pressurizing bolts 1071 pierce through the analog circuit board 1004. Pipes 1043 formed of an insulating material such as a resin material are fixed by, for example, fitting, to portions of the analog circuit board 1004 where the pressurizing bolts 1071 pierce through.

As shown in FIG. 18, the digital circuit board 1005 is supported on the wall section 1024 of the first base section 1002.

Conversion Output Circuits

As shown in FIG. 20, the conversion output circuits 1090a, 1090b, and 1090c are respectively connected to the charge output elements 1010 of the sensor devices 1006A and 1006B. The conversion output circuits 1090a, 1090b, and 1090c are the same as the conversion output circuit 1090 in the third embodiment. Therefore, explanation of the conversion output circuits 1090a, 1090b, and 1090c is omitted.

Note that the charge output element 1010 of the sensor device 1006A outputs the charges Qx1, Qy1, and Qz1. The charge output element 1010 of the sensor device 1006B outputs the charges Qx2, Qy2, and Qz2.

External-Force Detecting Circuit

The external-force detection circuit 1040 has a function of detecting an applied external force on the basis of the voltages Vy1 and Vy2 output from the conversion output circuits 1090a, the voltages Vz1 and Vz2 output from the conversion output circuits 1090b, and the voltages Vx1 and Vx2 output from the conversion output circuits 1090c. The external-force detection circuit 1040 includes the A/D converter 1401 connected to the conversion output circuits 1090a, 1090b, and 1090c and the arithmetic unit 1402 connected to the A/D converter 1401.

The A/D converter 1401 has a function of converting the voltages Vx1, Vy1, Vz1, Vx2, Vy2, and Vz2 from analog signals into digital signals. The voltages Vx1, Vy1, Vz1, Vx2, Vy2, and Vz2 converted into the digital signals by the A/D converter 1401 are input to the arithmetic unit 1402.

Force Detection in the α-Axis, β-Axis, and γ-Axis Directions (a Force Detecting Method)

As explained above, the charge output elements 1010 are set such that the laminating direction LD and the sandwiching direction SD are parallel to the first base section 1002 (see FIG. 18).

The inventors have found that the force FA in the a-axis direction, the force FB in the β-axis direction, and the force FC in the γ-axis direction can be respectively represented by Expressions (7), (8), and (9) below. In expressions (7) to (9), "fx1-1" represents a force applied in the x-axis direction of the first sensor 1012 of the sensor device 1006A, that is, a force calculated from the charge Qx1. "fx1-2" represents a force applied in the x-axis direction of the third sensor 1014, that is, a force calculated from the charge Qy1. "fx2-1" represents a force applied in the x-axis direction of the first sensor 1012 of the sensor device 1006B, that is, a force calculated from the charge Qx2. "fx2-2" represents a force applied in the x-axis direction of the third sensor 1014, that is, a force calculated from the charge Qy2.

$$FA = fx1\text{-}1 \cdot \cos \eta \cdot \cos \epsilon - fx1\text{-}2 \cdot \sin \eta \cdot \cos \epsilon - fx2\text{-}1 \cdot \cos \eta \cdot \cos \epsilon + fx2\text{-}2 \cdot \sin \eta \cdot \cos \epsilon \quad (7)$$

$$FB = -fx1\text{-}1 \cdot \cos \eta \cdot \sin \epsilon + fx1\text{-}2 \cdot \sin \eta \cdot \sin \epsilon - fx2\text{-}1 \cdot \cos \eta \cdot \sin \epsilon + fx2\text{-}2 \cdot \sin \eta \cdot \sin \epsilon \quad (8)$$

$$FC = -fx1\text{-}1 \cdot \sin \eta - fx1\text{-}2 \cdot \cos \eta - fx2\text{-}1 \cdot \sin \eta - fx2\text{-}2 \cdot \cos \eta \quad (9)$$

For example, in the case of the force detecting device 1001 including the configuration shown in FIGS. 18 and 19, $\epsilon$ is 45° and $\eta$ is 0°. When 45° is substituted in $\epsilon$ and 0° is substituted in $\eta$ in Expressions (7) to (9), the forces FA to FC are respectively calculated as shown below.

$$FA = fx1\text{-}1/\sqrt{2} - fx2\text{-}1/\sqrt{2}$$

$$FB = -fx1\text{-}1/\sqrt{2} - fx2\text{-}1/\sqrt{2}$$

$$FC = -fx1\text{-}2 - fx2\text{-}2$$

In this way, as in the third embodiment, when detecting the forces FA to FC, the force detecting device 1001 can perform the detection without using the second sensor 1013 (the charge Qz) that is easily affected by fluctuation in temperature, that is, on which noise is easily superimposed. Therefore, the force detecting device 1001 is less easily affected by the fluctuation in temperature. For example, the influence of the fluctuation in temperature is reduced to 1/20 or less of that of the force detecting device in the past. Consequently, the force detecting device 1001 can accurately stably detect the forces FA to FC even under an environment in which a temperature change is intense.

Sixth Embodiment

A single-arm robot, which is an example of a robot according to a sixth embodiment of the invention, is explained with reference to FIG. 24. Differences of this embodiment from the first and second embodiments are mainly explained below. Explanation of similarities is omitted.

Figure 24:
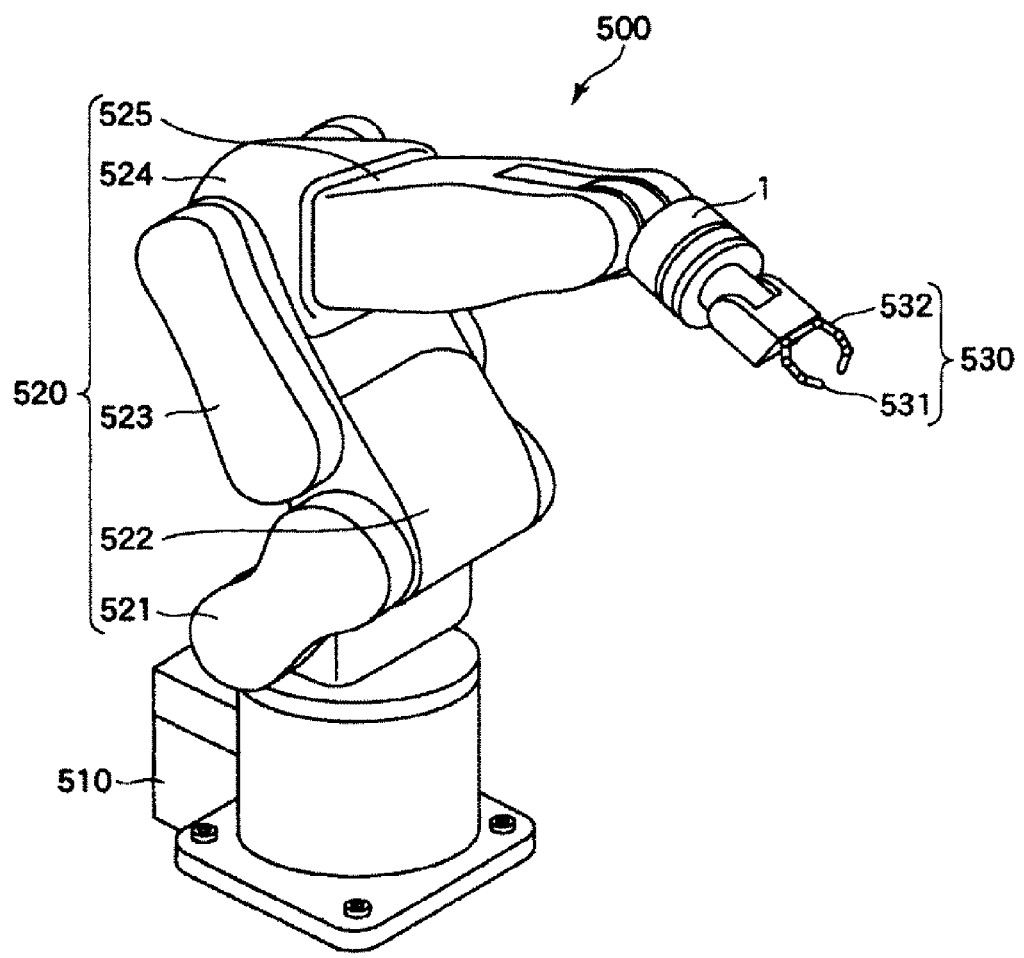
FIG. 24 is a diagram showing an example of a single-arm robot according to a sixth embodiment including the force detecting device according to the first embodiment.

FIG. 24 is a diagram showing an example of a single-arm robot according to the sixth embodiment including the force detecting device according to the first embodiment. A single-arm robot 500 shown in FIG. 24 includes a base 510, an arm 520, an end effector 530 provided on the distal end side of the arm 520, and the force detecting device 1 provided between the arm 520 and the end effector 530. Note that, in the following explanation, the single-arm robot 500 including the force detecting device 1 is explained. However, the force detecting device 1001 may be used. As the force detecting device 1 or the force detecting device 1001, a force detecting device same as the force detecting device according to any one of the embodiments explained above is used.

The base 510 has a function of housing an actuator (not shown in the figure) that generates power for turning the arm 520, a control unit (not shown in the figure) that controls the actuator, and the like. The base 510 is fixed to, for example, a floor, a wall, a ceiling, or a movable wagon.

The arm 520 includes a first arm element 521, a second arm element 522, a third arm element 523, a fourth arm element 524, and a fifth arm element 525. The arm 520 is configured by turnably coupling the arm elements adjacent to one another. The arm 520 rotates or bends in a complex manner about coupling sections of the arm elements to be driven according to the control by the control unit.

The end effector 530 has a function of gripping a target object. The end effector 530 includes a first finger 531 and a second finger 532. After reaching a predetermined operation position according to the driving of the arm 520, the end effector 530 can grip the target object by adjusting a clearance between the first finger 531 and the second finger 532.

Note that the end effector 530 is a hand. However, in the invention, the end effector 530 is not limited to the hand. Other examples of the end effector include an instrument for component inspection, an instrument for component conveyance, an instrument for component machining, an instrument for component assembly, and a measuring device. The same applies to end effectors in other embodiments.

The force detecting device 1 has a function of detecting an external force applied to the end effector 530. The single-arm robot 500 can execute more precise work by feeding back the force detected by the force detecting device 1 to the control unit of the base 510. The single-arm robot 500 can detect, according to the force detected by the force detecting device 1, for example, contact of the end effector 530 with an obstacle. Therefore, the single-arm robot 500 can easily perform an obstacle avoiding operation, a target object damage avoiding operation, and the like, which are difficult in the position control in the past. The single-arm robot 500 can more safely execute work.

Note that, in the configuration shown in the figure, the arm 520 is configured by the five arm elements in total. However, the invention is not limited to this. A configuration in which the arm 520 is configured by one arm element, a configuration in which the arm 520 is configured by two to four arm elements, and a configuration in which the arm 520 is configured by six or more arm elements are also within the scope of the invention.

Seventh Embodiment

A double-arm robot, which is an example of a robot according to a seventh embodiment of the invention, is explained below with reference to FIG. 25. Differences of this embodiment from the embodiments explained above are mainly explained below. Explanation of similarities is omitted.

Figure 25:
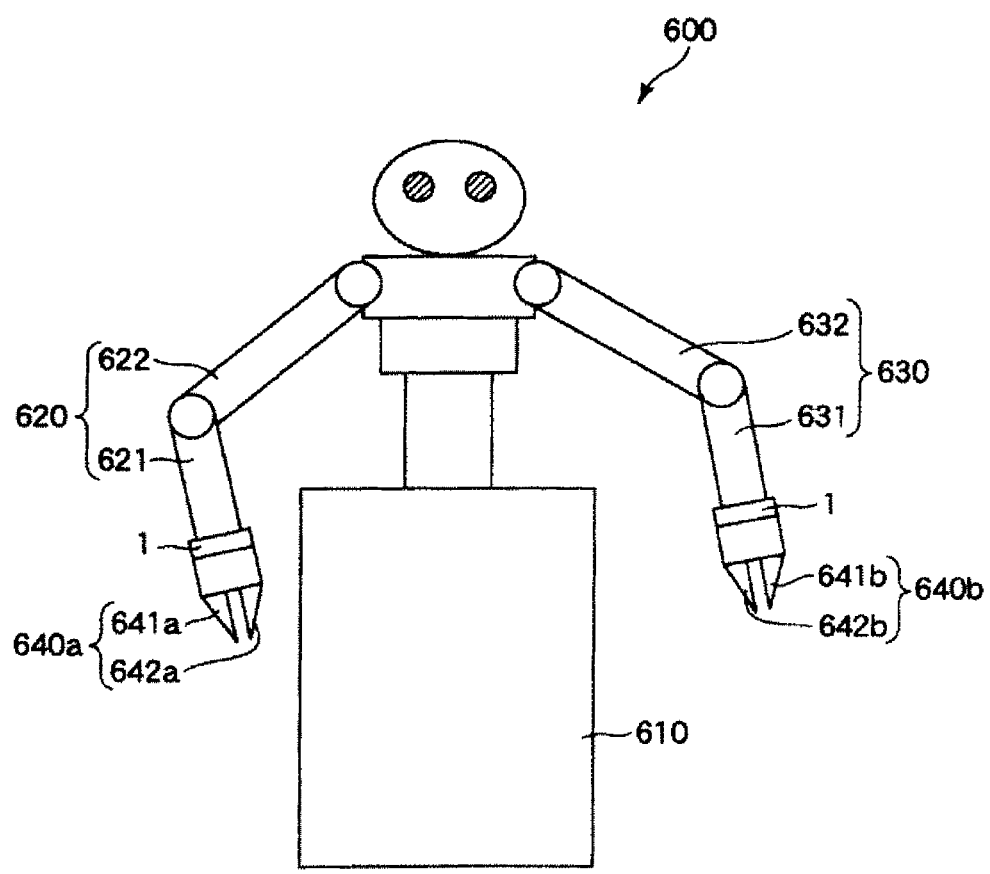
FIG. 25 is a diagram showing an example of a double-arm robot according to a seventh embodiment including the force detecting device according to the first embodiment.

FIG. 25 is a diagram of an example of a double-arm robot according to the seventh embodiment including the force detecting device according to the first embodiment. A double-arm robot 600 shown in FIG. 25 includes a base 610, a first arm 620, a second arm 630, a first end effector 640a provided on the distal end side of the first arm 620, a second end effector 640b provided on the distal end side of the second arm 630, and the force detecting devices 1 provided between the first arm 620 and the first end effector 640a and between the second arm 630 and the second end effector 640b. Note that, in the following explanation, the double-arm robot 600 including the force detecting device 1 is explained. However, the force detecting device 1001 may be used. As the force detecting device 1 or the force detecting device 1001, a force detecting device same as the force detecting device according to any one of the embodiments explained above is used.

The base 610 has a function of housing an actuator (not shown in the figure) that generates power for turning the first arm 620 and the second arm 630, a control unit (not shown in the figure) that controls the actuator, and the like. The base 610 is fixed to, for example, a floor, a wall, a ceiling, or a movable wagon.

The first arm 620 is configured by turnably coupling a first arm element 621 and a second arm element 622. The second arm 630 is configured by turnably coupling a first arm element 631 and a second arm element 632. The first arm 620 and the second arm 630 rotate or bend in a complex manner about coupling sections of the arm elements to be driven according to the control by the control unit.

The first end effector 640*a* and the second end effector 640*b* have a function of gripping a target object. The first end effector 640*a* includes a first finger 641*a* and a second finger 642*a*. The second end effector 640*b* includes a first finger 641*b* and a second finger 642*b*. After reaching a predetermined operation position according to the driving of the first arm 620, the first end effector 640*a* can grip the target object by adjusting a clearance between the first finger 641*a* and the second finger 642*a*. Similarly, after reaching a predetermined operation position according to the driving of the second arm 630, the second end effector 640*b* can grip the target object by adjusting a clearance between the first finger 641*b* and the second finger 642*b*.

The force detecting devices 1 have a function of detecting external forces applied to the first end effector 640*a* and the second end effector 640*b*. The double-arm robot 600 can more precisely execute work by feeding back the forces detected by the force detecting devices 1 to the control unit of the base 610. The double-arm robot 600 can detect, according to the forces detected by the force detecting devices 1, for example, contact of the first end effector 640*a* and the second end effector 640*b* with an obstacle. Therefore, the double-arm robot 600 can easily perform an obstacle avoiding operation, a target object damage avoiding operation, and the like, which are difficult in the position control in the past. The double-arm robot 600 can more safely execute work.

Note that, in the configuration shown in the figure, the double-arm robot 600 includes the two arms. However, the invention is not limited to this. The double-arm robot 600 including three or more arms is also within the scope of the invention.

Eighth Embodiment

An electronic component inspecting apparatus and an electronic component conveying apparatus according to an eighth embodiment of the invention are explained with reference to FIGS. 26 and 27. Differences of this embodiment from the first and second embodiments are mainly explained below. Explanation of similarities is omitted.

Figure 26:
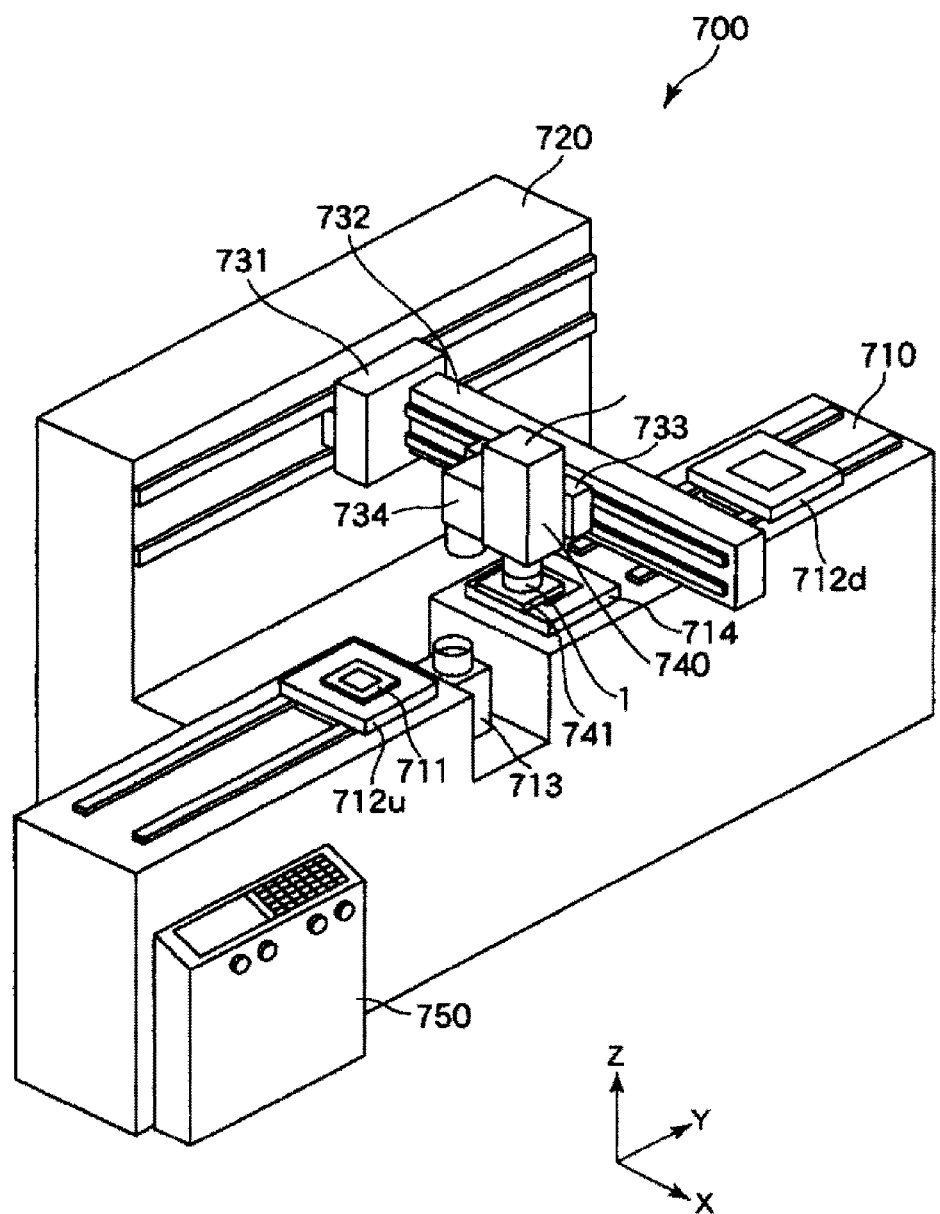
FIG. 26 is a diagram showing an example of an electronic component inspecting apparatus and an electronic component conveying apparatus according to an eighth embodiment including the force detecting device according to the first embodiment.

FIG. 26 is a diagram showing an example of an electronic component inspecting apparatus and an electronic component conveying apparatus according to the eighth embodiment including the force detecting device 1 according to the first embodiment. FIG. 27 is a diagram showing an example of the electronic component conveying apparatus according to the eighth embodiment including the force detecting device 1 according to the first embodiment. Note that, in the following explanation, the electronic component inspecting apparatus and the electronic component conveying apparatus including the force detecting device 1 is explained. However, the force detecting device 1001 may be used. As the force detecting device 1 or the force detecting device 1001, a force detecting device same as the force detecting device according to any one of the embodiments explained above is used.

An electronic component inspecting apparatus 700 shown in FIG. 26 includes a base 710 and a supporting table 720 erected on a side surface of the base 710. On the upper surface of the base 710, an upstream side stage 712*u* on which an inspection target electronic component 711 is placed and conveyed and a downstream side stage 712*d* on which the inspected electronic component 711 is placed and conveyed are provided. Between the upstream side stage 712*u* and the downstream side stage 712*d*, an image pickup device 713 for checking the posture of the electronic component 711 and an inspection table 714 on which the electronic component 711 is set to inspect electric characteristics are provided. Note that examples of the electronic component 711 include a semiconductor, a semiconductor wafer, display devices such as an LCD and an OLED, a liquid crystal device, various sensors, an inkjet head, and various MEMS devices.

In the supporting table 720, a Y stage 731 is provided to be movable in a direction (a Y direction) parallel to the upstream side stage 712*u* and the downstream side stage 712*d* of the base 710. An arm section 732 is extended from the Y stage 731 in a direction (an X direction) toward the base 710. On a side surface of the arm section 732, an X stage 733 is provided to be movable in the X direction. In the X stage 733, an image pickup camera 734 and an electronic component conveying apparatus 740 incorporating a Z stage movable in the up down direction (a Z direction) are provided. A gripping section 741 that grips the electronic component 711 is provided at the distal end side of the electronic component conveying apparatus 740. The force detecting device 1 is provided between the distal end of the electronic component conveying apparatus 740 and the gripping section 741. Further, on the front surface side of the base 710, a control device 750 that controls the operation of the entire electronic component inspecting apparatus 700 is provided. Note that, as the force detecting device 1, a force detecting device same as the force detecting device according to any one of the embodiments explained above is used.

The electronic component inspecting apparatus 700 performs inspection of the electronic component 711 as explained below. First, the inspection target electronic component 711 is placed on the upstream side stage 712*u* and moved to near the inspection table 714. Subsequently, the electronic component inspecting apparatus 700 moves the Y stage 731 and the X stage 733 to move the electronic component conveying apparatus 740 to a position right above the electronic component 711 placed on the upstream side stage 712*u*. In this case, the electronic component inspecting apparatus 700 can check the position of the electronic component 711 using the image pickup camera 734. The electronic component inspecting apparatus 700 lowers the electronic component conveying apparatus 740 using the Z stage incorporated in the electronic component conveying apparatus 740. After gripping the electronic component 711 with the gripping section 741, the electronic component inspecting apparatus 700 directly moves the electronic component conveying apparatus 740 to above the image pickup device 713. The electronic component inspecting apparatus 700 checks the posture of the electronic component 711 using the image pickup device 713. The electronic component inspecting apparatus 700 adjusts the posture of the electronic component 711 using a fine adjustment mechanism incorporated in the electronic component conveying apparatus 740. After moving the electronic component conveying apparatus 740 to above the inspection table 714, the electronic component inspecting apparatus 700 moves the Z stage incorporated in the electronic component conveying apparatus 740 and sets the electronic component 711 on the inspection table 714. Since the posture of the electronic component 711 is adjusted using the fine adjustment mechanism in the electronic component conveying apparatus 740, it is possible to set the electronic component 711 in a correct position of the inspection table 714. After finishing the inspection of the electric characteristics of the electronic component 711 using the inspection table 714, the electronic component inspecting apparatus 700 lifts the electronic component 711 from the inspection table 714. The electronic component inspecting apparatus 700 moves the Y stage 731 and the X stage 733, moves the electronic component conveying apparatus 740 to above the downstream side stage 712d, and places the electronic component 711 on the downstream side stage 712d. Finally, the electronic component inspecting apparatus 700 moves the downstream side stage 712d and conveys the electronic component 711, for which the inspection ends, to a predetermined position.

Figure 27:
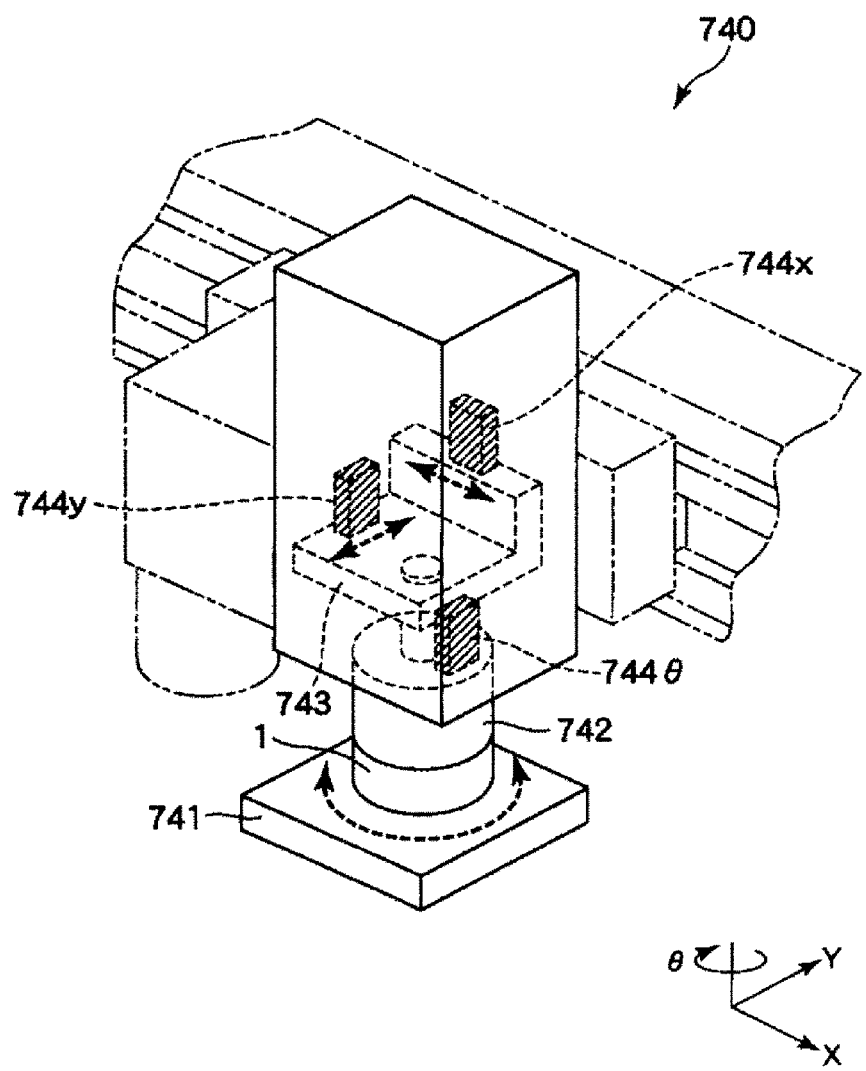
FIG. 27 is a diagram showing an example of the electronic component conveying apparatus according to the eighth embodiment including the force detecting device according to the first embodiment.

FIG. 27 is a diagram showing the electronic component conveying apparatus 740 including the force detecting device 1. The electronic component conveying apparatus 740 includes a griping section 741, the force detecting device 1 having six axes connected to the gripping section 741, a rotating shaft 742 connected to the gripping section 741 via the six-axis force detecting device 1, and a fine adjustment plate 743 turnably attached to the rotating shaft 742. The fine adjustment plate 743 is movable in the X direction and the Y direction while being guided by a guide mechanism (not shown in the figure).

A piezoelectric motor 744θ for a rotating direction is mounted to face an end face of the rotating shaft 742. A driving projection (not shown in the figure) of the piezoelectric motor 744θ is pressed against the end face of the rotating shaft 742. Therefore, by causing the piezoelectric motor 744θ to operate, it is possible to rotate the rotating shaft 742 (and the gripping section 741) in a θ direction by any angle. A piezoelectric motor 744x for the X direction and a piezoelectric motor 744y for the Y direction are provided to face the fine adjustment plate 743. Driving projections (not shown in the figure) of the piezoelectric motor 744x and the piezoelectric motor 744y are pressed against the surface of the fine adjustment plate 743. Therefore, by causing the piezoelectric motor 744x to operate, it is possible to move the fine adjustment plate 743 (and the gripping section 741) in the X direction by any distance. Similarly, by causing the piezoelectric motor 744y to operate, it is possible to move the fine adjustment plate 743 (and the gripping section 741) in the Y direction by any distance.

The force detecting device 1 has a function of detecting an external force applied to the gripping section 741. The electronic component conveying apparatus 740 and the electronic component inspecting apparatus 700 can more precisely execute work by feeding back the force detected by the force detecting device 1 to the control device 750. The electronic component conveying apparatus 740 and the electronic component inspecting apparatus 700 can detect, according to the force detected by the force detecting device 1, for example, contact of the gripping section 741 with an obstacle. Therefore, the electronic component conveying apparatus 740 and the electronic component inspecting apparatus 700 can easily perform an obstacle avoiding operation, a target object damage avoiding operation, and the like, which are difficult in the position control in the past. The electronic component conveying apparatus 740 and the electronic component inspecting apparatus 700 can execute safer work.

Ninth Embodiment

A component machining apparatus in a ninth embodiment of the invention is explained below with reference to FIG. 28. Differences of this embodiment from the first and second embodiments are mainly explained below. Explanation of similarities is omitted.

Figure 28:
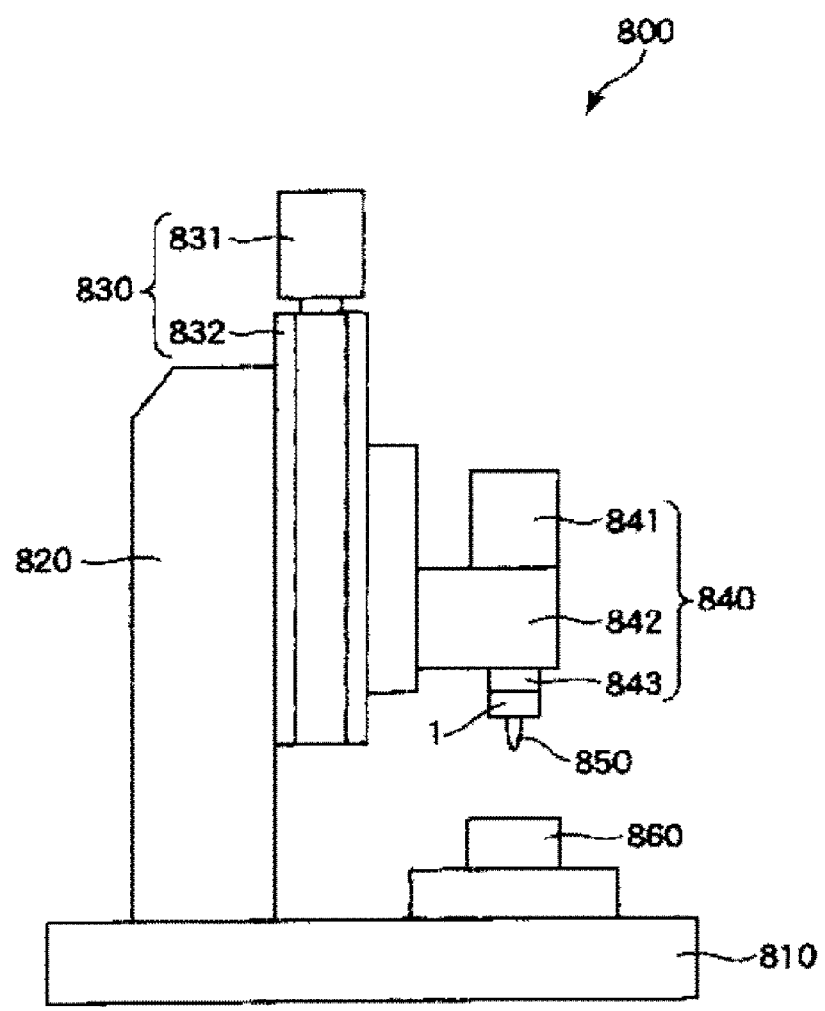
FIG. 28 is a diagram showing an example of a component machining apparatus according to a ninth embodiment including the force detecting device according to the first embodiment.

FIG. 28 is a diagram showing an example of a component machining apparatus according to the ninth embodiment including the force detecting device according to the first embodiment. A component machining apparatus 800 shown in FIG. 28 includes a base 810, a column 820 formed to stand on the upper surface of the base 810, a feeding mechanism 830 provided on a side surface of the column 820, a tool displacing section 840 vertically movably attached to the feeding mechanism 830, the force detecting device 1 connected to the tool displacing section 840, and a tool 850 attached to the tool displacing section 840 via the force detecting device 1. Note that, in the following explanation, the component machining apparatus 800 including the force detecting device 1 is explained. However, the force detecting device 1001 may be used. As the force detecting device 1 or the force detecting device 1001, a force detecting device same as the force detecting device according to any one of the embodiments explained above is used.

The base 810 is a table for placing and fixing a component to be machined 860. The column 820 is a pillar for fixing the feeding mechanism 830. The feeding mechanism 830 has a function of lifting and lowering the tool displacing section 840. The feeding mechanism 830 includes a feeding motor 831 and a guide 832 that lifts and lowers the tool displacing section 840 on the basis of an output from the feeding motor 831. The tool displacing section 840 has a function of applying displacement such as rotation or vibration to the tool 850. The tool displacing section 840 includes a displacing motor 841, a tool attaching section 843 provided at the distal end of a spindle (not shown in the figure) coupled to the displacing motor 841, and a holding section 842 that holds the spindle attached to the tool displacing section 840. The tool 850 is attached to the tool attaching section 843 of the tool displacing section 840 via the force detecting device 1. The tool 850 is used for machining the component to be machined 860 according to the displacement applied from the tool displacing section 840. The tool 850 is not particularly limited. However, the tool 850 is, for example, a wrench, a Phillips head screwdriver, a flathead screwdriver, a cutter, a circular saw, a nipper, an auger, a drill, or a milling cutter.

The force detecting device 1 has a function of detecting an external force applied to the tool 850. The component machining apparatus 800 can more precisely execute component machining work by feeding back the external force detected by the force detecting device 1 to the feeding motor 831 and the displacing motor 841. The component machining apparatus 800 can detect, according to the external force detected by the force detecting device 1, for example, contact of the tool 850 with an obstacle. Therefore, the component machining apparatus 800 can urgently stop when an obstacle or the like comes into contact with the tool 850. The component machining apparatus 800 can execute safer component machining work.

Tenth Embodiment

A mobile body according to a tenth embodiment of the invention is explained with reference to FIG. 29. Differences of this embodiment from the first and second embodiments are mainly explained below. Explanation of similarities is omitted.

Figure 29:
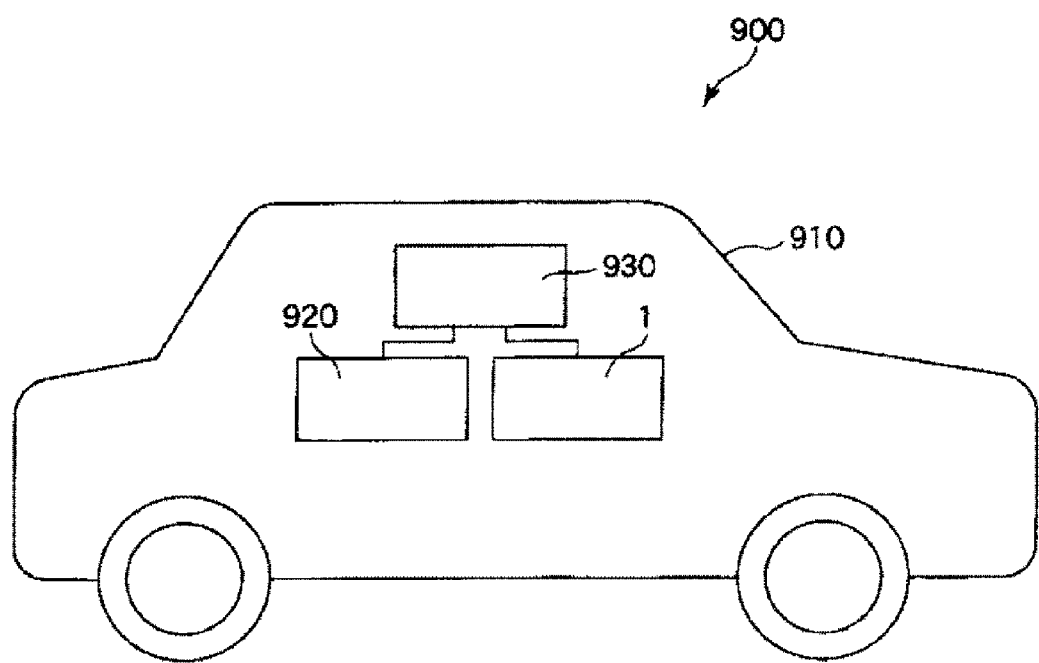
FIG. 29 is a diagram showing an example of a mobile body according to a tenth embodiment including the force detecting device according to the first embodiment.

FIG. 29 is a diagram showing an example of a mobile body according to the tenth embodiment including the force detecting device according to the first embodiment. A mobile body 900 shown in FIG. 29 can move with given power. The mobile body 900 is not particularly limited. However, the mobile body 900 is, for example, a vehicle such as an automobile, a motorcycle, an airplane, a ship, or a train or a robot such as a bipedal walking robot or a wheel moving robot.

The mobile body 900 includes a main body 910 (e.g., a housing of a vehicle or a main body of a robot), a power unit 920 that supplies power for moving the main body 910, the force detecting device 1 according to the first embodiment that detects an external force generated by the movement of the main body 910, and a control unit 930. Note that, in the following explanation, the mobile body 900 including the force detecting device 1 is explained. However, the force detecting device 1001 may be used. As the force detecting device 1 or the force detecting device 1001, a force detecting device same as the force detecting device according to any one of the embodiments explained above is used.

When the main body 910 moves with power supplied from the power unit 920, vibration, acceleration, and the like occur according to the movement. The force detecting device 1 detects an external force due to the vibration, the acceleration, and the like that occurs according to the movement. The external force detected by the force detecting device 1 is transmitted to the control unit 930. The control unit 930 can execute control such as posture control, vibration control, and acceleration control by controlling the power unit 920 and the like according to the external force transmitted from the force detecting device 1.

In the force detecting device 1 according to the embodiments, although the force detecting device 1 is as light as 330 g, 0.005 is realized as a minimum detection load (dynamic resolution). When the force detecting device 1 is set in a wrist of a robot or the like, the force detecting device 1 is required to be light in weight. However, usually, when the weight of a device is reduced, the influence of distortion of members increases and a minimum detection load cannot be reduced. In the force detecting device 1 according to the embodiment, $15.1 \times 10^{-6}$ is realized as a minimum detection load per device weight calculated by dividing a minimum detection load (N) by a device load (g).

The embodiments of the invention are explained above. However, the invention is not limited to the embodiments. The units in the embodiments can be replaced with units including any components that can display the same functions. Any other components may be added to the invention.

Any two or more components (characteristics) in the embodiments may be combined.

In the invention, the package, that is, the base sections and the lid may be omitted.

In the invention, instead of the pressurizing bolt, for example, a bolt not having the function of applying pressurization to the element may be used. A fixing method other than the bolt may be adopted.

The robots are not limited to an arm type robot (a robot arm) as long as the robots include an arm. The robots may be robots of other types such as a scalar robot and a leg-type walking (mobile) robot.

The force detecting devices are not limitedly applied to the robots, the electronic component conveying apparatus, the electronic component inspecting apparatus, the component machining apparatus, and the mobile body and can be applied to other apparatuses such as other conveying apparatuses, other inspecting apparatuses, measurement apparatuses such as a vibrometer, an accelerometer, a gravimeter, a dynamometer, a seismometer, and a climometer, and an input apparatus.

The number of the set sensor devices in the force detecting device is two in the first embodiment and four in the second embodiment. However, the number of the set sensor devices is not limited to this and may be, for example, three or five or more.

The entire disclosure of Japanese Patent Application Nos. 2013-229791, filed Nov. 5, 2013 and 2013-229792, filed Nov. 5, 2013 are expressly incorporated by reference herein.

What is claimed is:

1. A force detecting device comprising:
   a first base section;
   a second base section; and
   a plurality of piezoelectric elements sandwiched by the first base section and the second base section and configured to detect external forces applied to the first base section and the second base section, wherein
   the first base section includes a first attachment surface fixed to a first portion of a measurement target and the second base section includes a second attachment surface fixed to a second portion of the measurement target,
   at least one of the plurality of piezoelectric elements includes a first board formed by a Y-cut quartz plate and a second board formed by a Y-cut quartz plate, the first board and the second board are laminated in parallel, and, in a laminating direction of the first board and the second board, an x axis of the first board and an x axis of the second board cross each other and a z axis of the first board and a z axis of the second board cross each other,
   each of the plurality of piezoelectric elements is set such that the laminating direction is a direction different from a normal of the first attachment surface or the second attachment surface, and
   the plurality of piezoelectric elements include the piezoelectric elements not arranged on the same plane and not arranged in parallel to each other.

2. The force detecting device according to claim 1, wherein the piezoelectric element detects external forces in three directions in total including orthogonal two directions in planes of the first board and the second board and one direction orthogonal to the two directions.

3. The force detecting device according to claim 1, wherein
   at least one base section of the first base section and the second base section is formed by a member formed in a tabular shape,
   at least one of the plurality of piezoelectric elements includes a first sensor detecting a shearing force applied in a first direction, a second sensor detecting a compressive or a tensile force applied in a second direction orthogonal to the first direction, and a third sensor detecting a shearing force applied in a third direction orthogonal to the first direction and the second direction, and when orthogonal two directions in a plane of the member are represented as A axis and B axis, a direction orthogonal to the A axis and the B axis is represented as C axis, a force FA in the A-axis direction, a force FB in the B-axis direction, and a force FC in the C-axis direction may be determined using only the first sensor and the third sensor.

4. The force detecting device according to claim 1, wherein
the force detecting device includes a plurality of pressurizing screws provided around the piezoelectric element and configured to apply pressurization to the piezoelectric element, and
a pressurization direction of each of the plurality of pressurizing screws is a direction parallel to the laminating direction of the first board and the second board.

5. The force detecting device according to claim 1, wherein
at least one base section of the first base section and the second base section is formed in a tabular shape, and
in each of the plurality of piezoelectric elements, the first board and the second board are arranged perpendicularly to the one base section.

6. The force detecting device according to claim 1, wherein
at least one base section of the first base section and the second base section is formed in a tabular shape, and
a quartet or more of the piezoelectric elements are respectively arranged in positions apart from a center section of the one base section when viewed from the attachment surface on which the one base section is fixed to the measurement target.

7. The force detecting device according to claim 1, wherein the piezoelectric element includes a third board formed by an X-cut quartz plate.

8. A robot comprising:
an arm;
an end effector provided in the arm; and
the force detecting device of claim 1 provided between the arm and the end effector and configured to detect an external force applied to the end effector.

9. The force detecting device according to claim 8, wherein
the first portion of the measurement target is the arm, and
the second portion of the measurement target is the end effector.

10. An electronic component conveying apparatus comprising:
a gripping section configured to grip an electronic component; and
the force detecting device of claim 1 configured to detect an external force applied to the gripping section.

11. The force detecting device according to claim 1, wherein
the laminating direction is orthogonal to the normal of the first attachment surface or the second attachment surface.

12. A force detecting device comprising:
a first base section;
a second base section; and
a plurality of piezoelectric elements sandwiched by the first base section and the second base section and configured to detect external forces applied to the first base section and the second base section, wherein the first base section includes a first attachment surface fixed to a first portion of a measurement target and the second base section includes a second attachment surface fixed to a second portion of the measurement target,
at least one of the plurality of piezoelectric elements includes a first board and a second board having a laminating direction different from a normal direction of the first attachment surface or the second attachment surface and detects the external forces applied to the first base section and the second base section from detection of a shearing force in a first detection direction same as the normal direction by the first board and detection of a shearing force in a second detection direction crossing the first detection direction by the second board, and
the plurality of piezoelectric elements include the piezoelectric elements not arranged on the same plate and not arranged in parallel to each other.

13. The force detecting device according to claim 12, wherein
the first board and the second board are Y-cut quartz plates, and
an x axis of a quartz crystal of the first board and an x axis of a quartz crystal of the second board are orthogonal to each other.

14. The force detecting device according to claim 13, wherein
the force detecting device includes a plurality of pressurizing screws provided around the piezoelectric element and configured to apply pressurization to the piezoelectric element, and
a pressurization direction of each of the plurality of pressurizing screws is a direction parallel to the laminating direction of the first board and the second board.

15. The force detecting device according to claim 12, wherein
an A axis, a B axis, and a C axis, which are orthogonal coordinate axes, are set as coordinate axes in which the C axis is in a direction parallel to an intersection line of a first plane orthogonal to a first sandwiching direction and a second plane orthogonal to a second sandwiching direction, and
the external forces applied to the first base section and the second base section are detected as components of external forces in the three axis directions.

16. A robot comprising:
an arm;
an end effector provided in the arm; and
the force detecting device of claim 12 provided between the arm and the end effector and configured to detect an external force applied to the end effector.

17. The force detecting device according to claim 16, wherein
the first portion of the measurement target is the arm, and
the second portion of the measurement target is the end effector.

18. The force detecting device according to claim 12, wherein
the laminating direction is orthogonal to the normal of the first attachment surface or the second attachment surface.

19. A force detecting device comprising:
a first base section;
a second base section; and
a plurality of piezoelectric elements sandwiched by the first base section and the second base section and configured to detect external forces applied to the first base section and the second base section, wherein the first base section includes a first attachment surface fixed to a first portion of a measurement target and the second base section includes a second attachment surface fixed to a second portion of the measurement target, each of the plurality of piezoelectric elements is set such that a laminating direction of a first board and a second board of the piezoelectric element is a direction different from a normal of the first attachment surface or the second attachment surface, and the plurality of piezoelectric elements include the piezoelectric elements not arranged on the same plane and not arranged in parallel to each other.

20. The force detecting device according to claim 19, wherein the conversion circuit or the arithmetic circuit includes at least any one of a semiconductor switch and an MEMS switch.

21. The force detecting device according to claim 19, wherein the first base section and the second base section form a housing space having a circular or corner-rounded square sectional shape, and distances between the respective piezoelectric elements and the center of the first attachment surface or the second attachment surface corresponding to the piezoelectric elements are equal.

22. A robot comprising:

an arm;

an end effector provided in the arm; and the force detecting device of claim 19 provided between the arm and the end effector and configured to detect an external force applied to the end effector.

23. The force detecting device according to claim 22, wherein the first portion of the measurement target is the arm, and the second portion of the measurement target is the end effector.

24. The force detecting device according to claim 19, wherein the laminating direction is orthogonal to the normal of the first attachment surface or the second attachment surface.

25. A force detecting device comprising:

a first base section;

a second base section; and a plurality of piezoelectric elements sandwiched by the first base section and the second base section and configured to detect external forces applied to the first base section and the second base section, wherein the first base section includes a first attachment surface fixed to a first portion of a measurement target and the second base section includes a second attachment surface fixed to a second portion of the measurement target, each of the plurality of piezoelectric elements is set such that a laminating direction of a first board and a second board of the piezoelectric element is a direction different from a normal of the first attachment surface or the second attachment surface, a conversion circuit configured to convert charges output by the plurality of piezoelectric elements into a voltage and an arithmetic circuit configured to calculate an external force from the voltage are housed in a space between the first base section and the second base section, and the plurality of piezoelectric elements include the piezoelectric elements not arranged on the same plane and not arranged in parallel to each other.

26. The force detecting device according to claim 25, wherein the conversion circuit or the arithmetic circuit includes at least any one of a semiconductor switch and an MEMS switch.

27. A robot comprising:

an arm;

an end effector provided in the arm; and the force detecting device of claim 25 provided between the arm and the end effector and configured to detect an external force applied to the end effector.

28. The force detecting device according to claim 27, wherein the first portion of the measurement target is the arm, and the second portion of the measurement target is the end effector.

29. The force detecting device according to claim 25, wherein the laminating direction is orthogonal to the normal of the first attachment surface or the second attachment surface.

* * * * *